US011916335B2

(12) United States Patent
Ito

(10) Patent No.: US 11,916,335 B2
(45) Date of Patent: Feb. 27, 2024

(54) PLUG HOUSING AND PLUG CONNECTOR

(71) Applicant: Panasonic Intellectual Property Management Co., Ltd., Osaka (JP)

(72) Inventor: Chikara Ito, Mie (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 18 days.

(21) Appl. No.: 17/615,293

(22) PCT Filed: May 21, 2020

(86) PCT No.: PCT/JP2020/020173
§ 371 (c)(1),
(2) Date: Nov. 30, 2021

(87) PCT Pub. No.: WO2020/241456
PCT Pub. Date: Dec. 3, 2020

(65) Prior Publication Data
US 2022/0200207 A1   Jun. 23, 2022

(30) Foreign Application Priority Data
May 30, 2019  (JP) ................. 2019-101374

(51) Int. Cl.
*H01R 13/633* (2006.01)
*H01R 12/79* (2011.01)
(Continued)

(52) U.S. Cl.
CPC ........... *H01R 13/633* (2013.01); *H01R 12/79* (2013.01); *H01R 13/6275* (2013.01); *H01R 13/641* (2013.01)

(58) Field of Classification Search
CPC .............. H01R 13/6335; H01R 13/633; H01R 13/6275; H01R 13/641; H01R 12/79
(Continued)

(56) References Cited

U.S. PATENT DOCUMENTS 5,681,185 A    10/1997  Briski et al.
10,193,255 B2 *  1/2019  Ito ..................... H01R 12/78
(Continued)

FOREIGN PATENT DOCUMENTS

EP        2958194 A1    12/2015
JP    H11-339887 A     12/1999
(Continued)

OTHER PUBLICATIONS

International Search Report and Written Opinion issued in International Patent Application No. PCT/JP2020/020173, dated Aug. 4, 2020; with partial English translation.
(Continued)

*Primary Examiner* — Gary F Paumen
(74) *Attorney, Agent, or Firm* — Rimon, P.C.

(57) ABSTRACT

A housing main body of a plug housing includes an inserted part inserted in a receptacle housing and an exposed part exposed outside the receptacle housing, in a state where the plug housing is fitted to the receptacle housing. The exposed part includes a hook part formed at an end of the exposed part in an intersecting axis intersecting with an insertion direction of inserting the inserted part in the receptacle housing, the hook part being configured to hook a finger thereon, and a contact part contactable with another plug housing between the hook part and the inserted part when the other plug housing is disposed adjacent to the plug housing in the intersecting axis.

7 Claims, 29 Drawing Sheets

(51) Int. Cl.
*H01R 13/627* (2006.01)
*H01R 13/641* (2006.01)

(58) Field of Classification Search
USPC .............................................. 439/476.1, 483
See application file for complete search history.

(56) References Cited

U.S. PATENT DOCUMENTS

| | | | | |
|---|---|---|---|---|
| 2008/0311781 | A1* | 12/2008 | Wojcik | H01R 13/506 439/352 |
| 2009/0178265 | A1* | 7/2009 | Wojcik | H01R 13/514 29/764 |
| 2012/0190230 | A1* | 7/2012 | Wojcik | H01R 13/518 439/352 |
| 2013/0252453 | A1* | 9/2013 | Wojcik | H01R 43/26 439/352 |
| 2014/0094055 | A1* | 4/2014 | Wojcik | H01R 24/64 29/825 |
| 2016/0126668 | A1* | 5/2016 | Wojcik | H01R 13/62933 439/304 |
| 2017/0237197 | A1* | 8/2017 | Wojcik | H01R 43/26 439/638 |
| 2017/0324179 | A1 | 11/2017 | Ito et al. | |
| 2018/0166821 | A1* | 6/2018 | Wojcik | H01R 43/26 |

FOREIGN PATENT DOCUMENTS

| | | |
|---|---|---|
| JP | 2010-530121 A | 9/2010 |
| JP | 2011-142111 A | 7/2011 |
| JP | 2016-110994 A | 6/2016 |

OTHER PUBLICATIONS

Extended European Search Report dated Jun. 27, 2022 issued in the corresponding European Patent Application No. 20813015.3.

* cited by examiner

FIG. 3
(a)
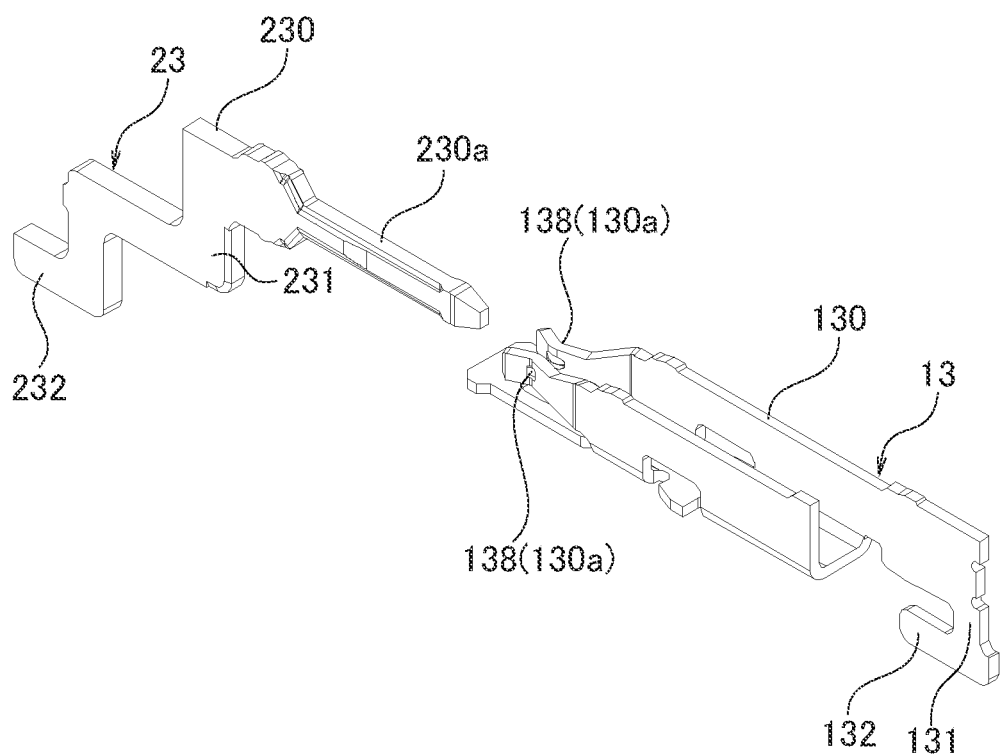
(b)
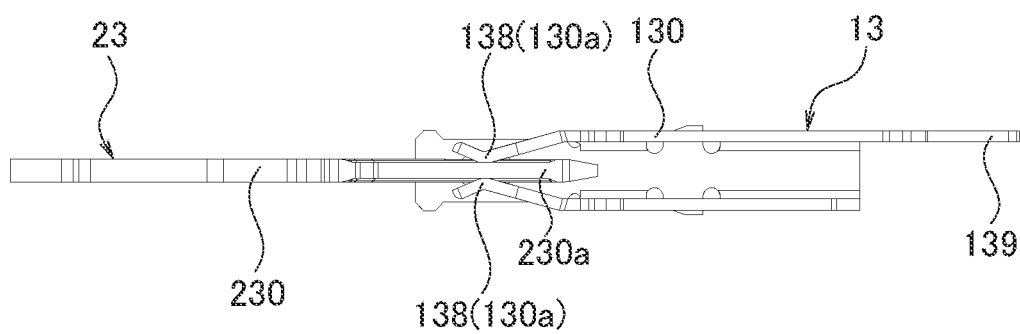

FIG. 4
(a)
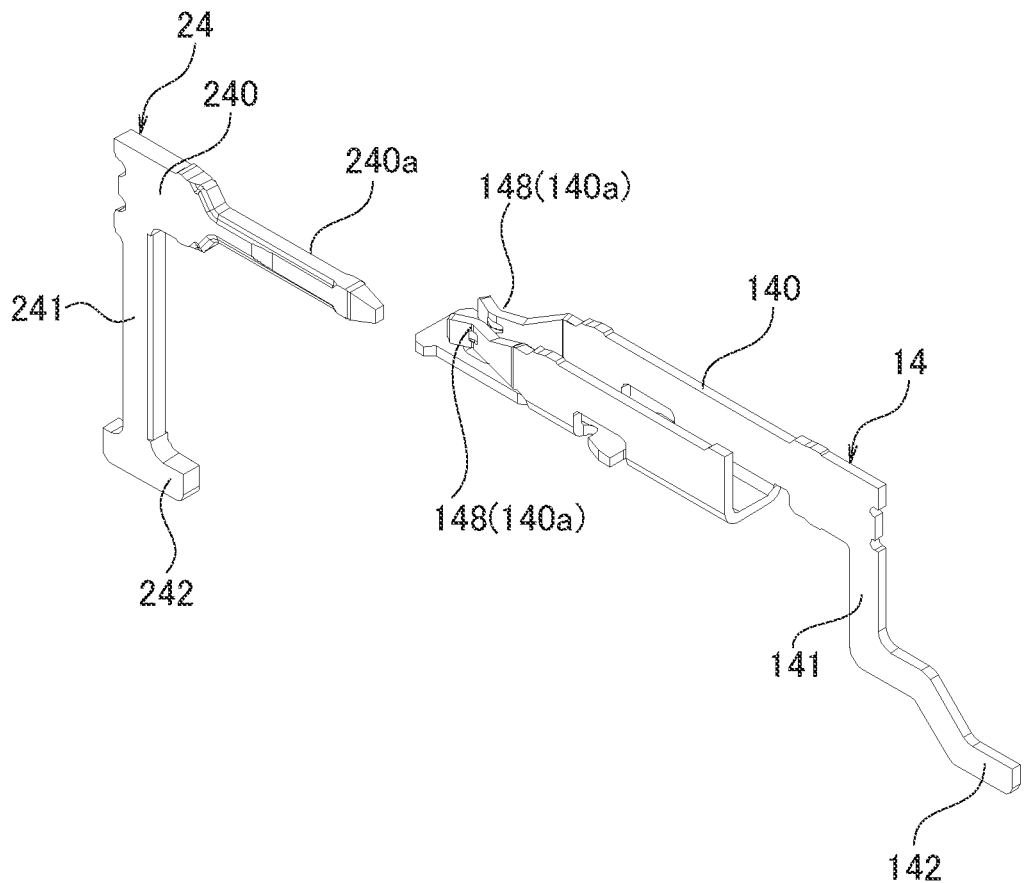
(b)
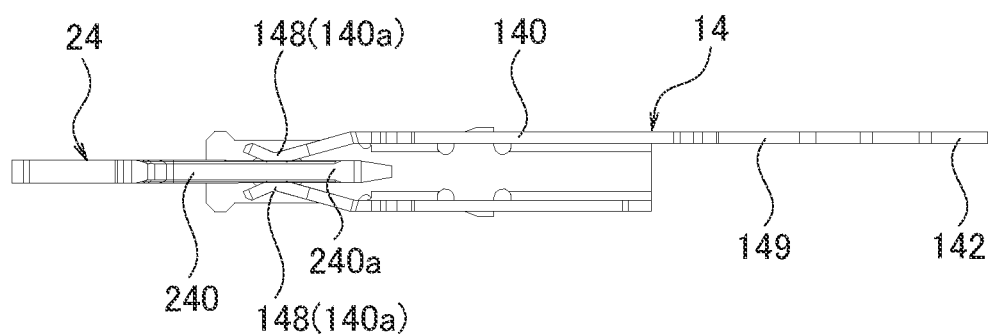

FIG. 11
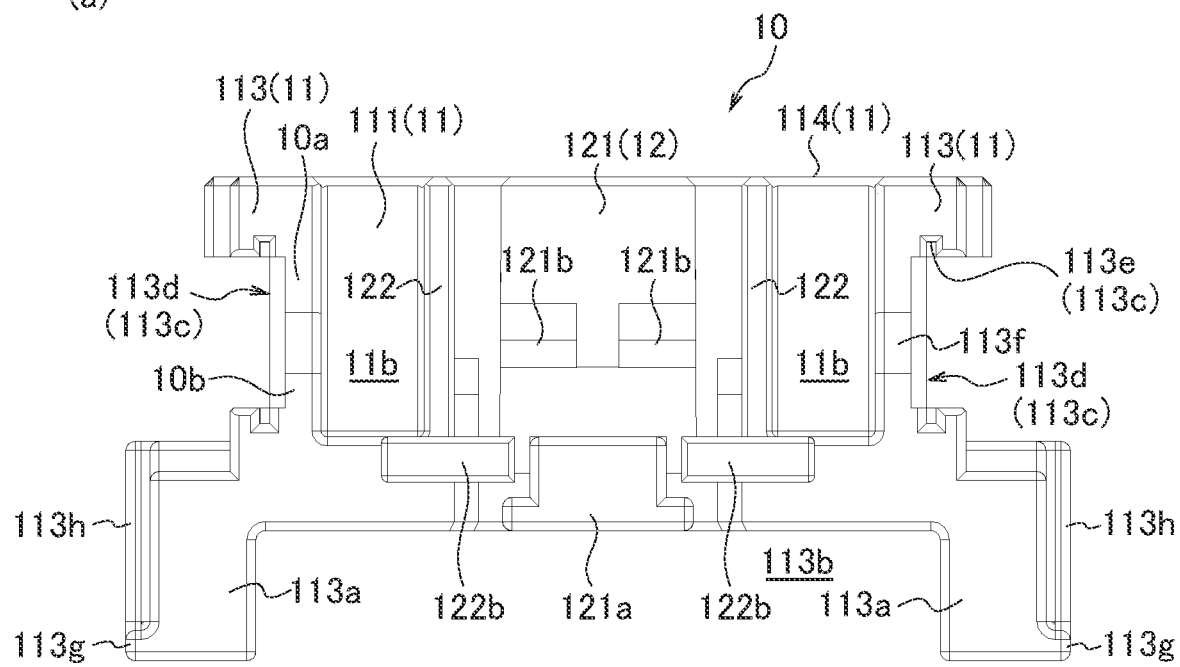
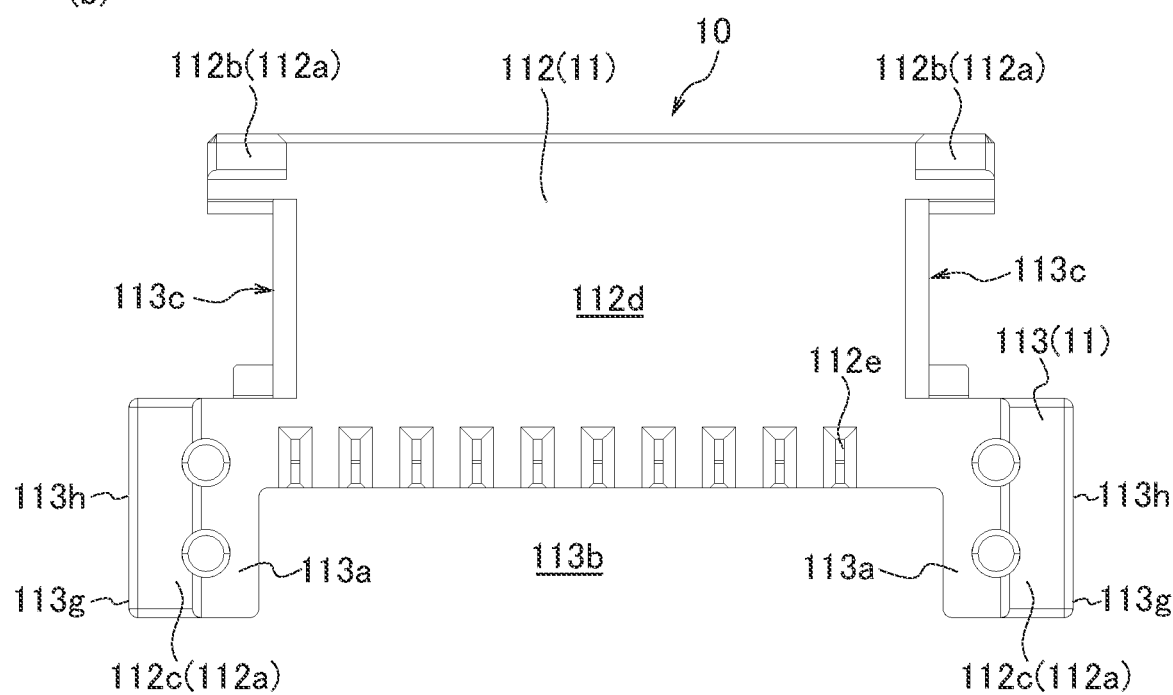

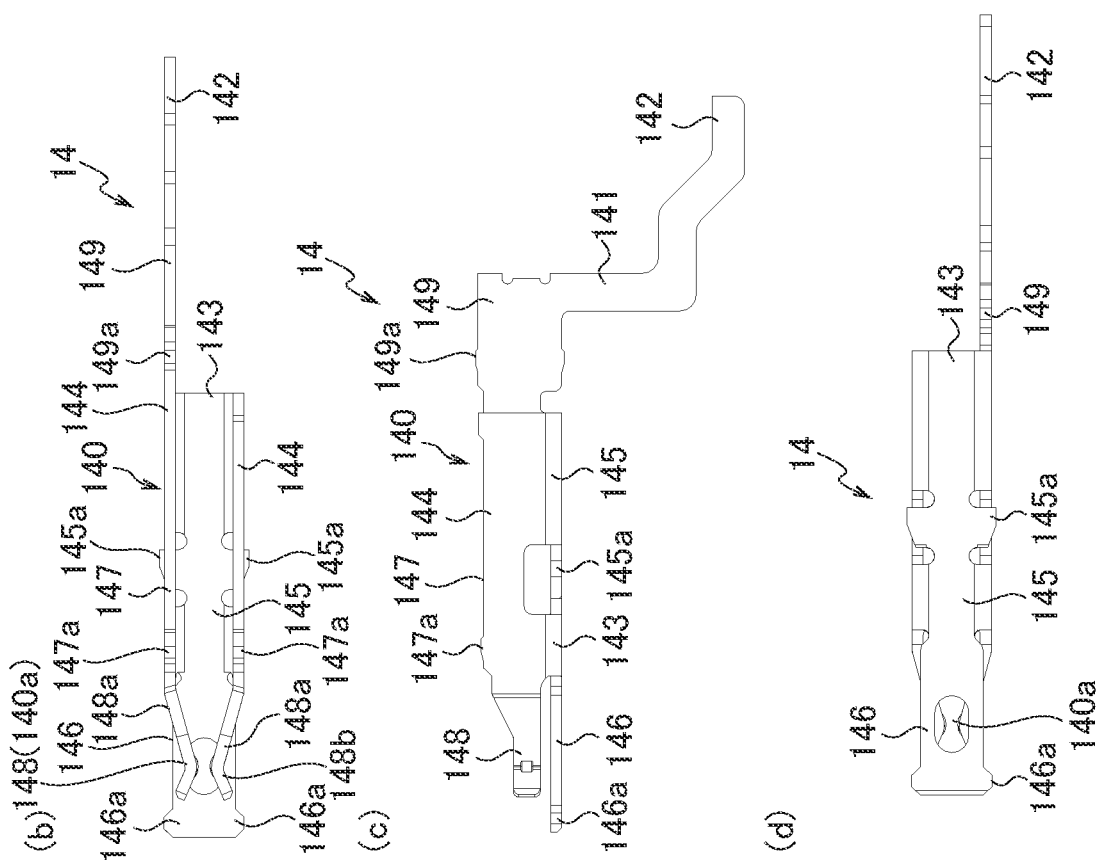
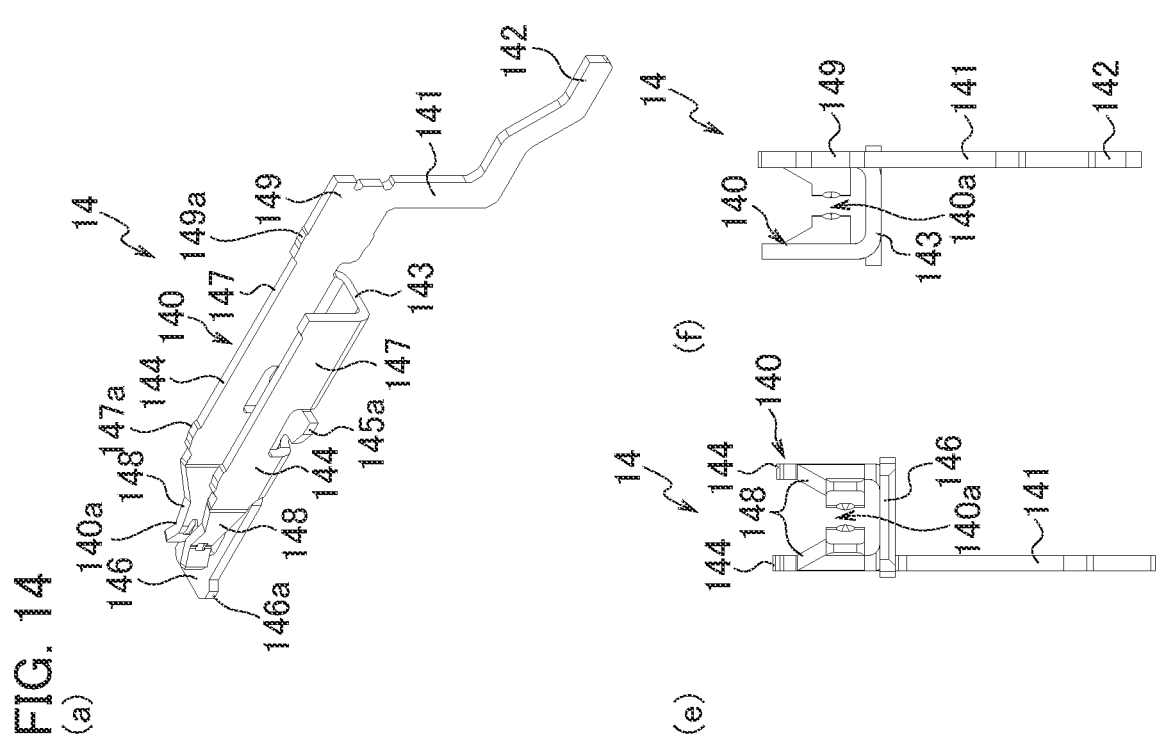
FIG. 14

FIG. 17
(a)
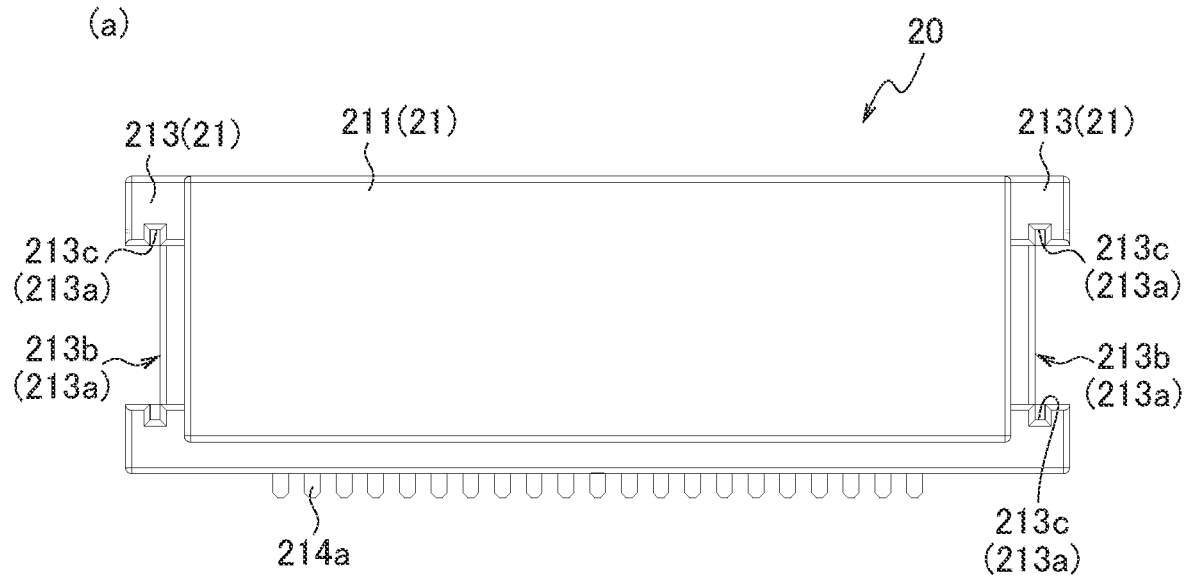
(b)
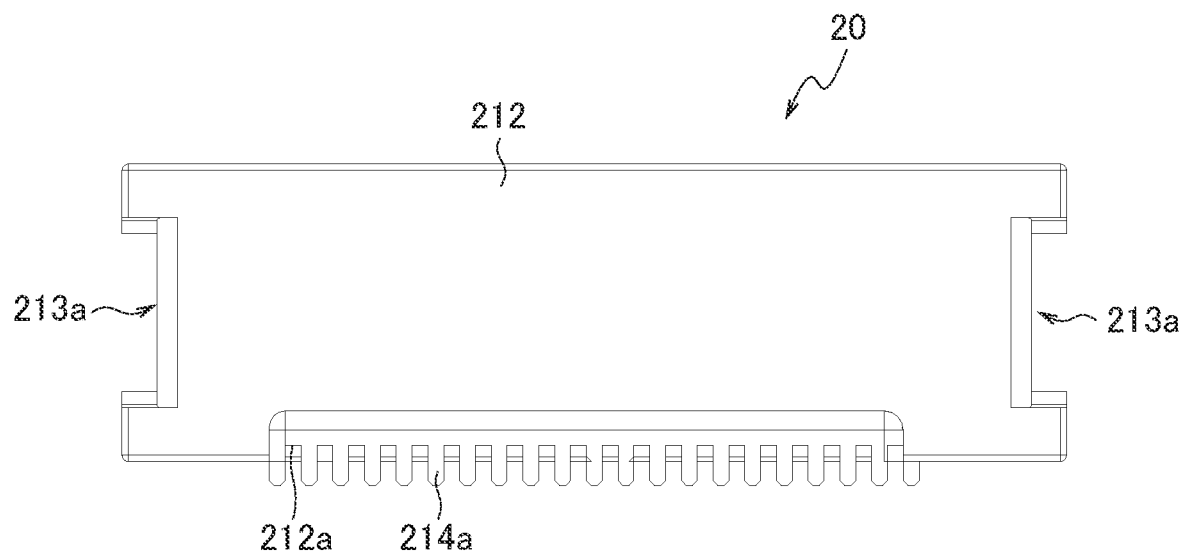

FIG. 18
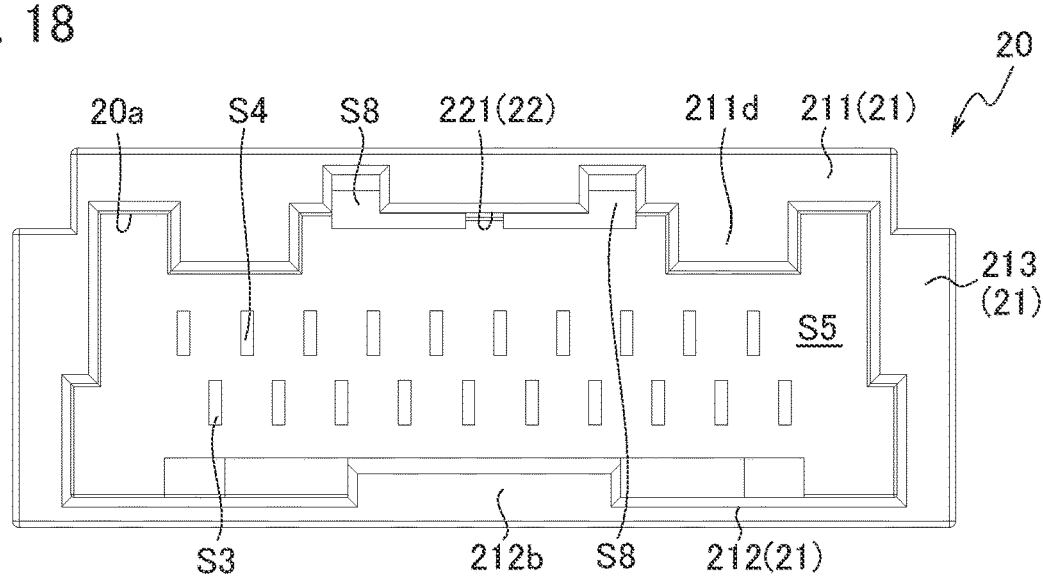
(a)
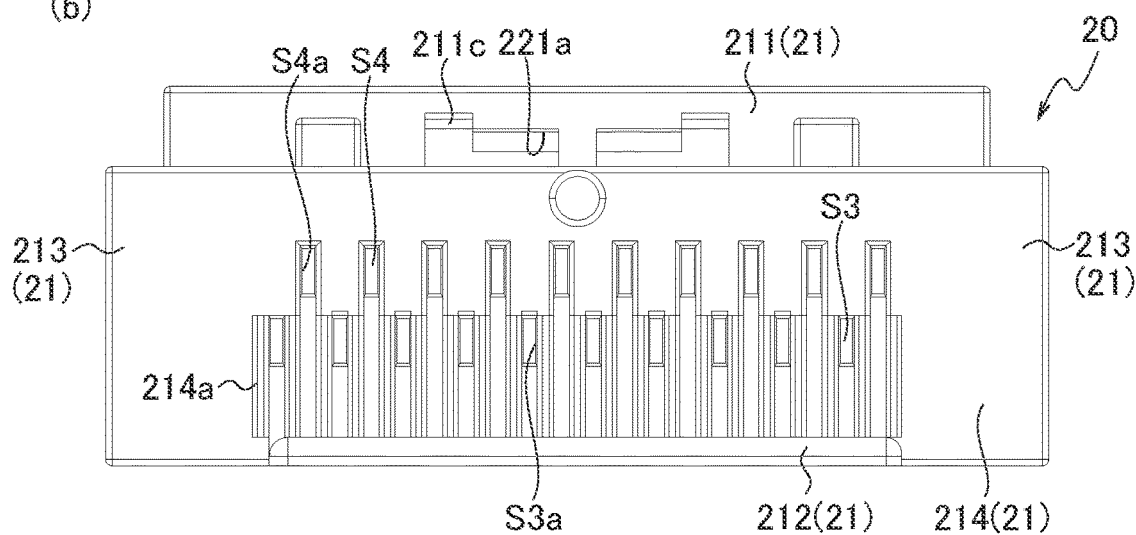
(b)
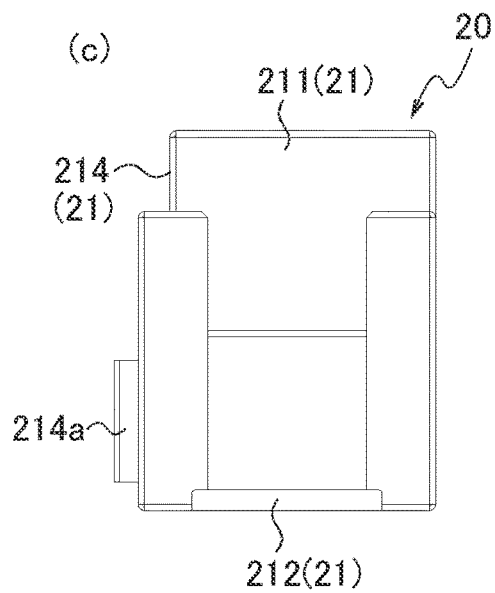
(c)
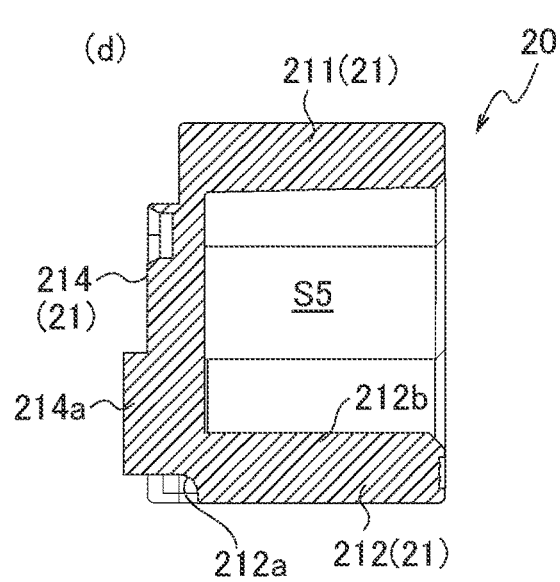
(d)

FIG. 19
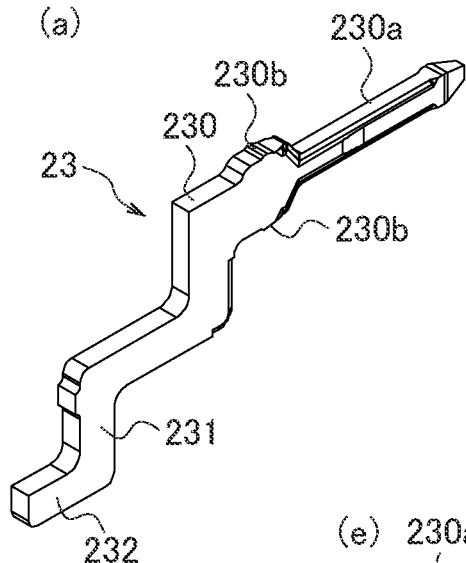
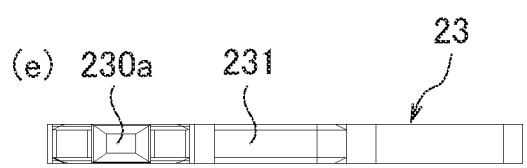
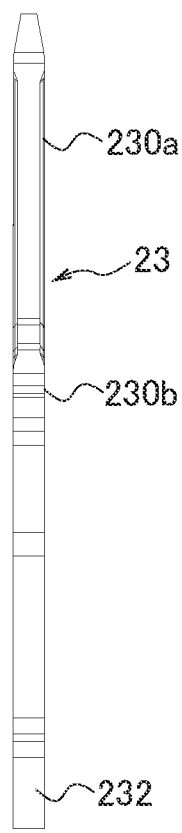
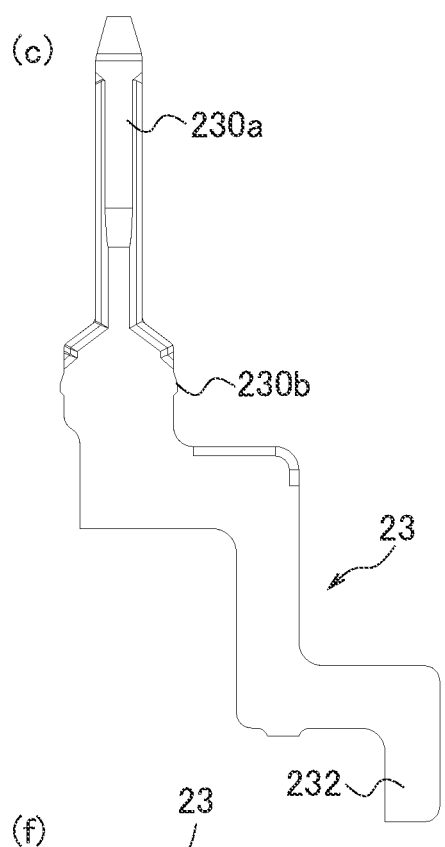
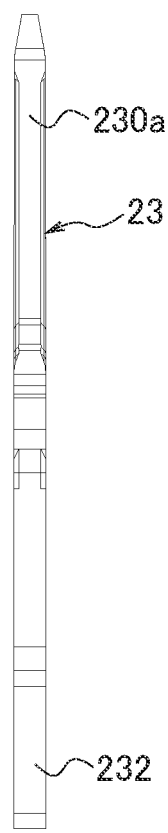
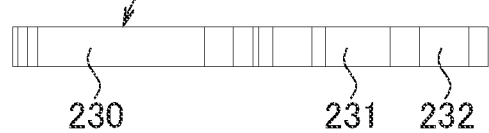

FIG. 20
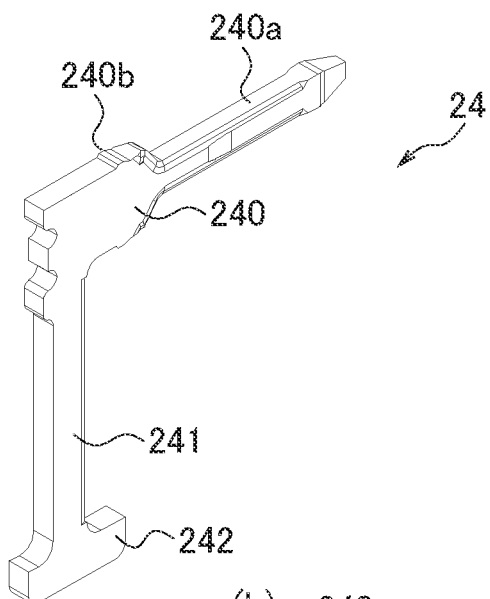
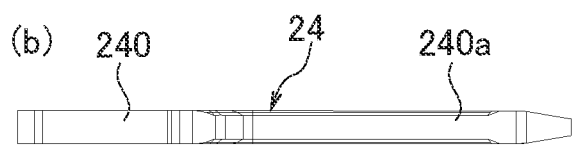
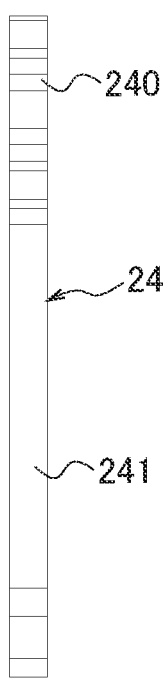 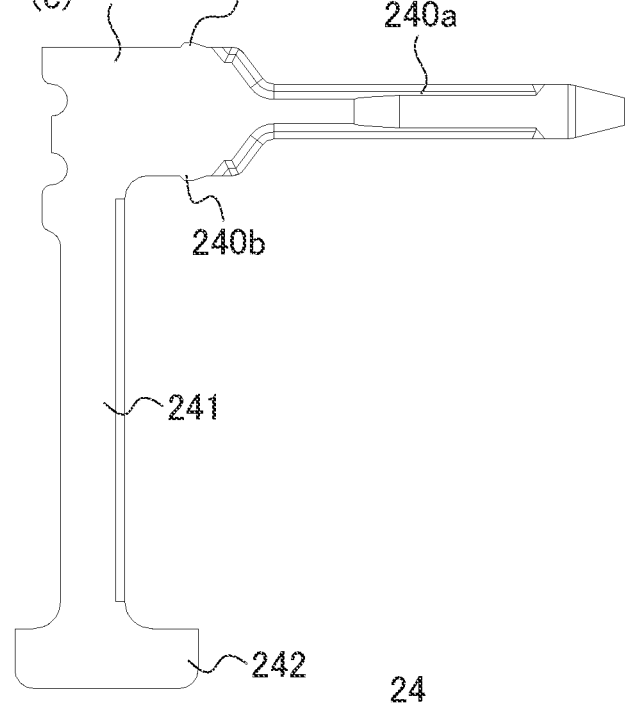 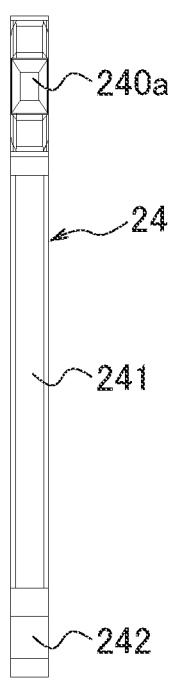
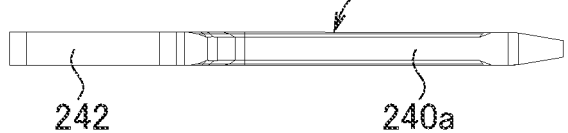

PLUG HOUSING AND PLUG CONNECTOR

CROSS-REFERENCE OF RELATED APPLICATIONS

This application is the U.S. National Phase under 35 U.S.C. § 371 of International Patent Application No. PCT/JP2020/020173, filed on May 21, 2020, which in turn claims the benefit of Japanese Application No. 2019-101374, filed on May 30, 2019, the entire disclosures of which applications are incorporated by reference herein.

TECHNICAL FIELD

The present disclosure relates to a plug housing and a plug connector.

BACKGROUND ART

There has heretofore been known a plug connector including a plug housing to be fitted to a receptacle connector (see Patent Literature 1).

In Patent Literature 1, a part of the plug housing is exposed outside of the receptacle connector in a state where the plug housing is fitted to the receptacle connector. Then, in order to detach the plug housing from the receptacle connector, gripping the exposed part of the plug housing and pull out the plug housing from the receptacle connector.

CITATION LIST

Patent Literature

Patent Literature 1: Japanese Unexamined Patent Application Publication No. 2016-110994

SUMMARY OF INVENTION

Technical Problem

However, in the plug housing disclosed in Patent Literature 1, both ends in the width axis of the part exposed from the receptacle connector are flat exposed surfaces. Thus, when the plug housing is pulled out from the receptacle connector, a hand may slip. Moreover, when the plug housing is miniaturized, the exposed surfaces of the plug housing become small, so that the exposed part of the plug housing is not gripped well by hand, and the plug housing may not be easily pulled out from the receptacle connector.

It is thus preferable to enable the plug housing to be easily pulled out from the receptacle connector.

As a structure capable of easily pulling out the plug housing from the receptacle connector, it is considered to form a hook part for hooking fingers on the exposed surfaces of the plug housing.

By the way, the plug connector is manufactured by inserting (press-fitting) multiple plug terminals in a plug housing. When manufacturing such a plug connector, for example, it is common to supply plug housings arranged in a certain posture by using a parts feeder to an automatic assembly device connected to the parts feeder.

Note that the parts feeder is an "automatic parts supply device", which automatically aligns parts (workpieces) in a certain posture by applying vibration to a bowl containing the workpieces such as plug housings and supplies them to the next process such as an assembly machine, a packaging machine, or an inspection machine.

However, when multiple plug housings each having the hook part for hooking fingers on the exposed surfaces are arranged in the width axis in a certain posture, plug housings adjacent to each other come in contact with each other at the hook parts, which are formed at positions separated from the center of gravity of the plug housings. As described above, when multiple plug housings each having the hook part for hooking fingers on the exposed surfaces are arranged in the width axis in a certain posture, the plug housings adjacent to each other come in contact with each other in a relatively unstable state.

Thus, when plug housings each having the hook part for hooking fingers on the exposed surfaces are used, the plug housings may tilt from the certain posture when aligned to be in the certain posture by the parts feeder. Then, when the plug housings tilt from the certain posture, the plug housings may be supplied to the automatic assembly device in a tilt state.

In the above-described related art, it is thus not possible to prevent a plug housing from changing in posture when the plug housing is conveyed by the parts feeder while improving the performance of pulling-out the plug housing from the receptacle connector.

Accordingly, it is an object of the present disclosure to provide a plug housing and a plug connector capable of preventing a change in posture during conveyance by a parts feeder while improving performance of pulling-out from the receptacle connector.

Solution to Problem

A plug housing according to the present disclosure is fittable to a receptacle housing and includes a housing main body. The housing main body includes: an inserted part; and an exposed part, the inserted part being inserted in the receptacle housing and the exposed part being exposed outside the receptacle housing, in a state where the plug housing is fitted to the receptacle housing. The exposed part includes a hook part formed at an end of the exposed part in an intersecting axis intersecting with an insertion direction of inserting the inserted part in the receptacle housing, the hook part being configured to hook a finger thereon; and a contact part contactable with another plug housing between the hook part and the inserted part when the other plug housing is disposed adjacent to the plug housing in the intersecting axis.

In addition, a plug connector according to the present disclosure includes: the plug housing, and a plug terminal held in the plug housing.

Advantageous Effects

According to the present disclosure, it is possible to obtain a plug housing and a plug connector capable of preventing a change in posture during conveyance by a parts feeder, while improving performance of pulling-out from the receptacle connector.

BRIEF DESCRIPTION OF DRAWINGS

FIG. 3 is a diagram showing a contact state of a lower plug terminal and a lower receptacle terminal included in the connector set shown as an example, FIG. 3(a) is a perspective view showing a state where the lower plug terminal and the lower receptacle terminal are not in contact with each other and FIG. 3(b) is a plan view showing a state where the lower plug terminal and the lower receptacle terminal are in contact with each other.

FIG. 4 is a diagram showing a contact state of an upper plug terminal and an upper receptacle terminal included in the connector set shown as an example, FIG. 4(a) is a perspective view showing a state where the upper plug terminal and the upper receptacle terminal are not in contact with each other and FIG. 4(b) is a plan view showing a state where the upper plug terminal and the upper receptacle terminal are in contact with each other.

FIG. 9(a) is a perspective view showing a state viewed from the reverse side before the plug connector is mounted and FIG. 9(b) is a perspective view showing a state viewed from the reverse side after the plug connector is mounted.

FIG. 11 is a diagram showing the plug housing included in the plug connector shown as an example, FIG. 11(a) is a plan view and FIG. 11(b) is a reverse side view.

FIG. 12(a) is a front view, FIG. 12(b) is a back view, FIG. 12(c) is a side view, and FIG. 12(d) is a sectional side view.

FIG. 13(a) is a perspective view, FIG. 13(b) is a plan view, FIG. 13(c) is a side view, FIG. 13(d) is a reverse side view, FIG. 13(e) is a front view, and FIG. 13(f) is a back view.

FIG. 14 is a diagram showing the upper plug terminal included in the plug connector shown as an example, FIG. 14(a) is a perspective view, FIG. 14(b) is a plan view, FIG. 14(c) is a side view, FIG. 14(d) is a reverse side view, FIG. 14(e) is a front view, and FIG. 14(f) is a back view.

FIG. 17 is a diagram showing a receptacle housing included in the receptacle connector shown as an example, FIG. 17(a) is a plan view and FIG. 17(b) is a reverse side view.

FIG. 18 is a diagram showing the receptacle housing included in the receptacle connector shown as an example, FIG. 18(a) is a front view, FIG. 18(b) is a back view, FIG. 18(c) is a side view, and FIG. 18(d) is a sectional side view.

FIG. 19 is a diagram showing a lower receptacle terminal included in the receptacle connector shown as an example, FIG. 19(a) is a perspective view, FIG. 19(b) is a plan view, FIG. 19(c) is a side view, FIG. 19(d) is a reverse side view, FIG. 19(e) is a front view, and FIG. 19(f) is a back view.

FIG. 20 is a diagram showing an upper receptacle terminal included in the receptacle connector shown as an example, FIG. 20(a) is a perspective view, FIG. 20(b) is a plan view, FIG. 20(c) is a side view, FIG. 20(d) is a reverse side view, FIG. 20(e) is a front view, and FIG. 20(f) is a back view.

FIG. 21(a) is a perspective view, FIG. 21(b) is a plan view, FIG. 21(c) is a side view, FIG. 21(d) is a reverse side view, FIG. 21(e) is a front view, and FIG. 21(f) is a back view.

DESCRIPTION OF EMBODIMENTS

With reference to the drawings, an embodiment of the present disclosure is described in detail below. The following description is given of a plug connector 1 mounted on a cable (mounting member) 1A as a connector (first connector). Also, the following description is given of a receptacle connector 2 mounted on a circuit board (opponent mounting member) 2A as an opponent connector (second connector).

Note that, as for the plug connector 1 and the receptacle connector 2, description is given assuming that an axis perpendicular to (normal to) a mounting surface of a mounting member in a state where each of the connectors is mounted on the mounting member is a top-bottom axis (Z axis). Also, description is given assuming that an axis in which terminals housed in a housing of each connector are arranged is a width axis (Y axis) and an axis in which the terminals are inserted into the housing of each connector is a front-rear axis (X axis).

Furthermore, the top side in a state where the connector mounted on the mounting member is located on the upper side of the mounting surface is defined as the top of the top-bottom axis, while the side on which the connectors face each other when fitted together is defined as the front of the front-rear axis.

[Configuration Example of Connector Set]

Figure 1:
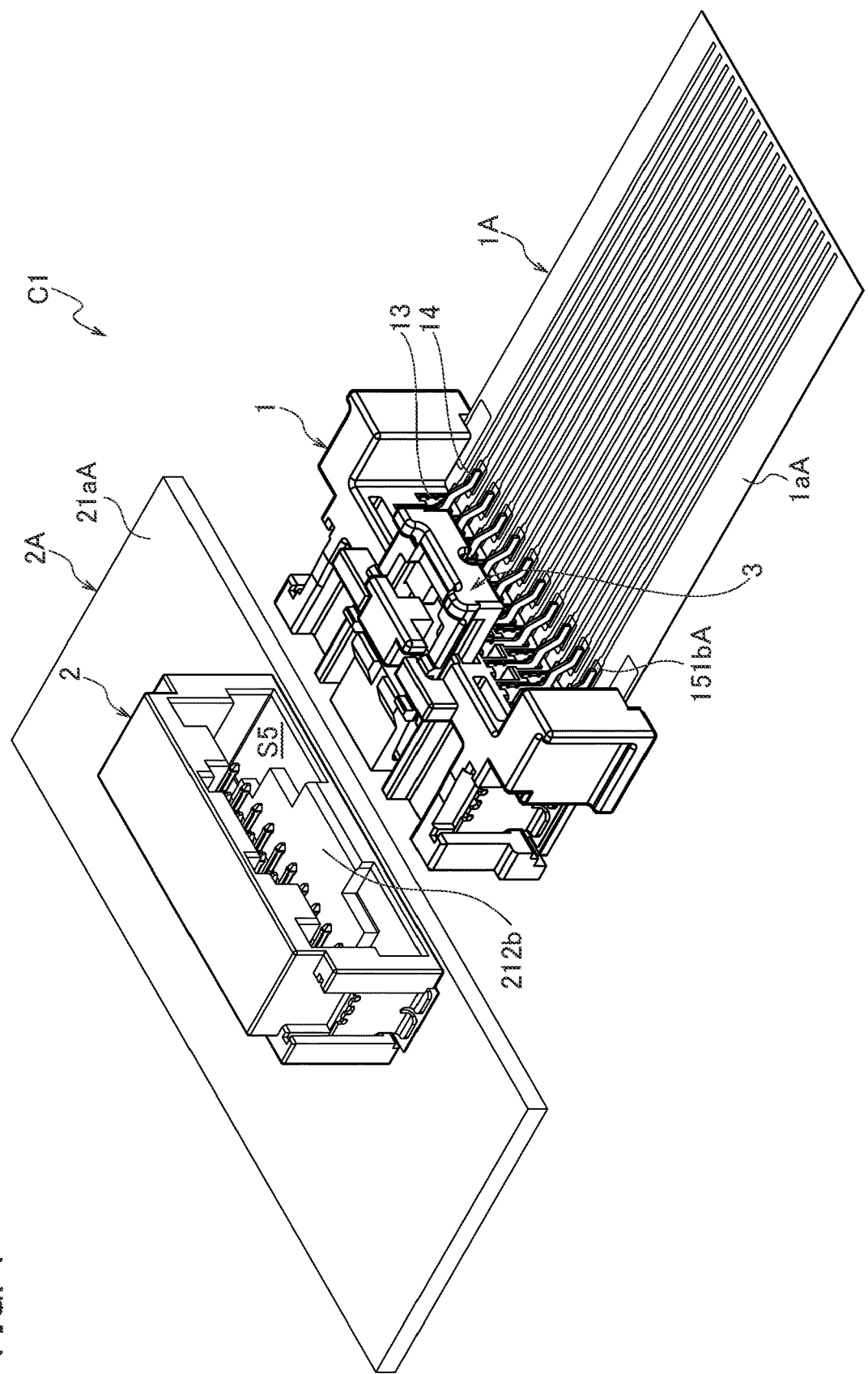
FIG. 1 is an exploded perspective view showing an example of a connector set including a plug connector mounted on a cable and temporarily holding a slide member and a receptacle connector mounted on a circuit board.
Figure 2:
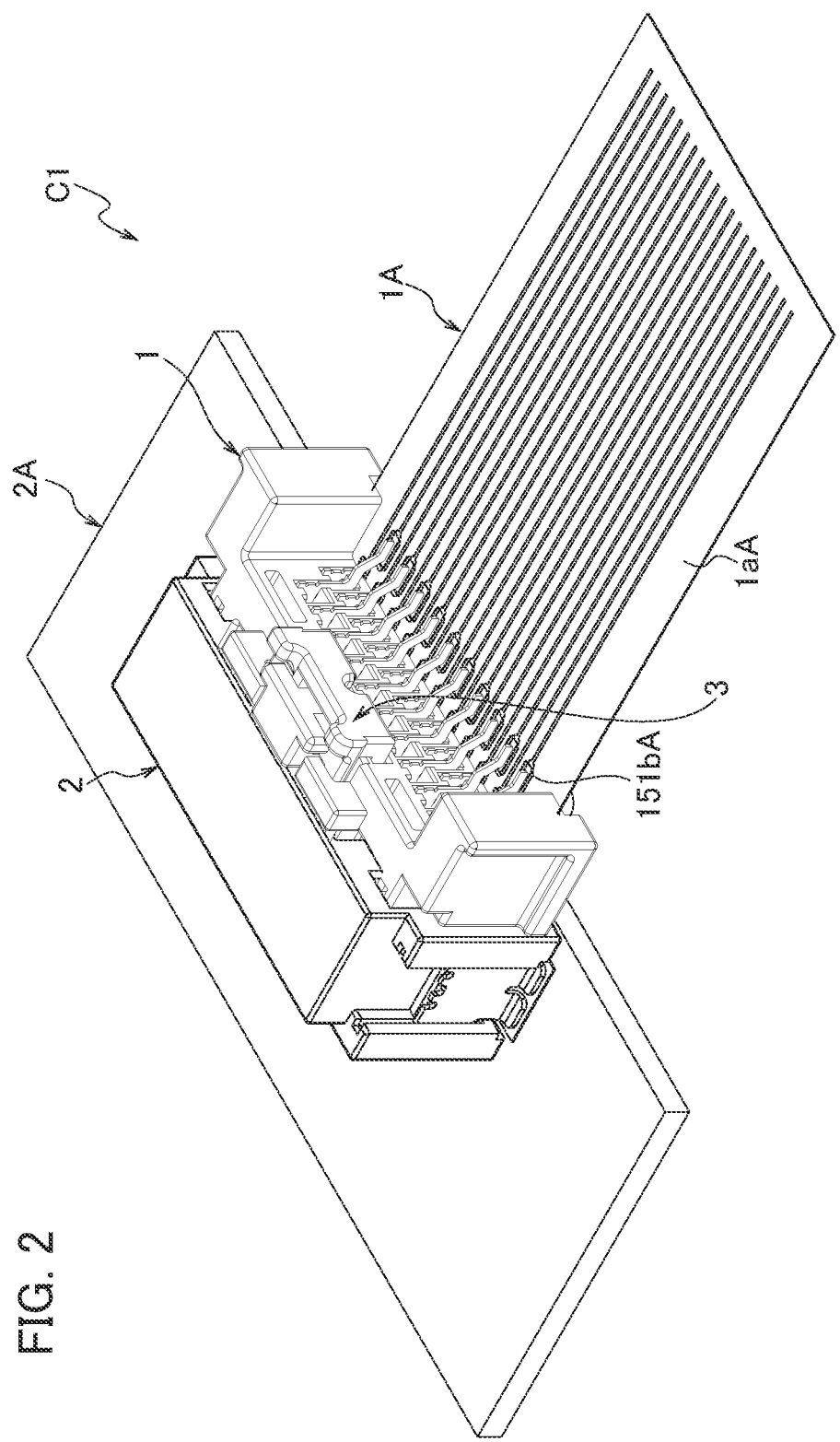
FIG. 2 is a perspective view showing an example of the connector set in a state where the plug connector mounted on the cable and the receptacle connector mounted on the circuit board are fitted together and locked with the slide member.

The plug connector (connector: first connector) 1 according to this embodiment is used for a connector set C1 shown in FIGS. 1 and 2 and the like.

The connector set C1 includes a plug connector 1 described above and a receptacle connector (opponent connector: second connector) 2 to which the plug connector 1 is fitted, as shown in FIGS. 1 and 2.

In this embodiment, the plug connector 1 is formed to be mountable on the cable (mounting member: connecting member) 1A such as an FPC and an FFC. More specifically, the plug connector 1 is configured to be mounted on the cable 1A by electrically connecting (mounting) mounting pieces (mounting parts) 132 and 142 of plug terminals 13 and 14 included in the plug connector 1 to a conductor part 151bA of the cable 1A.

Meanwhile, the receptacle connector 2 is formed to be mountable on the circuit board (opponent mounting member) 2A. More specifically, the receptacle connector 2 is configured to be mounted on the circuit board 2A by electrically connecting (mounting) mounting pieces (opponent mounting parts) 232 and 242 of receptacle terminals 23 and 24 included in the receptacle connector 2 to a conductor part 2bA of the circuit board 2A.

In the state where the plug connector 1 in which the plug terminals 13 and 14 are held by a plug housing 10, and in which the mounting pieces 132 and 142 are mounted on the cable 1A is fitted into the receptacle connector 2, the plug terminals 13 and 14 are electrically connected to the receptacle terminal 23 and 24 included in the receptacle connector 2.

Thus, the connector set C1 electrically connects the cable 1A to the circuit board 2A by fitting the plug connector 1 into the receptacle connector 2 to achieve conduction between the plug terminals 13 and 14 and the receptacle terminals 23 and 24 (see FIGS. 2 to 4).

Figure 5:
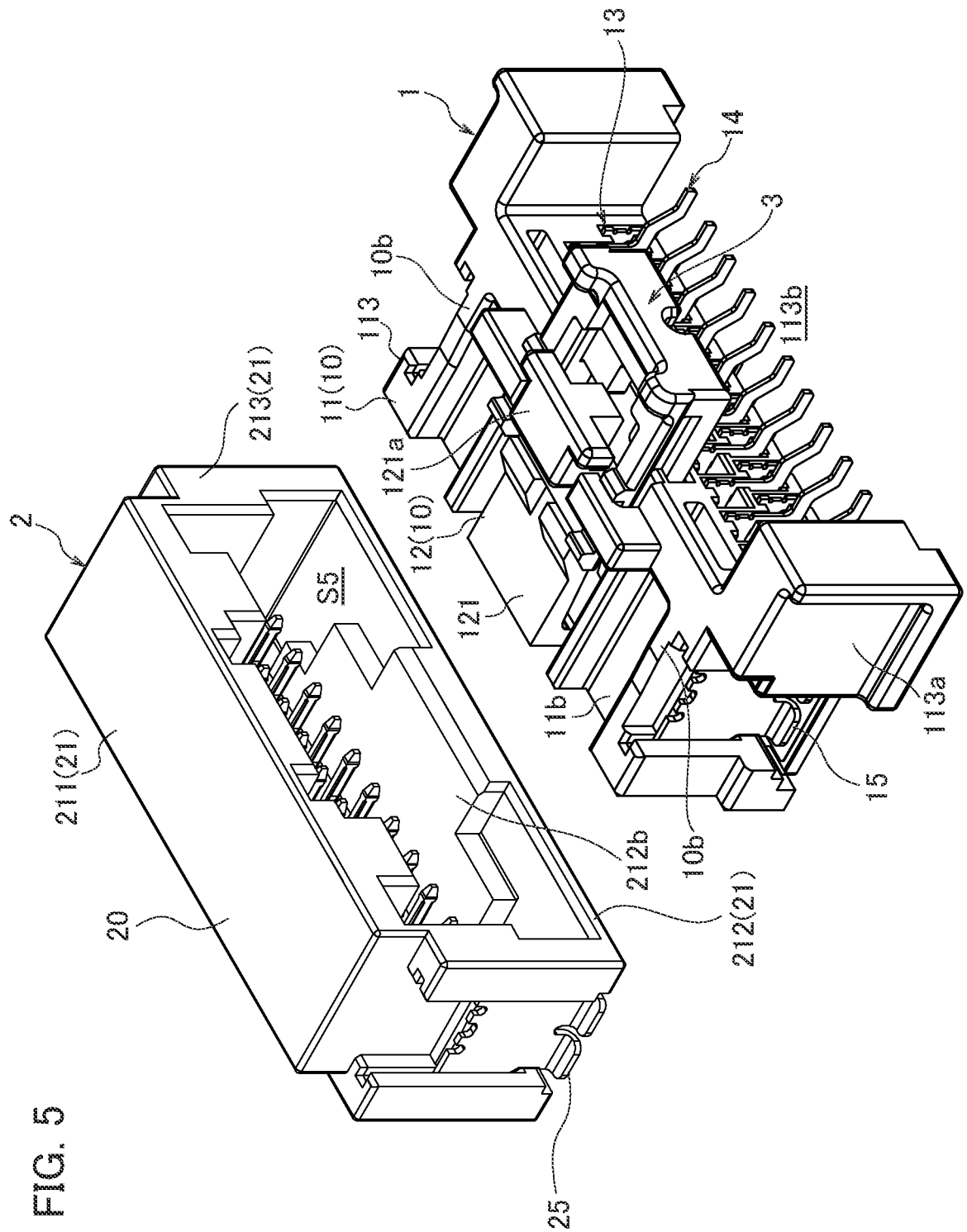
FIG. 5 is a diagram explaining how the plug connector and the receptacle connector shown as an example are locked with the slide member, and a perspective view showing a state before the plug connector in which the slide member has been temporarily held is fitted to the receptacle connector.
Figure 6:
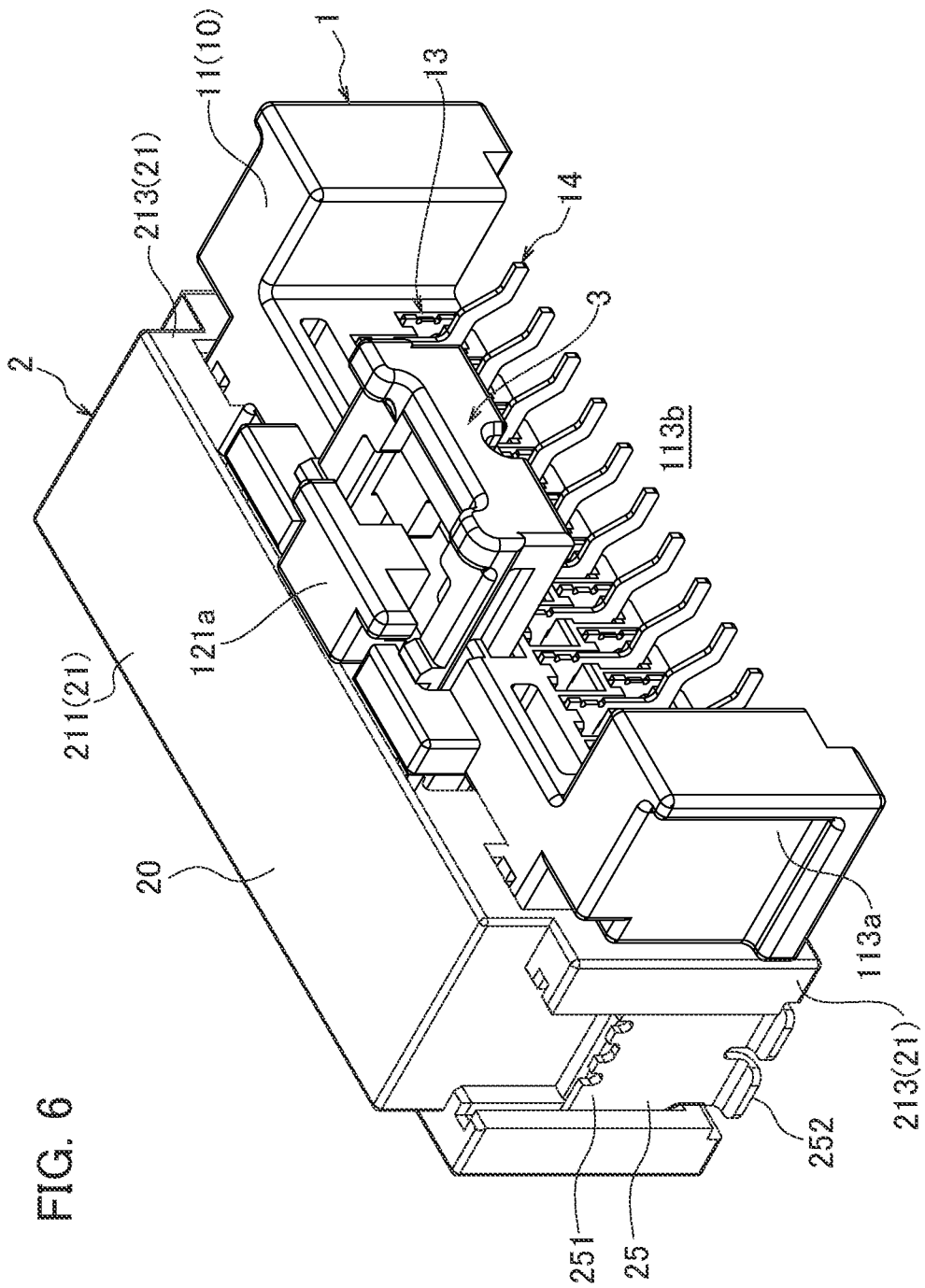
FIG. 6 is a diagram explaining how the plug connector and the receptacle connector shown as an example are locked with the slide member, and a perspective view showing a state where the plug connector in which the slide member has been temporarily held has been fitted to the receptacle connector.
Figure 7:
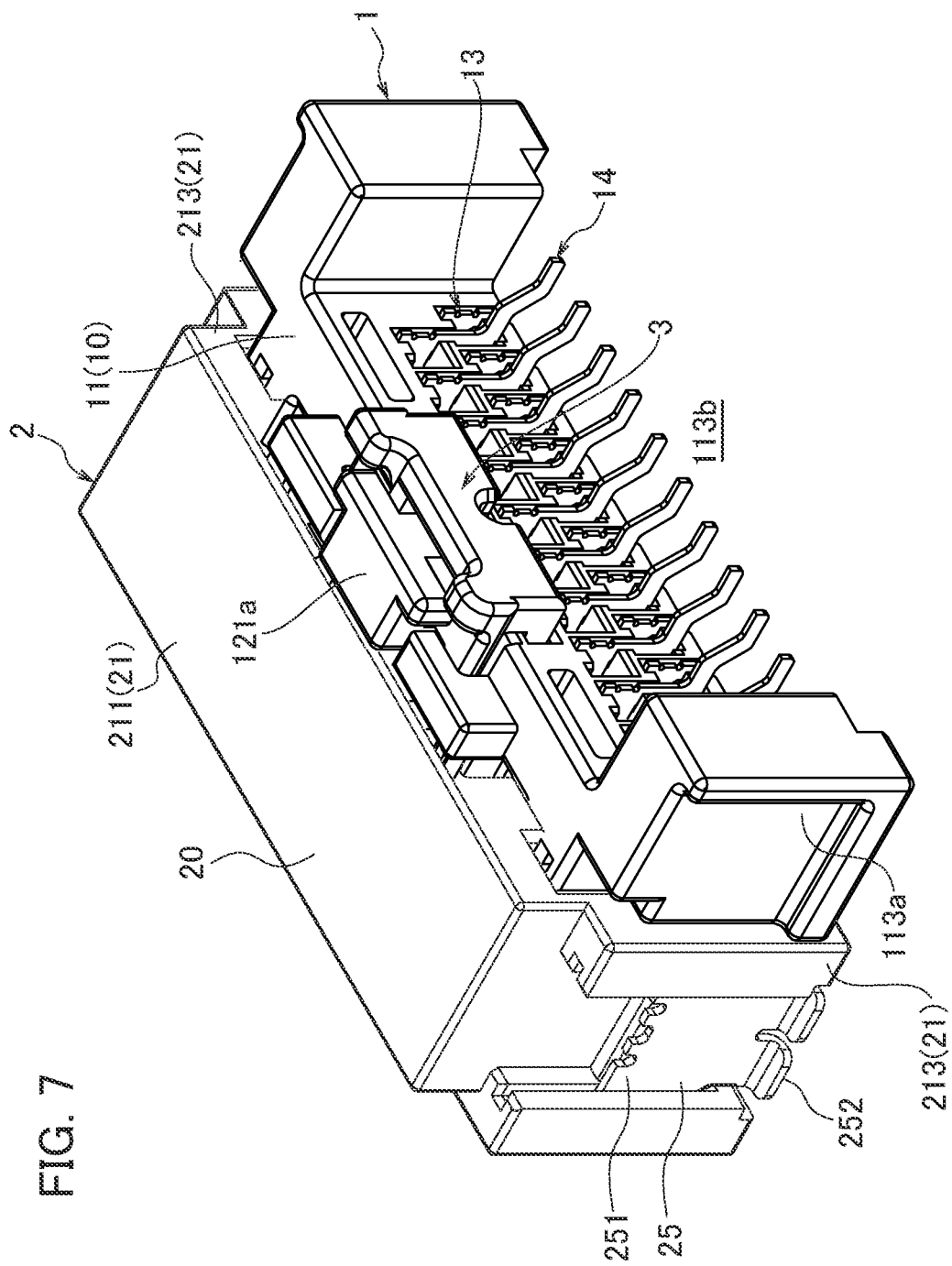
FIG. 7 is a diagram explaining how the plug connector and the receptacle connector shown as an example are locked with the slide member, and a perspective view showing a state where the plug connector has been fitted to the receptacle connector and locked with the slide member.

Furthermore, in this embodiment, a slide member 3 is slidably supported on the plug connector 1 (see FIGS. 5 to 7).

This slide member 3 is slidably attached to the plug connector 1 such that the slide movement of the slide member 3 from an initial position which is a first position to a slide completion position which is a second position is restricted in a state where the plug connector 1 has not been completely fitted into the receptacle connector 2 yet. Note that the first position and the second position may be set as appropriate.

Then, the slide member 3 is configured such that once the plug connector 1 is completely fitted into the receptacle connector 2, the slide movement of the slide member 3 from the initial position to the slide completion position is allowed. This configuration makes it possible to check the completion of fitting between the plug connector 1 and the receptacle connector 2 from the sliding of the slide member 3 from the initial position to the slide completion position.

As described above, in this embodiment, the connector set C1 has a connector position assurance (CPA) function and the slide member 3 functions as a CPA member.

[Configuration Example of Cable 1A]

Figure 8:
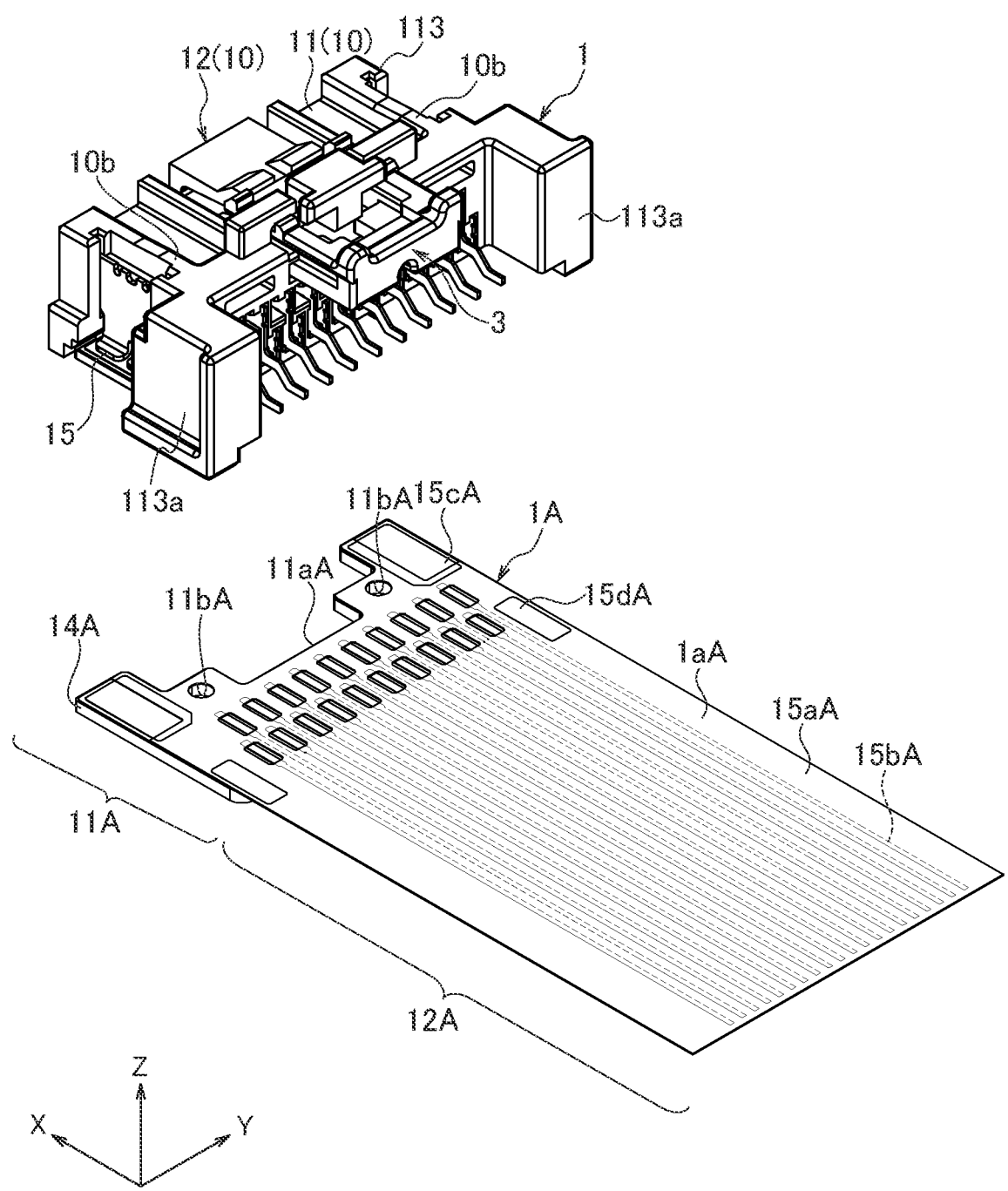
FIG. 8 is a perspective view showing a state before the plug connector in which the slide member has been temporarily held included in the connector set shown as an example is mounted on a cable.
Figure 9:
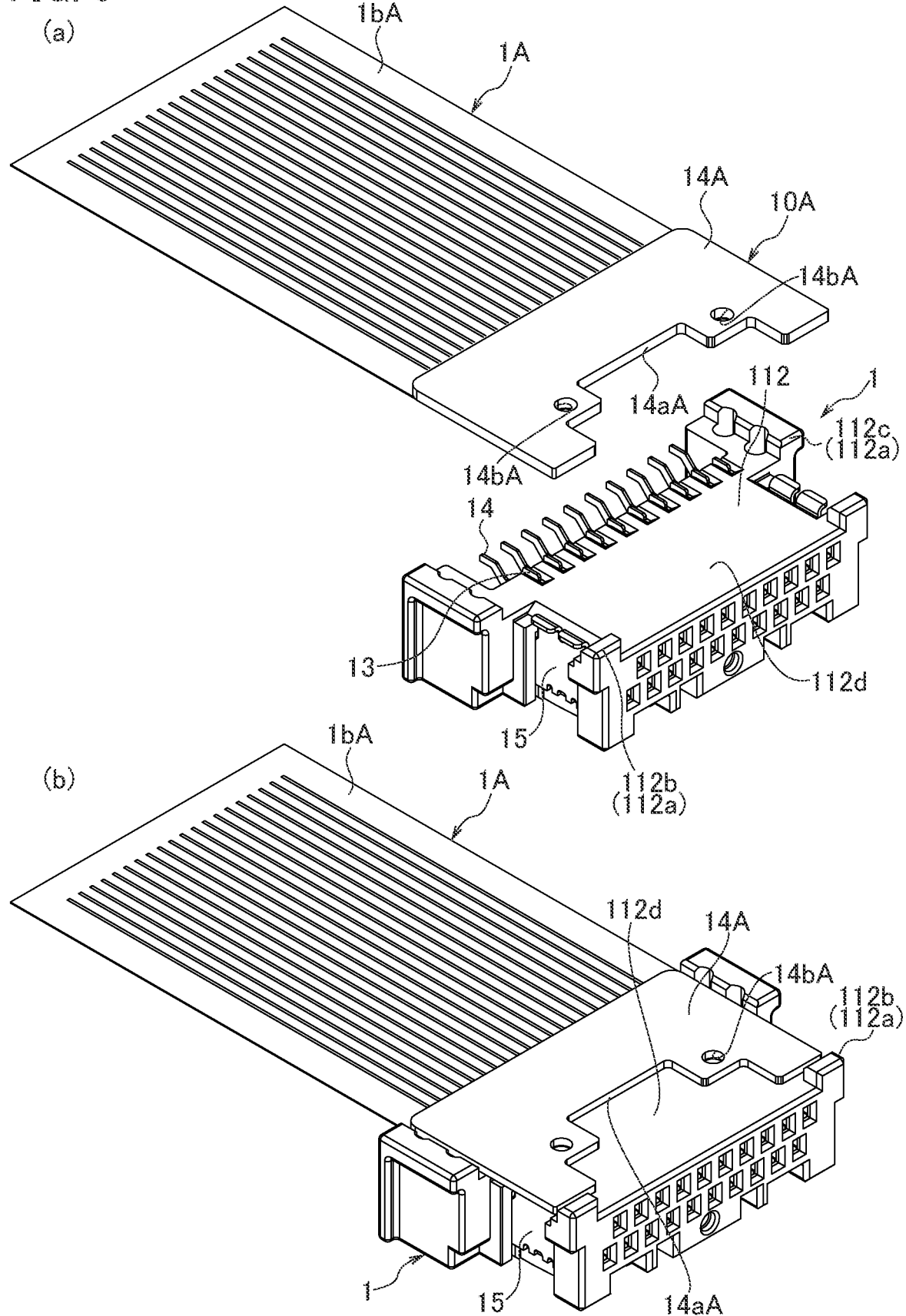
FIG. 9 is a diagram explaining how the plug connector included in the connector set shown as an example is mounted on the cable.

Next, with reference to FIGS. 8 and 9, description is given of a configuration example of the cable 1A on which the plug connector 1 is mounted.

The cable 1A has a sheet shape (flat plate shape) with a top surface (front surface: one side) 1aA and a rear surface (back surface: the other side) 1bA. The top surface 1aA serves as a mounting surface to mount the plug connector 1. The cable 1A is also flexible and thus can be bent (curved) in a cable thickness axis.

This cable 1A includes a connection region 11A used for connection with the plug connector 1 and an extension region 12A in which a conductor layer 15bA extends for wiring with another circuit.

In this embodiment, the cable 1A is formed such that the connection region 11A is positioned at one end side of the extension region 12A. In a state where the plug connector 1 having the connection region 11A connected thereto is fitted into the receptacle connector, the extension region 12A is positioned on the opposite side of the receptacle connector.

Moreover, the cable 1A has a multilayer structure, including a support layer 15aA and the conductor layer 15bA supported by the support layer 15aA. The support layer 15aA is formed of a plurality of insulator films to cover the conductor layer 15bA. On the other hand, the conductor layer 15bA is formed of conductor films printed on the insulator films included in the support layer 15aA, which are a plurality of wiring patterns corresponding to the plurality of terminals (the lower plug terminals 13 and the upper plug terminals 14) to be described later, respectively.

On the upper surface of the connection region 11A, a plurality of conductor parts 151bA are formed, which are the conductor layer 15bA exposed from the support layer 15aA. The plurality of conductor parts 151bA are formed in two rows along the front-rear axis, and the conductor parts 151bA in each row are formed so as to be arranged at a predetermined pitch in the width axis (Y axis). Furthermore, in this embodiment, the plurality of conductor parts 151bA are formed in a staggered pattern in a plan view (state viewed along the mounting surface 1Aa).

Such a structure can be formed, for example, by printing the plurality of conductor films on the support layer 15aA to form the conductor layer 15bA and then covering the conductor layer 15bA with another support layer 15aA. In this event, another support layer 15aA is provided so as not to cover the tip of the conductor layer 15bA. Thus, the cable 1A having the tip of the conductor layer 15bA exposed on one side (top side of the top-bottom axis) is formed.

Note that a method for forming the cable 1A is not limited to the above method, but various other methods can be used to form the cable 1A.

On the upper surface of the connection region 11A, fixing parts 15cA are also formed to fix holding brackets 15 in the plug connector 1. In this embodiment, the cable 1A has a rectangular shape with a width wider than the plurality of conductor layers 15bA arranged in the width axis (Y axis) in a plan view (state viewed along the mounting surface 1Aa), and a pair of fixing parts 15cA are formed on either side in the width axis (Y axis) on the tip side (the front side in the front-rear axis). Moreover, on the rear side in the front-rear axis relative to the pair of fixing parts 15cA, fixing parts 15dA are formed to fix a plug housing (housing) 10 of the plug connector 1. The fixing parts 15cA and the fixing part 15dA can be formed, for example, in the same manner as the conductor layers 15bA in a printing process for the conductor layers 15bA.

In addition, in this embodiment, a cut-in portion 11aA which is elongated in the width axis (Y axis) and open to the front is formed in a step shape at the connection region 11A of the cable 1A. On both sides in the width axis (Y axis) of the cut-in portion 11aA at the connection region 11A are through holes 11bA formed to pass through the cable 1A in the cable thickness axis (top-bottom axis; Z axis).

Furthermore, in this embodiment, the cable 1A includes a reinforcing plate 14A. This reinforcing plate 14A is formed using glass epoxy resin, stainless steel, or the like, and is configured to reinforce the connection region 11A of the cable 1A by sandwiching the connection region 11A of the cable 1A between the reinforcing plate 14A and the plug connector 1.

The reinforcing plate 14A in this embodiment has a shape corresponding to the shape of, the connection region 11A of the cable 1A. In other words, the outline shape of the reinforcing plate 14A in plan view (as viewed along the mounting surface 1aA) is approximately the same as the outline shape of the connection region 11A. Thus, the reinforcing plate 14A has a cut-in portion 14aA elongated in the width axis (Y axis) and open to the front and through holes 14bA passing through the reinforcing plate 14A in the cable thickness axis (top-bottom axis; Z axis). Then, the reinforcing plate 14A is attached to the rear surface side of the connection region 11A with an adhesive or the like with the cut-in portion 11aA and the cut-in portion 14aA communicating with each other and with the through holes 11bA and the through holes 14bA communicating with one another.

In this event, it is preferable that the entire conductor part 151bA overlap with the reinforcing plate 14A in the plan view (state viewed along the mounting surface 1Aa). In this way, the entire conductor part 151bA is supported by the reinforcing plate 14A, and thus can be prevented from bending in the top-bottom axis (Z axis) or warping in the width axis (Y axis).

[Configuration Example of Plug Connector 1]

Next, with reference to FIGS. 10 to 14, description is given of a configuration example of the plug connector 1.

Figure 10:
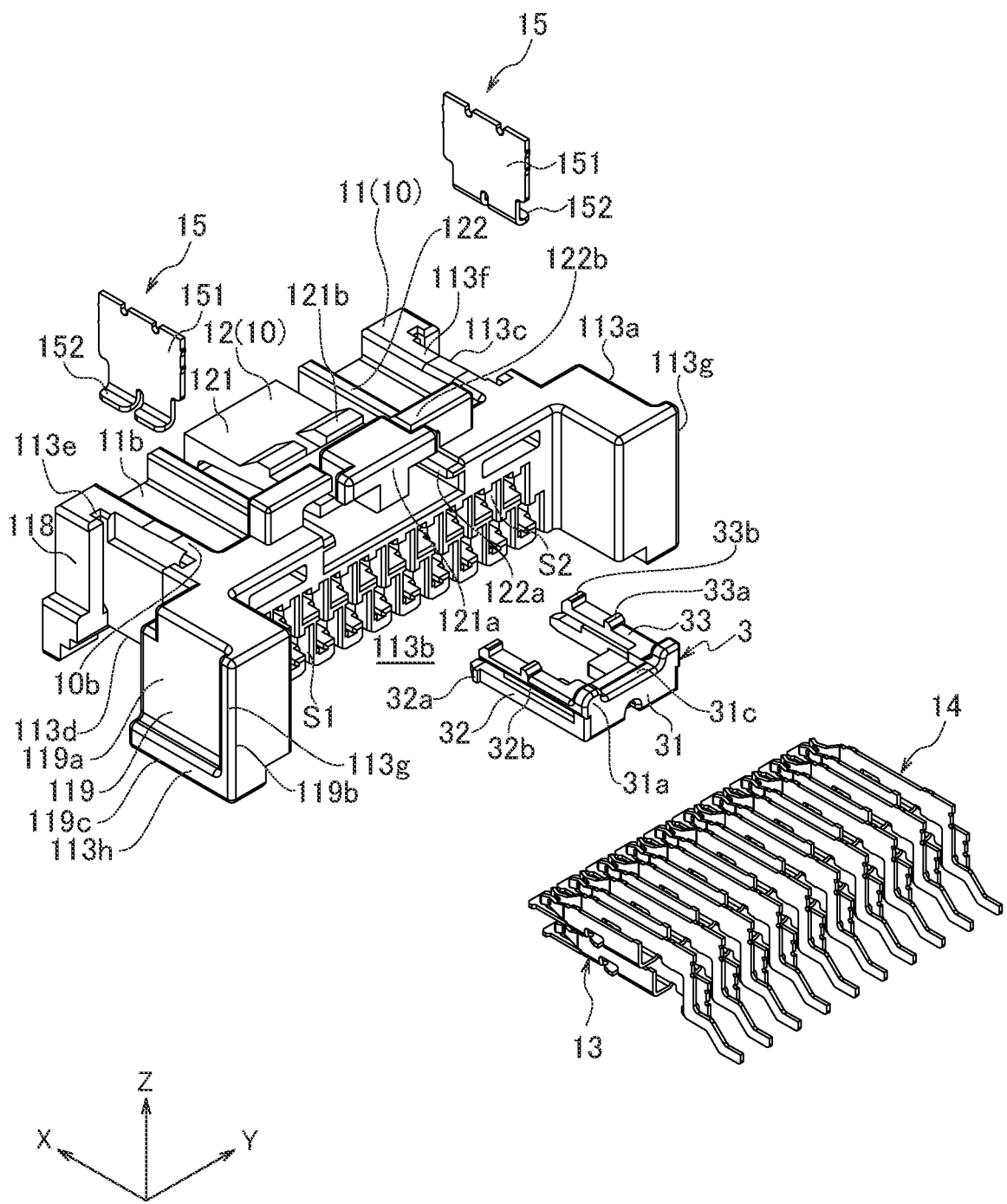
FIG. 10 is an exploded perspective view showing the plug connector included in the connector set shown as an example.
Figure 12:
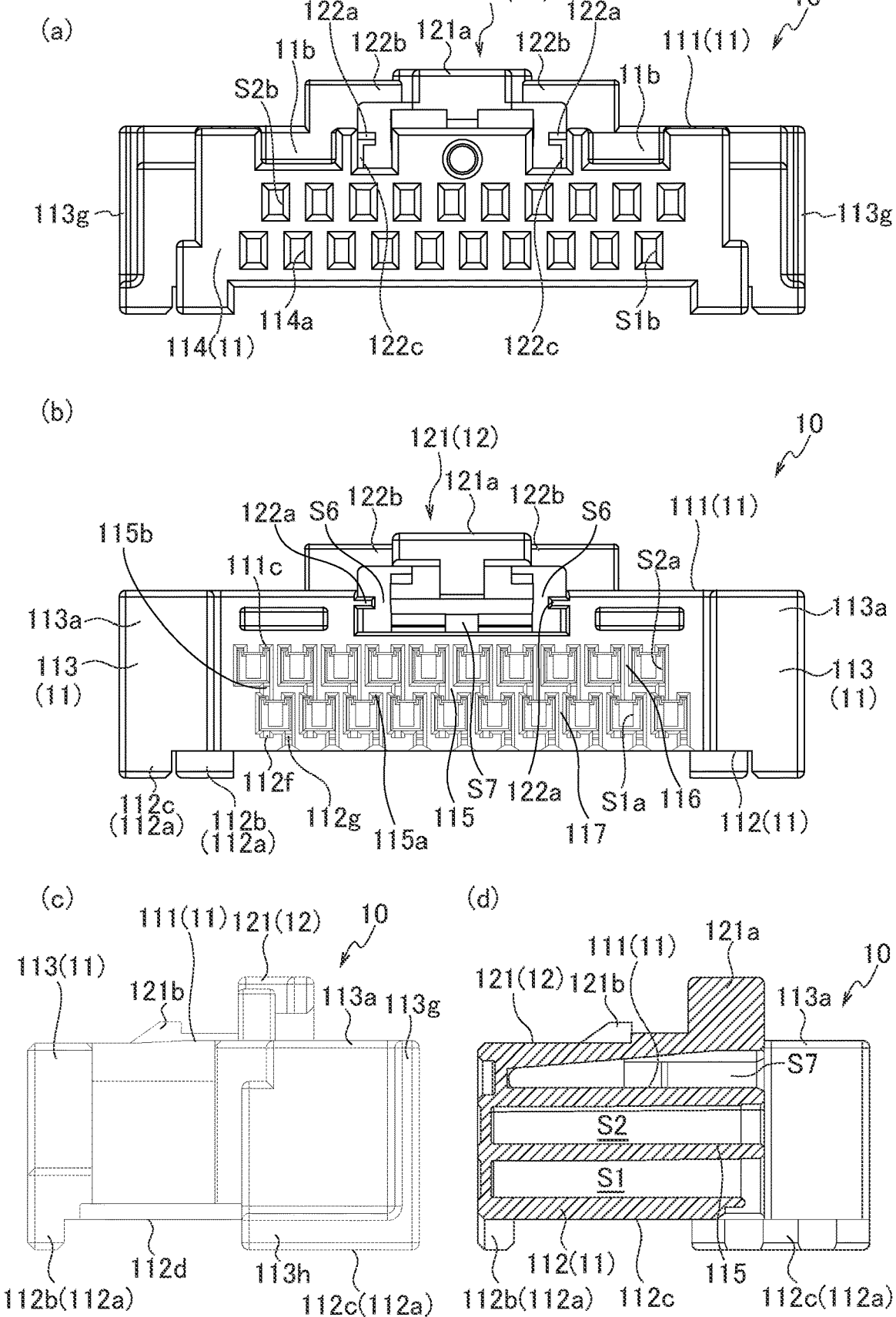
FIG. 12 is a diagram showing the plug housing included in the plug connector shown as an example.

As shown in FIG. 10, the plug connector 1 includes a plug housing (housing: first housing) 10, plug terminals (lower plug terminals 13 and upper plug terminals 14) held by the plug housing 10, and the holding brackets 15 held by the plug housing 10.

The plug connector 1 is configured to be mounted on the cable 1A as the mounting member by mounting the plug terminals (terminals: first terminals) 13 and 14 held by the plug housing 10 on the conductor part 151bA of the cable 1A disposed outside the plug housing 10. Note that the plug terminals 13 and 14 are mounted on the conductor part 151bA by soldering or the like. The holding brackets 15 are fixed to the fixing parts 15cA of the cable 1A by soldering or the like, in a state where the holding brackets 15 are held by the plug housing 10, to fix the plug housing 10 to the cable 1A.

The plug housing 10 includes a rigid housing main body 11, and can be formed, for example, using an insulating resin material.

The housing main body 11 also has a lock part 12 formed on its upper side. This lock part 12 holds the plug housing 10 and the housing of the receptacle connector 2 in their fitted state or releases the fitted state.

Thus, in this embodiment, the plug housing 10 includes the housing main body 11 and the lock part 12 formed in the housing main body 11.

The housing main body 11 includes a top wall 111, a bottom wall 112, a pair of side walls 113 connecting both ends, in the width axis (Y axis), of the top wall 111 and the bottom wall 112, and a front wall 114 provided continuously from front ends of the top wall 111, the bottom wall 112, and the side walls 113, 113.

In addition, the housing main body 11 includes a partition walls 115 that is provided continuously from the pair of side walls 113 and the front wall 114 and partitions, into upper and lower parts, a space defined by the top wall 111, the bottom wall 112, the side walls 113, 113, and the front wall 114.

The housing main body 11 further includes a plurality of upper partition walls 116 provided continuously from the top wall 111, the partition wall 115, and the front wall 114. These upper partition walls 116 partition the upper space partitioned by the partition wall 115 into a plurality of spaces. The housing main body 11 also includes a plurality of lower partition walls 117 provided continuously from the bottom wall 112, the partition wall 115, and the front wall 114. These lower partition walls 117 partition the lower space partitioned by the partition wall 115 into a plurality of spaces.

The lock part 12 is formed in the middle, in the width axis, of the upper part of the top wall 111 having an approximately flat plate shape, such that the lock part 12 protrudes upward. To be more specific, the lock part 12 includes a lever part 121 that is provided continuously from the front end of the top wall 111 and extends rearward. This lever part 121 has its rear side capable of moving in the top-bottom axis relative to the top wall 111 (housing main body 11). The lever part 121 has an operation part 121a formed at its rear end to operate the lever part 121, and also has an engagement protrusion 121b formed in its central portion, in the front-rear axis, of the lever part 121 to engage with an engagement recess part (engaging part) 221a formed in the receptacle connector 2.

In this embodiment, when the plug housing 10 and the receptacle housing 20 of the receptacle connector 2 are fitted together, the housings of the respective connectors can be locked together (maintained in the fitted state) by the engagement protrusion 121b engaging with the engagement recess part 221a. Then, the fitted state of the housings of the respective connectors can be released by lowering the operation part 121a of the lever part 121 to move downward the lever part 121 as well as the engagement protrusion 121b, thus releasing the engagement with the engagement recess part 221a.

Furthermore, the lock part 12 includes a pair of partition walls 122 provided upright on either side, in the width axis, of the lever part 121 such that the partition walls 122 extend in the front-rear axis at a distance from the lever part 121. Then, an insertion space S6 into which the slide member 3 is inserted is formed between each partition walls 122 and the lever part 121. In addition, below the lever part 121 (between the lever part 121 and the top wall 111), a deflection allowance space S7 is formed where downward deflection of the lever part 121 (the movement of the lever part 121 relative to the housing main body 11) is allowed.

Note that each insertion space S6 is partitioned into a space into which a lower arm part 32 of the slide member 3 is inserted and a space into which an upper arm part 33 of the slide member 3 is inserted, by a protrusion wall 122a formed to protrude in the width axis on the partition wall 122.

In addition, a step part 122c is formed in the middle in the front-rear axis below the protrusion wall 122a of each partition wall 122 and the space into which the lower arm part 32 is inserted is formed to have a wider front side in a plan view. Locking locking protrusions 32a that are formed to protrude outward in the width axis on the tips (front ends) of the lower arm parts 32 to the step parts 122c prevents the slide member 3 from falling off the housing main body 11.

In addition, in rear parts of the partition walls 122, restrictive protrusions (slide restrictors) 122b each protruding toward the lever part 121 are formed. The restrictive protrusions 122b prevent the slide member 3 from sliding from the initial position to the slide completion position in the state where the plug housing 10 has not been completely fitted into the receptacle housing 20.

Moreover, in this embodiment, protrusion walls 113f are formed such that the upper parts of the pair of side walls 113 protrudes above the top wall 111. The gap between each protrusion wall 113f and the lock part 12 serves as a guide recess part 11b that guides the fitting of the plug housing 10 into the receptacle housing 20 of the receptacle connector 2.

Moreover, in this embodiment, protrusion parts 10b are formed on upper surfaces of the protrusion walls 113f that are a part of an outer surface (upper surface: facing surface) 10a of the plug housing 10 to face an inner surface (inner lower surface) 20a of the receptacle housing 20 in the fitted state of the two connectors. A gap formed between the outer surface 10a and the inner surface 20a is narrowed at portions where the protrusion parts 10b are formed.

That is, in the state where the plug housing 10 and the receptacle housing 20 are fitted together, two portions having different sizes of gaps are formed between the outer surface (upper surface) 10a of the plug housing 10 and the inner surface (inner lower surface) 20a of the receptacle housing 20 that face each other.

This forms a first portion and a second portion between the outer surface 10a and the inner surface 20a in the fitted state of the two connectors, the first portion formed with a clearance for fitting the plug housing 10 and the receptacle housing 20, the second portion having a distance between the outer surface 10a and the inner surface 20a smaller than the clearance.

The second portion is formed in a part of the insertion direction (X axis) of inserting the plug housing 10 in the receptacle housing 20.

Note that when the clearance for fitting the plug housing 10 and the receptacle housing 20 is set to a size of about 0.1 mm, the distance between the outer surface 10a and the inner surface 20a at the portion where the protrusion parts 10b are formed may be set to a size of about 0.06 mm, for example.

Thus, in this embodiment, the portion where the protrusion parts 10b are formed is the second portion.

Further, in this embodiment, the protrusion parts 10b are formed on this side in the fitting direction (X axis) to the receptacle housing (mating housing) 20 in the plug housing 10. Specifically, the protrusion parts 10b are formed to be positioned on this side (rearward in the front-rear axis) of a portion, where the engagement protrusions 121b of the lever part 121 are formed, in the insertion direction in the plug housing 10, when viewed along the width axis (Y axis).

Thus, when the plug housing 10 is inserted in the receptacle housing 20, the engagement protrusions 121b are inserted in the receptacle housing 20 prior to the protrusion parts 10b. This prevents the insertion of the plug housing 10 in the receptacle housing 20 and the engagement by the engagement protrusions 121b from being obstructed by the protrusion parts 10b as much as possible.

In this embodiment, the protrusion parts 10b are formed on both sides in the width axis (Y axis: an axis intersecting with the fitting direction), thereby preventing the plug housing 10 from rotating around the insertion direction (X axis).

As described above, in this embodiment, a part of the portion of the outer surface 10a of the plug housing 10, the portion facing the inner surface 20a of the receptacle housing 20, is made narrower than the clearance necessary for fitting, thereby controlling the looseness in fitting while preventing the deterioration of the insertion performance.

Furthermore, extension parts 113a, 113a extending rearward are formed on the pair of side walls 113, 113, respectively. A region where the extension parts 113a, 113a face each other serves as a recess part 113b that houses mounting pieces (mounting parts) 132 and 142 of the plug terminals 13 and 14.

The extension parts 113a are formed to have a thickness (plate thickness) in the width axis (Y axis) thicker than that of the side walls 113 and connected to rear ends of the side walls 113 to have end surface portions in the width axis positioned outside of end surface portions of the side walls 113 in the width axis. Thus, in this embodiment, the housing main body 11 (plug housing 10) is formed to be wider in the rear than in the front in a plan view.

The portion of the housing main body 11, which is narrow and in front of the extension parts 113a (a portion where the side wall 113 is formed), serves as inserted parts 118 to be inserted in a fitting space S5 of the receptacle housing 20. The portion (wide portion) of the housing main body 11, in which the extension parts 113a are formed serves as exposed parts 119 exposed from the receptacle housing 20 with the plug housing 10 fitted to the receptacle housing 20.

Moreover, hook protrusions (hook parts) 113g protruding outward in the width axis are formed on the rear end sides of the extension parts 113a so as to extend in the top-bottom axis (thickness axis of the housing main body 11; Z axis).

Then, providing such hook protrusions 113g on the exposed part 119 makes it possible to hook fingers 41 on the hook protrusions 113g when operator 4 gripping the plug connector 1 with a hand. This allows the plug connector 1 fitted into the receptacle connector 2 to be more easily pulled out.

As described above, in this embodiment, the exposed parts 119 are provided with the hook protrusions (hook part) 113g for hooking the fingers 41 thereon that are formed at the ends in the intersecting axis intersecting with the insertion direction (front-rear axis: X axis) of inserting the inserted parts 118 in the receptacle housing 20.

Specifically, the hook protrusions 113g are formed at ends of the exposed parts 119 on this side in the insertion direction (X axis) to protrude outward in the width axis (Y axis).

That is, in this embodiment, the intersecting axis is the width axis (Y axis) of the housing main body 11. Side surfaces of the exposed parts 119 on both sides in the width axis (Y axis) serve as exposed surfaces 119a that are exposed in the intersecting axis (width axis: Y axis) with the plug housing 10 fitted to the receptacle housing 20. In this embodiment, side surfaces (exposed surfaces 119a) of the extension parts 113a are each formed to be a flat surface having a substantially rectangular shape.

The protrusions (hook protrusions 113g) protruding outward from the exposed surfaces 119a in the intersecting axis (width axis: Y axis) serve as hook parts capable of hooking the fingers 41 thereon.

In this embodiment, each hook protrusion 113g is formed to extend along the peripheral edge of the exposed surface 119a.

Specifically, each exposed surface 119a has a substantially rectangular shape in a side view (a state viewed along the intersecting axis), and the hook protrusion 113g is formed along a side part 119b of the exposed surface 119a, the side part 119b being on this side in the insertion direction (X axis). At this time, the hook protrusion 113g is linearly formed to extend from the lower end to the upper end of the side part 119b in the top-bottom axis (Z axis: thickness axis of the housing main body 11).

As described above, in this embodiment, the hook protrusions 113g are provided at the rear ends of the exposed surfaces 119a in the front-rear axis. Thus, with the plug housing 10 fitted to the receptacle housing 20, the hook protrusions 113g face the front end of the receptacle connector 2 with a gap therebetween in the front-rear axis. This enables the fingers 41 to be hooked on the hook protrusions 113g without being obstructed by the receptacle connector 2 even when the plug connector 1 miniaturized is used.

Thus, in this embodiment, the hook protrusions 113g protruding outward in the width axis are formed on the rear ends of the extension parts 113a to extend in the top-bottom axis. This improves the performance of pulling-out the plug connector 1 from the receptacle connector 2 even in the connector set C1 miniaturized.

However, when the hook protrusions 113g are provided on the side parts 119b of the exposed surfaces 119a, the hook protrusions 113g are formed at a position away from the center of gravity of the plug housing 10. That is, the contour of the plug housing 10 in a plan view has a shape in which the hook protrusions 113g protrude most in the width axis.

Thus, when multiple plug housings 10 each having only the hook protrusions 113g formed on the side parts 119b of the exposed surfaces 119a are moved along a wall part 51 of a parts feeder 5 to be in a certain posture, normally, the plug housings 10 adjacent to each other come in contact with each other at the hook protrusions 113g protruding in the width axis. That is, the plug housings 10 adjacent to each other come in contact with each other in a substantially linear manner at a position away from the center of gravity of the plug housing 10.

In this way, when multiple plug housings 10 having only the hook protrusions 113g formed on the side parts 119b of the exposed surfaces 119a are arranged in the width axis in a certain posture, the plug housings 10 adjacent to each other come in contact with each other in a relatively unstable state.

Figure 27:
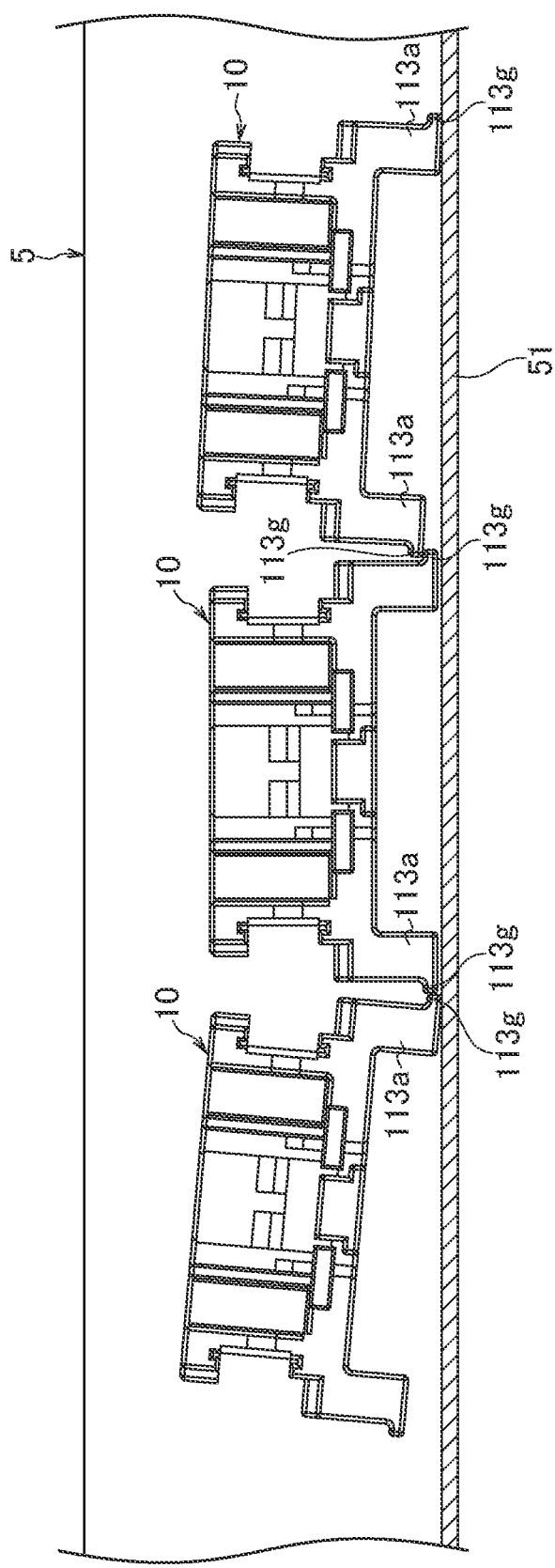
FIG. 27 is a diagram schematically showing a state where a comparative example of a plug housing is being conveyed on a parts feeder.

Thus, when the plug housings 10 each having only the hook protrusions 113g formed on the side parts 119b of the exposed surfaces 119a are used, the plug housings 10 may tilt from a certain posture when the plug housings 10 are aligned to be in the certain posture by the parts feeder 5 (see FIG. 27). When the plug housing 10 tilts from the certain posture, it may be supplied to an automatic assembly device (not shown) in a tilt state.

Therefore, this embodiment provides the plug housing 10 that prevents the change in posture during the conveyance by the parts feeder 5 while improving the performance of pulling-out from the receptacle connector 2.

Specifically, the exposed parts 119 are each provided with a contact protrusion (contact part) 113h that comes in contact with another plug housing 10 adjacent to each other in the intersecting axis (width axis: Y axis) between the inserted part 118 and the hook protrusion 113g (front in the front-rear axis) when the other plug housing 10 is disposed adjacent to each other in the intersecting axis (width axis: Y axis).

In this embodiment, protrusions (contact protrusions 113h) protruding outward in the intersecting axis from the exposed surfaces 119a serve as the contact parts.

The hook protrusion 113g and the contact protrusion 113h are formed to extend along the peripheral edge of the exposed surface 119a.

Specifically, the contact protrusion 113h is formed along a side part 119c of the exposed surface 119a, the side part 119c being one side (lower side) in the top-bottom axis (Z axis: an axis intersecting with the insertion direction and the intersecting axis).

Thus, in this embodiment, the contact protrusion 113h is formed to extend along the insertion direction X from the hook protrusion 113g toward the center of gravity of the plug housing 10.

Further, in this embodiment, the contact protrusion 113h is connected to the hook protrusion 113g, and the contact protrusion 113h and the hook protrusion 113g form a protrusion in a substantially L-shape in a side view on the exposed surface 119a. At this time, the contact protrusion 113h is linearly formed to extend from the rear end to the front end of the side part 119c in the front-rear axis (X axis: insertion direction).

The amount of protrusion of the hook protrusion 113g from the exposed surface 119a and the amount of protrusion of the contact protrusion 113h from the exposed surface 119a are substantially the same.

In other words, the hook protrusion 113g and the contact protrusion 113h are formed to have their ends in the intersecting axis positioned on the same plane.

As described above, in this embodiment, the hook protrusion 113g is formed at the rear end in the front-rear axis of the exposed surface 119a having a substantially rectangular shape in a side view, and the contact protrusion 113h is formed at the lower end in the top-bottom axis of the exposed surface 119a. That is, the contact protrusion 113h is not provided at the upper end of the exposed surface 119a. In this way, with the plug housing 10 fitted to the receptacle housing 20, each exposed part 119 has three sides defined by the receptacle housing 20, the hook protrusion 113g, and the contact protrusion 113h in the axis intersecting with the width axis to form a space opened upward. Thus, the fingers 41 are hooked on the hook protrusions 113g without being obstructed by the contact protrusions 113h.

Figure 28:
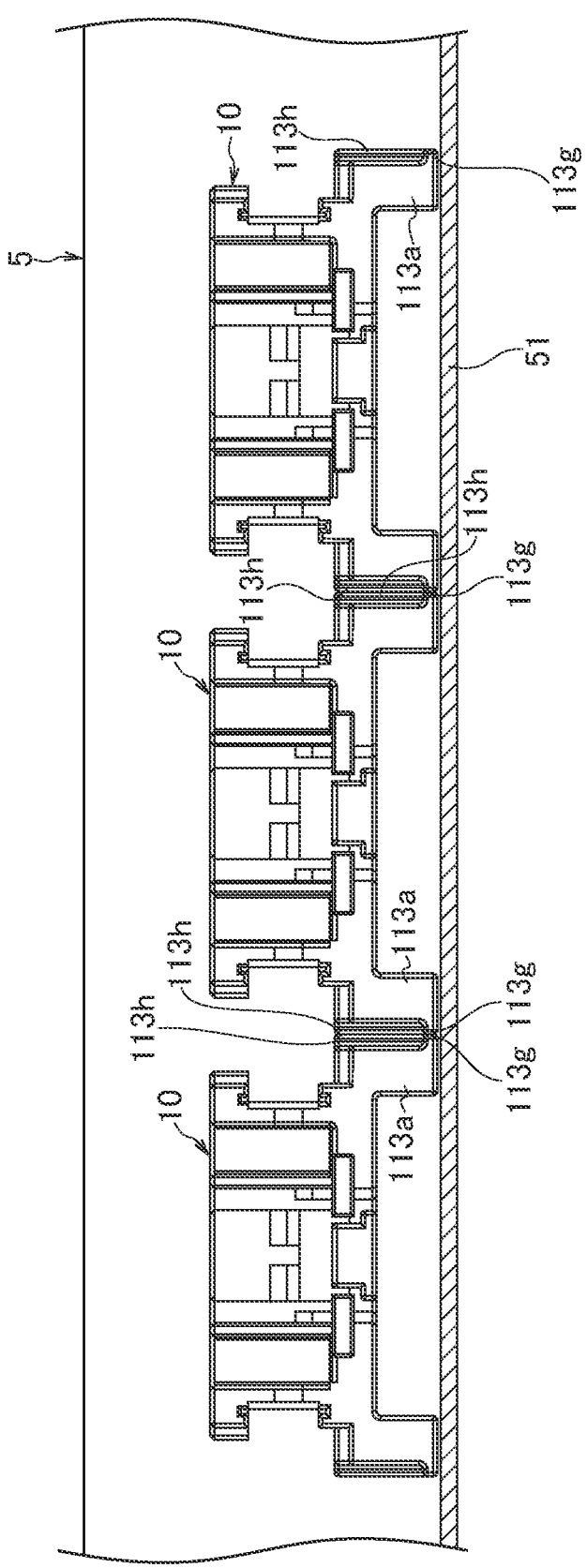
FIG. 28 is a diagram schematically showing a state where the plug housing shown as an example is being conveyed on a parts feeder.

Providing the hook protrusions 113g and the contact protrusions 113h enables the plug housings 10 adjacent to each other to be brought in contact with each other between the center of gravity of each plug housing 10 and the hook protrusions 113g. As a result, the plug housings 10 adjacent to each other are brought in contact with each other in a relatively stable state, which prevents the plug housings 10 from tilting from the certain posture (see FIG. 28).

Also, the front wall 114 has through-holes 114a formed therein, which communicate with the plurality of spaces partitioned by the partition wall 115 and the upper and lower partition walls 116 and 117. Thus, in this embodiment, the plurality of spaces penetrating in the front-rear axis are formed in the housing main body 11. Then, the plug terminals (lower plug terminals 13 and upper plug terminals 14) are press-fitted (inserted) into the spaces penetrating in the front-rear axis.

In this embodiment, a plurality of spaces arranged in the width axis (Y axis) are formed in two stages in the top-bottom axis (Z axis) in the housing main body 11. These plurality of spaces are formed in a staggered pattern when viewed from the rear side in the front-rear axis of the housing main body 11. Accordingly, the plug connector 1 is reduced in size in the width axis.

To be more specific, on the lower side (mounting surface 1aA side) of the housing main body 11, a plurality of spaces defined by the bottom wall 112, the partition wall 115, and the lower partition walls 117 are arranged in the width axis (Y axis). These spaces formed on the lower side (mounting surface 1aA side) of the housing main body 11 serve as lower spaces S1 into which lower plug terminals 13 are press-fitted (inserted).

On the other hand, on the upper side (position further away from the mounting surface 1aA than the lower spaces S1) of the housing main body 11, a plurality of spaces defined by the top wall 111, the partition wall 115, and the upper partition walls 116 are arranged in the width axis (Y axis). These spaces formed on the upper side of the housing main body 11 serve as upper spaces S2 into which upper plug terminals 14 are press-fitted (inserted).

In this embodiment, in a lower part of the housing main body 11, 10 spaces (lower spaces S1) are arranged in the width axis. Also, in an upper part of the housing main body 11, 10 spaces (upper spaces S2) are arranged. These 10 spaces (upper spaces S2) formed in the upper part of the housing main body 11 are arranged in the width axis without the lock part 12 being interposed. Accordingly, the housing main body 11 is reduced in size in the width axis.

Furthermore, in this embodiment, the upper partition walls 116 and the lower partition walls 117 are formed at positions shifted from each other in the width axis. More specifically, the lower spaces S1 and the upper spaces S2 are formed so as to partially overlap with each other in the plan view. In other words, the lower spaces S1 and the upper spaces S2 overlap with each other, when the plug housing 10 is viewed along an axis (top-bottom axis) normal to the mounting surface 1aA, in a state where the plug terminals (lower plug terminals 13 and upper plug terminals 14) are held by the plug housing 10 and also mounted on the cable 1A.

The lower plug terminals 13 are each configured to be press-fitted (inserted) forward from an opening at the rear end side of the lower space S1. This opening at the rear end side of the lower space S1 serves as an insertion opening S1a. Also, an opening at the front end side of the lower space S1 is formed to be smaller than the insertion opening S1a so as to prevent the lower plug terminal 13 from falling off. More specifically, forward movement of the lower plug terminal 13 press-fitted (inserted) from the insertion opening S1a is restricted by the front wall 114. Note that the opening at the front end side of the lower space S1 serves as an introduction port S1b for introducing a contact portion 230a of the lower receptacle terminal 23 of the receptacle connector 2 to be described later into the lower space S1. This introduction port S1b has its peripheral portion formed into a tapered shape so as to facilitate introduction of the contact portion 230a of the lower receptacle terminal 23.

Likewise, the upper plug terminals 14 are each configured to be press-fitted (inserted) forward from an opening at the rear end side of the upper space S2. This opening at the rear end side of the upper space S2 serves as an insertion opening S2a. Also, an opening at the front end side of the upper space S2 is formed to be smaller than the insertion opening S2a so as to prevent the upper plug terminal 14 from falling off. More specifically, forward movement of the upper plug terminal 14 press-fitted (inserted) from the insertion opening S2a is restricted by the front wall 114. Note that the opening at the front end side of the upper space S2 serves as an introduction port S2b for introducing a contact portion 240a of the upper receptacle terminal 24 of the receptacle connector 2 to be described later into the upper space S2. This introduction port S2b has its peripheral portion formed into a tapered shape so as to facilitate introduction of the contact portion 240a of the upper receptacle terminal 24.

Moreover, in the lower part of the top wall 111, grooves 111c opened rearward and downward are formed to communicate with the upper space S2. These grooves 111c guide press-fitting (insertion) of the upper plug terminals 14 into the upper space S2 by insertion of upper ends of side walls 144 of the upper plug terminals 14 to be described later into the grooves 111c.

In this embodiment, the grooves 111c are formed on either side, in the width axis, of the upper space S2 so as to extend from the insertion openings S2a to the front wall 114.

More specifically, the grooves 111c are formed such that the length in the insertion direction (X axis) is not less than a distance the upper plug terminals 14 move during the period from the start of insertion of upper ends of side walls 144 into the grooves 111c through until the insertion is completed. Therefore, a portion of the upper end of the side wall 144 first inserted into the groove 111c stays inside the groove 111c during the period from the start of the insertion into the groove 111c through until the press-fitting (insertion) of the upper plug terminal 14 into the upper space S2 is completed.

Note that the grooves 111c are formed to have a groove width (length in the Y axis) slightly larger than the thickness of the side wall 144.

Likewise, in the lower part of the partition wall 115, grooves 115a opened rearward and downward are formed to communicate with the lower space S1. These grooves 115a guide press-fitting (insertion) of the lower plug terminals 13 into the lower space S1 by insertion of the upper ends of the side walls 134 of the lower plug terminals 13 to be described later into the grooves 115a.

In this embodiment, the grooves 115a are also formed on either side, in the width axis, of the lower space S1 so as to extend from the insertion openings S1a to the front wall 114.

More specifically, the grooves 115a are formed such that the length in the insertion direction (X axis) is not less than a distance the lower plug terminals 13 move between the start of the insertion of the upper ends of the side walls 134 into the grooves 115a and the end of the insertion. Therefore, a portion of the upper end of the side wall 134 first inserted into the groove 115a stays inside the groove 115a until the press-fitting (insertion) of the lower plug terminal 13 into the lower space S1 is completed after the start of the insertion thereof into the groove 115a.

Note that the grooves 115a are formed to have a groove width (length in the Y axis) slightly larger than the thickness of the side wall 134.

Furthermore, in this embodiment, a groove 115b extending in the top-bottom axis and having both ends opened into the lower and upper spaces S1 and S2, respectively, is formed at the rear end of the partition wall 115. To be more specific, the groove 115b is formed so as to face, in the top-bottom axis, one of the two grooves 111c (the one on the right side in FIG. 12(b)) formed so as to communicate with one of the upper spaces S2.

More specifically, as shown in FIG. 12(b), the groove 115b is aligned in the top-bottom axis with one of the grooves 111c (the one on the right side in FIG. 12(b)) when the housing 10 is viewed from the rear side in the front-rear axis. A leg part 141 of the press-fitted (inserted) upper plug terminal 14 has its upper part inserted into this groove 115b.

Moreover, a groove 112f extending in the top-bottom axis and having its upper end opened into the lower space S1 is formed at the rear end of the bottom wall 112. To be more specific, the groove 112f, one of the grooves 111c (the one on the right side in FIG. 12(b)), and the groove 115b are arranged so as to be aligned in the top-bottom axis with each other when the housing 10 is viewed from the rear side in the front-rear axis. The leg part 141 of the press-fitted (inserted) upper plug terminal 14 has its lower part inserted into this groove 112f.

Furthermore, a groove 112g extending in the top-bottom axis and having both ends opened into the lower space S1 and below the housing 10, respectively, is formed at the rear end of the bottom wall 112. To be more specific, the groove 112g is formed so as to face, in the top-bottom axis, one of the two grooves 115a (the one on the right side in FIG. 12(b)) formed so as to communicate with one of the lower spaces S1.

More specifically, as shown in FIG. 12(b), the groove 112g is aligned in the top-bottom axis with one of the grooves 115a (the one on the right side in FIG. 12(b)) when the housing 10 is viewed from the rear side in the front-rear axis. A leg part 131 of the press-fitted (inserted) lower plug terminal 13 is inserted into this groove 112g.

Moreover, a recess part 112e that is opened downward and rearward and extends in the front-rear axis is formed at the rear end part of the bottom wall 112. In this recess part 112e, a mounting piece 132 of the press-fitted (inserted) lower plug terminal 13 is received.

Furthermore, extension parts 113a, 113a extending rearward are formed on the pair of side walls 113, 113, respectively. A region where the extension parts 113a, 113a face each other serves as a recess part 113b that houses mounting pieces 132 and 142 of the plug terminals 13 and 14.

As described above, in this embodiment, the mounting pieces 132 and 142 of the plug terminals 13 and 14 are mounted on the conductor part 151bA of the cable 1A at the position closer to the front than the rear ends of the extension parts 113a, 113a. In this event, the connection region 11A of the cable 1A is sandwiched between the extension parts 113a, 113a and the reinforcing plate 14A.

In this way, when the cable 1A is fanned to move away from the reinforcing plate 14A, the cable 1A and the reinforcing plate 14A can be more surely suppressed from coming off each other. Furthermore, since the mounting pieces 132 and 142 of the plug terminals 13 and 14 are positioned closer to the front than the tips (rear ends) of the extension parts 113a, 113a, the leg parts 131 and 141 of the plug terminals 13 and 14 as well as the mounting pieces 132 and 142 can be prevented from being deformed by fanning of the cable 1A. More specifically, the mounting parts between the cable 1A and the plug terminals 13 and 14 can be protected from fanning of the cable 1A.

Moreover, at the front ends of the pair of side walls 113, 113, holding bracket attachments 113c, 113c are formed, respectively, to hold the holding brackets 15.

In this embodiment, the holding bracket attachment 113c includes: a recess part 113d opened outward in the top-bottom axis and in the width axis; and slits 113e, 113e provided continuously inward, in the width axis, of the recess part 113d, into which both ends, in the front-rear axis, of a main body part 151 of the holding bracket 15 is inserted. In a state where the holding brackets 15 are held by the plug housing 10, fixing pieces 152 provided continuously from lower ends of the main body parts 151 are fixed to the fixing parts 15cA of the cable 1A, thereby fixing the plug housing 10 to the cable 1A.

Moreover, at the lower side (rear surface side) of the bottom wall 112, a protrusion 112a extending in the width axis is formed so as to protrude downward. By forming such a protrusion 112a in the bottom wall 112, a recess part 112d is formed in the lower surface of the bottom wall 112. When the plug connector 1 is mounted on the cable 1A, the connection region 11A having the reinforcing plate 14A attached thereto is housed in the recess part 112d (see FIG. 9(b)). As described above, in this embodiment, the connection region 11A to which the reinforcing plate 14A is attached serves as a for-connection portion 10A which is housed and held in the recess part 112d. The protrusions 112a are formed on the bottom wall 112 such that the amount of protrusion is larger than or equal to the thickness of the for-connection portion 10A (the sum of the thicknesses of the cable 1A and the reinforcing plate 14A).

As described above, in this embodiment, the plug housing 10 includes a pair of walls (top wall 111 and bottom wall 112) facing each other in the housing thickness axis (top-bottom axis: Z axis). Then, the recess part 112d which houses the for-connection portion 10A (the connection region 11A to which the reinforcing plate 14A is attached) of the cable 1A is formed on the bottom wall 112 which is the wall on one side of the pair of walls (top wall 111 and bottom wall 112). More specifically, the plug housing 10 has a receiving part (recess part 112d) to receive the cable (mounting member) 1A in the wall (bottom wall 112) on one side in the housing thickness axis (top-bottom axis).

With this configuration, when the plug housing 10 is being fitted into the receptacle housing 20, the lower ends of the protrusions 112a slide on an inner surface of the receptacle housing 20. Specifically, this configuration prevents the for-connection portion 10A of the cable 1A from interfering with the receptacle housing 20 when the plug housing 10 is being fitted into the receptacle housing 20.

Here, in this embodiment, the protrusions 112a are formed only at peripheral edge portions of the bottom wall 112 but not formed in the inner area of the bottom wall 112.

In this embodiment, the protrusions 112a are composed of only a pair of front protrusions 112b formed elongate in the width axis at the front ends of both sides in the width axis of the bottom wall 112 and a pair of rear protrusions 112c formed elongate in the front-rear axis at the rear ends of both sides in the width axis of the bottom wall 112.

These front protrusions 112b and the rear protrusions 112c are formed at portions connecting to the side walls 113 of the bottom wall 112. Specifically, the front protrusions 112b are formed in front of the holding bracket attachments 113c so as to extend along the front end edge of the plug housing 10, and the rear protrusions 112c are formed at outer portions in the width axis of the extension parts 113a so as to extend along the outer end edges of the extension parts 113a. As described above, in this embodiment, the protrusions 112a are formed at only the four corners of the bottom wall 112.

Further, in this embodiment, for the shape of the for-connection portion 10A of the cable 1A, part of the outline of the shape corresponds to the outline of the inner area surrounded by the protrusions 112a. Specifically, the for-connection portion 10A of the cable 1A is formed such that, in the state where it is housed in the recess part 112d, the front end edges of both sides in the width axis where the cut-in portions 11aA and 14aA are not formed extend along the outlines on the inner sides (rear sides) of the front protrusions 112b, and that the rear end portions on both sides in the width axis extend along the outlines of the inner sides in the width axis of the rear protrusions 112c. With this configuration, the front protrusions 112b prevent the positional deviation of the for-connection portion 10A to the front, and the rear protrusions 112c prevent the positional deviation of the for-connection portion 10A in the width axis. Note that the for-connection portion 10A may have any shape as long as it can be housed in the recess part 112d.

Then, in the case where the protrusions 112a are formed only at the four corners of the bottom wall 112 as in this embodiment, the protrusions 112a can be configured so as not to overlap with the mounting pieces 132 and 142 of the plug terminals 13 and 14 when the plug housing 10 holding the plug terminals 13 and 14 lined side-by-side in the width axis (Y axis: one axis) is viewed along the front-rear axis (X axis: intersecting axis).

In this embodiment, the distal ends of the mounting pieces 132 and 142 protrude on the side where the recess part 112d is provided (downward of the plug housing 10) in the state where the plug terminals 13 and 14 are held by the plug housing 10.

As described above, in this embodiment, when the plug housing 10 holding the plug terminals 13 and 14 is viewed along the front-rear axis (X axis: intersecting axis), the distal ends of the mounting pieces 132 and 142 of the plug terminals can be seen both from the front side and from the rear side. Note that the distal ends of the mounting pieces 132 and 142 of the plug terminals are apart from one another in the width axis and protrude downward of the plug housing 10 when viewed in the front-rear axis.

Further, in this embodiment, the mounting pieces 132 and 142 are formed in thin plate shapes as described later, and the plate thickness axis of the mounting pieces 132 and 142 approximately agrees with the width axis (Y axis) in the state where the plug terminals 13 and 14 are held by the plug housing 10. In other words, the plurality of plug terminals 13 and 14 are held by the plug housing 10 to be lined side-by-side along the plate thickness axis of the mounting pieces 132 and 142.

The plug terminals 13 and 14 have main body parts (the main body parts 130 and the main body parts 140) which are inserted into and held by the plug housing 10, and in this embodiment, the insertion direction of the main body parts 130 and 140 approximately agrees with the front-rear axis (X axis). In other words, the intersecting axis, in which the protrusions 112a do not overlap with the mounting pieces 132 and 142 of the plug terminals 13 and 14, agrees with the insertion direction in which the main body parts 130 and 140 are inserted into the plug housing 10.

As described above, in this embodiment, all the mounting pieces 132 and 142 of the plug terminals 13 and 14 which are apart from one another in the width axis and protrude downward of the plug housing 10 do not overlap with the protrusions 112a when viewed along the insertion direction of the main body parts 130 and 140 into the plug housing 10.

Figure 13:
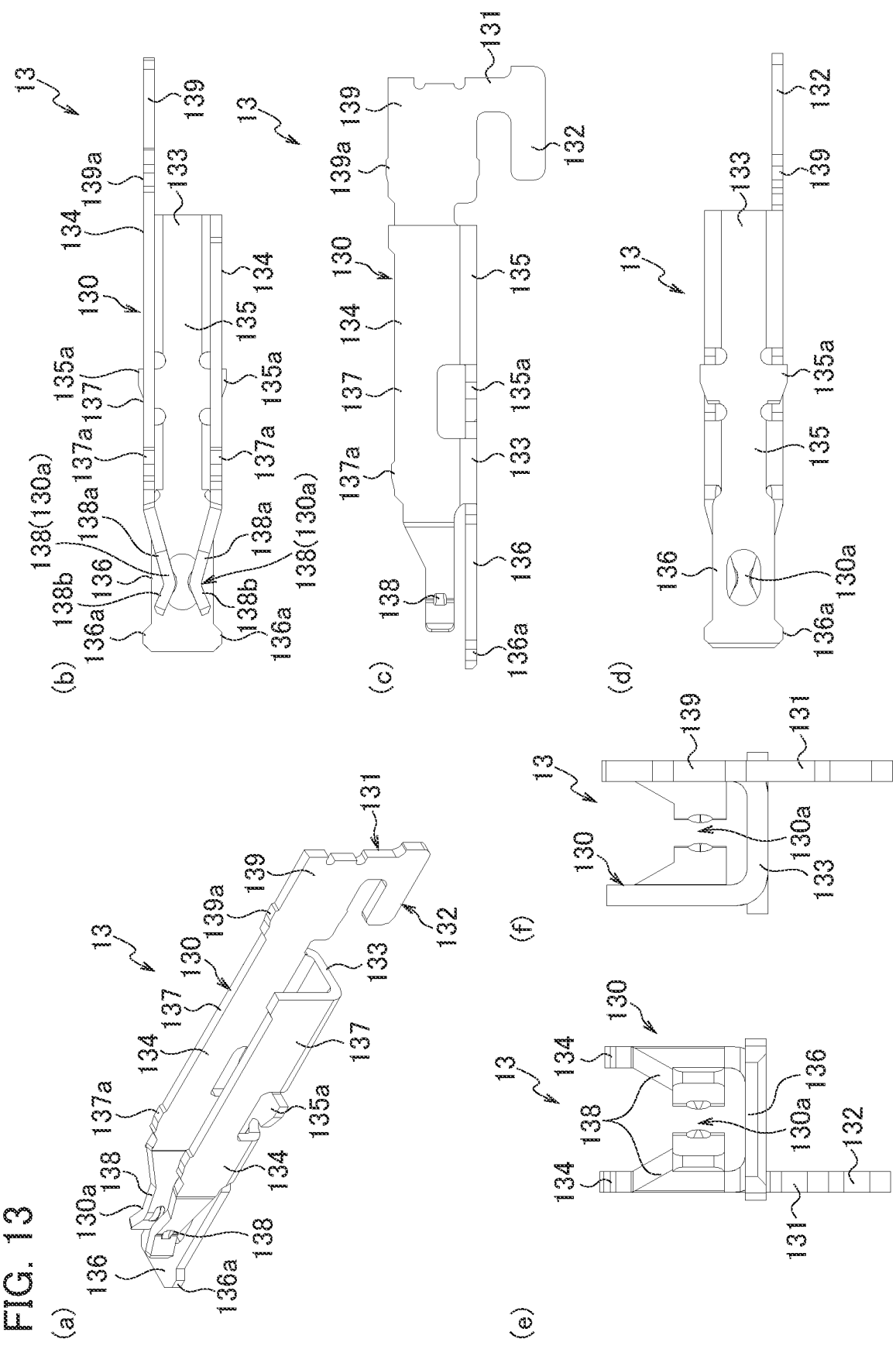
FIG. 13 is a diagram showing the lower plug terminal included in the plug connector shown as an example.

Next, with reference to FIGS. 13 and 14, description is given of a specific configuration of the plug terminals (terminals).

In this embodiment, the plug terminals (terminals) each include: a main body part to be inserted into a space formed in the plug housing 10; a leg part extending from the main body part toward the mounting surface 1aA of the cable 1A in a state where the plug terminals (terminals) are mounted on the cable 1A; and a mounting part provided continuously from the leg part and to be mounted on the cable 1A.

To be more specific, the plug terminals include the lower plug terminal 13 to be press-fitted (inserted) into the lower space S1 formed on the lower side (mounting surface 1aA side) of the housing main body 11. The plug terminals further include the upper plug terminal 14 to be press-fitted (inserted) into the upper space S2 formed on the upper side (position further away from the mounting surface 1aA than the lower space S1) of the housing main body 11.

In this embodiment, the lower plug terminal 13 is conductive, and a plurality of the lower plug terminals 13 are arranged in the width axis (Y axis) of the plug housing 10. As shown in FIG. 13, the lower plug terminal 13 has a shape formed by bending a strip-shaped metal member in a strip thickness axis, and has an approximately U-shape when viewed along the insertion direction (front-rear axis; X axis) (see FIGS. 13(e) and 13(f)). The lower plug terminal 13 as above can be formed, for example, by punching out a strip-shaped metal member having a specified shape and bending it.

The lower plug terminal 13 also includes a main body part 130 to be press-fitted (inserted) into the lower space S1. The lower plug terminal 13 further includes: a leg part 131 extending from the main body part 130 toward the mounting surface 1aA in a state where the lower plug terminal 13 is mounted on the cable 1A; and a mounting piece (mounting part) 132 connected to the leg part 131 and to be mounted on the cable 1A.

The main body part 130 includes a bottom wall 133 and a side wall 134 connected to both ends, in the width axis (Y axis) of the bottom wall 133.

The bottom wall 133 includes: a bottom wall main body 135 provided continuously from the lower end of the side wall 134; and a contact protection part 136 that is provided continuously from the front end of the bottom wall main body 135 and protrudes forward. This contact protection part 136 prevents a contact part 130a of the lower plug terminal 13 from coming into contact with the housing main body 11 when the main body part 130 is press-fitted (inserted) into the lower space S1.

The bottom wall main body 135 and the contact protection part 136 have restricting pieces 135a and 136a formed therein, respectively, which protrude outward from both ends in the width axis (Y axis). These restricting pieces 135a and 136a prevent the main body part 130 from being obliquely press-fitted (inserted) when the main body part 130 is press-fitted (inserted) into the lower space S1.

The side wall 134 includes: a side wall main body 137 having its lower end provided continuously from the bottom wall main body 135; and an elastically deformable contact piece 138 that is provided continuously from the front end of the side wall main body 137 and comes into contact with the contact part of the receptacle connector.

The side wall main body 137 has a restricting protrusion 137a formed at its upper end. This restricting protrusion 137a prevents the main body part 130 from being lifted when press-fitted (inserted) into the lower space S1.

The contact piece 138 includes: an inner bent piece 138a provided continuously from the front end of the side wall main body 137 so as to be bent inward in the width axis; and an outer bent piece 138b provided continuously from the front end of the inner bent piece 138a so as to be bent outward in the width axis.

In this embodiment, the contact pieces 138 are provided continuously from the pair of side wall main bodies 137, 137, respectively, and are formed to be approximately line-symmetric in the plan view. More specifically, the pair of contact pieces 138, 138 include: the inner bent pieces 138a, 138a bent in a direction of getting close to each other toward the front; and the outer bent pieces 138b, 138b bent in a direction of getting away from each other toward the front.

The contact part 230a of the receptacle connector 2 is sandwiched in a spot (connection between the inner bent piece 138a and the outer bent piece 138b) where the pair of contact pieces 138, 138 come closest to each other (see FIG. 3(b)). Thus, in this embodiment, the pair of contact pieces 138, 138 function as the contact part 130a of the lower plug terminal 13. Also, the pair of outer bent pieces 138b function as a guide part for more smoothly guiding the contact part 230a of the receptacle connector 2.

Furthermore, in this embodiment, an extension wall 139 protruding rearward is provided continuously from the rear end of one of the pair of side wall main bodies 137, 137, and the main body part 130 has a shape having its one side protruding rearward.

This extension wall 139 has a press-fit protrusion 139a formed at its upper end. The main body part 130 is press-fitted into the lower space S1 by sticking the press-fit protrusion 139a into the housing main body 11.

Note that, in this embodiment, the grooves 115a are formed to guide the press-fitting (insertion) of the lower plug terminal 13 into the lower space S1 while the upper ends of the side walls 134 of the lower plug terminal 13 are inserted into the grooves. Therefore, a positional shift in the lower plug terminal 13 is suppressed even when the lower plug terminal 13 is press-fitted (inserted) into the lower space S1 by pressing one side wall 134 protruding rearward of the main body part 130. As a result, the lower plug terminal 13 can be press-fitted (inserted) more smoothly and more accurately into the lower space S1.

The leg part 131 is provided extending downward (toward the cable 1A: mounting member) from the rear end of the extension wall 139. Thus, in this embodiment, the leg part 131 is provided extending in the housing thickness axis from the main body part 130 that is press-fitted (inserted) into the lower space S1. Moreover, the mounting piece 132 is provided continuously from the lower end of the leg part 131 so as to protrude forward.

In this event, the leg part 131 and the mounting piece 132 are each formed into a thin plate shape (plate shape) such that its plate thickness axis is approximately the same as the thickness axis of the side wall main body 137.

Therefore, in a state where the main body part 130 is inserted into the lower space S1 and also the mounting piece (mounting part) 132 is mounted on the cable (mounting member) 1A, the thickness axis of the leg part 131 is the width axis (Y axis). More specifically, in a state where the plug connector 1 is mounted on the cable 1A, the thickness axis of the leg part 131 is the axis intersecting with the insertion direction of the main body part 130 into the lower space S1 and with the axis normal to the mounting surface 1aA.

Meanwhile, the upper plug terminal 14 is also conductive, and a plurality of the upper plug terminals 14 are arranged in the width axis (Y axis) of the plug housing 10. As shown in FIG. 14, the upper plug terminal 14 has a shape formed by bending a strip-shaped metal member in a strip thickness axis, and has an approximately U-shape when viewed along the insertion direction (front-rear axis; X axis) (see FIGS. 14(e) and 14(f)). Such an upper plug terminal 14 can also be formed, for example, by bending a strip-shaped metal member.

The upper plug terminal 14 also includes a main body part 140 to be press-fitted (inserted) into the upper space S2. The upper plug terminal 14 further includes: a leg part 141 extending from the main body part 140 toward the mounting surface 1aA in a state where the upper plug terminal 14 is mounted on the cable 1A; and a mounting piece (mounting part) 142 provided continuously from the leg part 141 and to be mounted on the cable 1A.

The main body part 140 includes a bottom wall 143 and a side wall 144 provided continuously from both ends, in the width axis (Y axis) of the bottom wall 143.

The bottom wall 143 includes: a bottom wall main body 145 provided continuously to the lower end of the side wall 144; and a contact protection part 146 that is provided continuously from the front end of the bottom wall main body 145 and protrudes forward. This contact protection part 146 prevents a contact part 140a of the upper plug terminal 14 from coming into contact with the housing main body 11 when the main body part 140 is press-fitted (inserted) into the upper space S2.

The bottom wall main body 145 and the contact protection part 146 have restricting pieces 145a and 146a formed therein, respectively, which protrude outward from both ends in the width axis (Y axis). These restricting pieces 145a and 146a prevent the main body part 140 from being obliquely press-fitted (inserted) when the second main body part 140 is press-fitted (inserted) into the upper space S2.

The side wall 144 includes: a side wall main body 147 having its lower end connected to the bottom wall main body 145; and an elastically deformable contact piece 148 that is provided continuously from the front end of the side wall main body 147 and comes into contact with the contact part 240a of the receptacle connector 2.

The side wall main body 147 has a restricting protrusion 147a formed at its upper end. This restricting protrusion 147a prevents the main body part 140 from being lifted when press-fitted (inserted) into the upper space S2.

The contact piece 148 includes: an inner bent piece 148a provided continuously from the front end of the side wall main body 147 so as to be bent inward in the width axis; and an outer bent piece 148b provided continuously from the front end of the inner bent piece 148a so as to be bent outward in the width axis.

In this embodiment, the contact pieces 148 are continuous from the pair of side wall main bodies 147, 147, respectively, and are formed to be approximately line-symmetric in the plan view. More specifically, the pair of contact pieces 148, 148 include: the inner bent pieces 148a, 148a bent in a direction of getting close to each other toward the front; and the outer bent pieces 148b, 148b bent in a direction of getting away from each other toward the front.

The contact part 240a of the receptacle connector 2 is sandwiched in a spot (connection between the inner bent piece 148a and the outer bent piece 148b) where the pair of contact pieces 148, 148 come closest to each other (see FIG. 4(b)). Thus, in this embodiment, the pair of contact pieces 148, 148 function as the contact part 140a of the upper plug terminal 14. Also, the pair of outer bent pieces 148b function as a guide part for more smoothly guiding the contact part 240a of the receptacle connector 2.

Furthermore, in this embodiment, an extension wall 149 protruding rearward is provided continuously from the rear end of one of the pair of side wall main bodies 147, 147, and the main body part 140 has a shape having its one side protruding rearward.

This extension wall 149 has a press-fit protrusion 149a formed at its upper end. The main body part 140 is press-fitted into the upper space S2 by sticking the press-fit protrusion 149a into the housing main body 11.

Note that, in this embodiment, the grooves 111c are formed to guide the press-fitting (insertion) of the upper plug terminal 14 into the upper space S2 while the upper ends of the side walls 144 of the upper plug terminal 14 are inserted into the grooves. Therefore, a positional shift in the upper plug terminal 14 is suppressed even when the upper plug terminal 14 is press-fitted (inserted) into the upper space S2 by pressing one side wall 144 protruding rearward of the main body part 140. As a result, the upper plug terminal 14 can be press-fitted (inserted) more smoothly and more accurately into the upper space S2.

The leg part 141 is provided extending downward (toward the cable 1A: mounting member) from the rear end of the extension wall 149. The leg part 141 has its length, in the top-bottom axis, longer than the leg part 131. Thus, in this embodiment, the leg part 141 is provided extending in the housing thickness axis from the main body part 140 that is press-fitted (inserted) into the upper space S2. Moreover, the mounting piece 142 is provided continuously from the lower end of the leg part 141 so as to protrude rearward.

As described above, in this embodiment, the mounting piece (mounting part) 132 is provided continuously from the leg part 131 so as to protrude forward (toward one side) in the front-rear axis (X axis: insertion direction into the space of the main body part). Also, the mounting piece (mounting part) 142 is provided continuously from the leg part 141 so as to protrude rearward (toward the other side) in the front-rear axis (X axis: insertion direction into the space of the main body part).

The leg part 131 and the leg part 141 are located at approximately the same position in the front-rear axis in a state where the main body part 130 and the main body part 140 are inserted into the lower space S1 and the upper space S2 (see FIGS. 5 to 7). At the same time, the leg part 131 and the leg part 141 are located at positions shifted by approximately a half pitch in the width axis in the state where the main body part 130 and the main body part 140 are inserted into the lower space S1 and the upper space S2.

Therefore, in this embodiment, the mounting parts (mounting pieces 132 and mounting pieces 142) are arranged in a staggered pattern in a state where the plurality of plug terminals 13 and 14 are held by the plug housing 10.

Furthermore, the mounting piece 132 is housed in the recess part 112e formed at the rear end of the bottom wall 112 in the state where the main body part 130 is inserted into the lower space S1. Meanwhile, the mounting piece 142 is positioned behind the insertion opening S1a of the upper space S2 in the state where the main body part 140 is inserted into the upper space S2.

Therefore, the mounting piece 132 overlaps with the plug housing 10 in the plan view in a state where the plurality of plug terminals 13 and 14 are held by the plug housing 10 and also mounted on the cable 1A. At the same time, the mounting piece 142 is exposed from the plug housing 10 in the plan view in a state where the plurality of plug terminals 13 and 14 are held by the plug housing 10 and also mounted on the cable 1A.

More specifically, either one of the mounting pieces (mounting parts) 132 and the mounting pieces (mounting parts) 142 overlaps with the plug housing 10 when the plug housing 10 is viewed along the axis normal to the mounting surface 1aA in a state where the plug connector 1 is mounted on the cable 1A.

Thus, in this embodiment, the mounting parts (mounting pieces 132 and mounting pieces 142) are arranged in a staggered pattern on either side of the insertion opening (rear end) of the space in the state where the plurality of plug terminals 13 and 14 are held by the plug housing 10.

Moreover, the leg part 141 and the mounting piece 142 are also each formed into a thin plate shape (plate shape) such that its plate thickness axis is approximately the same as the thickness axis of the side wall main body 147.

Therefore, in a state where the main body part 140 is inserted into the upper space S2 and also the mounting piece (mounting part) 142 is mounted on the cable (mounting member) 1A, the thickness axis of the leg part 141 is the width axis (Y axis). More specifically, in a state where the plug connector 1 is mounted on the cable 1A, the thickness axis of the leg part 141 is the axis intersecting with the insertion direction of the main body part 140 into the upper space S2 and with the axis normal to the mounting surface 1aA.

Moreover, in this embodiment, the insertion opening S1a is divided into two regions by the leg part 141 when viewed from the rear side in the front-rear axis in a state where the main body parts 130 and 140 of the plug terminals 13 and 14 are inserted into the spaces S1 and S2. More specifically, the insertion opening S1a of the lower space S1 is divided into the two regions by the leg part 141 when the plug housing is viewed along the insertion direction of the main body parts 130 and 140 into the spaces S1 and S2 in a state where the plug connector 1 is mounted on the cable 1A.

Furthermore, in this embodiment, at the position where the press-fitting (insertion) of the main body part 130 into the lower space S1 is completed, the leg part 131 is held in a state of being inserted into the groove 112g and having its movement restricted in the width axis (Y axis; thickness axis). More specifically, the groove 112g formed in the bottom wall 112 of the housing main body 11 functions as a leg part holder to hold the leg part 131. Thus, the plug connector 1 includes the leg part holder connected to the plug housing 10 to hold the leg part 131. In this embodiment, the leg part holder is formed integrally with the plug housing 10. Note that the leg part holder may be formed by connecting a separate member from the plug housing 10 to the plug housing 10.

Moreover, at the position where the press-fitting (insertion) of the main body part 140 into the upper space S2 is completed, the leg part 141 is held in a state of being inserted into the grooves 115b and 112f and having its movement restricted in the width axis (Y axis; thickness axis). More specifically, the groove 115b formed in the partition wall 115 of the housing main body 11 and the groove 112f formed in the bottom wall 112 thereof function as a leg part holder to hold the leg part 141. Thus, the plug connector 1 includes the leg part holder connected to the plug housing 10 to hold the leg part 141. The leg part holder is also formed integrally with the plug housing 10 in this embodiment, but may be formed as a separate member.

In this way, the leg parts 131 and 141 are prevented from being deformed when the plug terminals 13 and 14 are press-fitted (inserted) into the spaces S1 and S2 of the main body parts 130 and 140, when the plug terminals 13 and 14 press-fitted (inserted) into the spaces S1 and S2 are mounted on the cable 1A, or the like.

[Configuration Example of Receptacle Connector 2]

Next, with reference to FIGS. 15 to 20, description is given of a configuration example of the receptacle connector 2.

Figure 15:
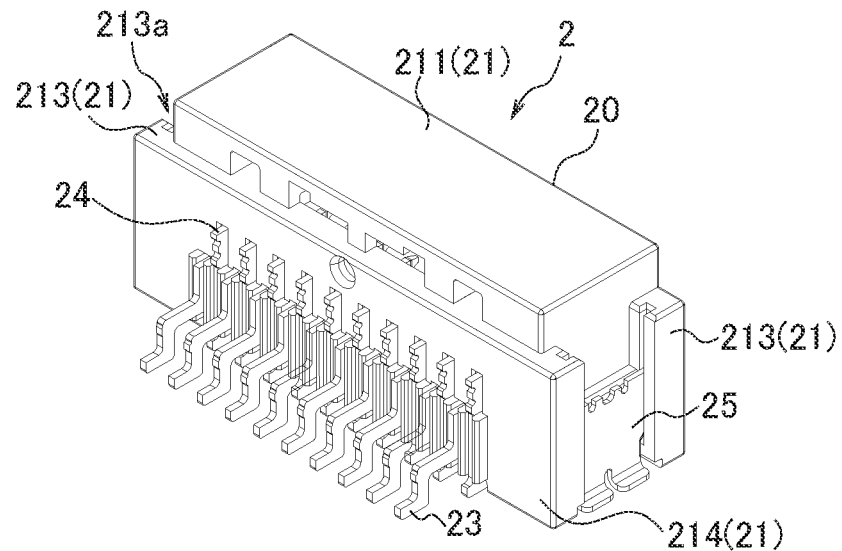
FIG. 15 is a perspective view showing a state before the receptacle connector included in the connector set shown as an example is mounted on the circuit board.
Figure 16:
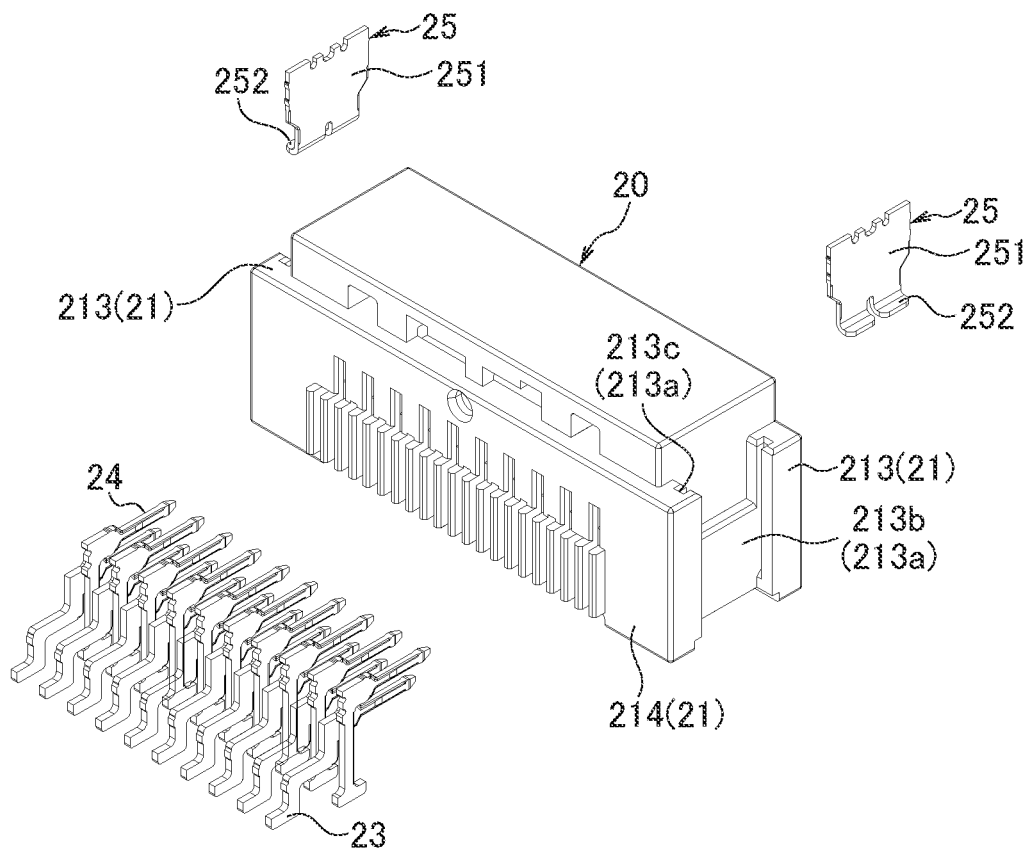
FIG. 16 is an exploded perspective view showing the receptacle connector included in the connector set shown as an example.

As shown in FIGS. 15 and 16, the receptacle connector 2 includes a receptacle housing (opponent housing: second housing) 20 and receptacle terminals (lower receptacle terminals 23 and upper receptacle terminals 24) held by the receptacle housing 20. The receptacle connector 2 also includes holding brackets (opponent holding brackets) 25 held by the receptacle housing 20.

The receptacle connector 2 is configured to be mounted on the circuit board 2A as the opponent mounting member by mounting the receptacle terminals (opponent terminals: second terminals) 23 and 24 held by the receptacle housing 20 on the conductor part 2bA of the circuit board 2A disposed outside the receptacle housing 20. Note that the receptacle terminals 23 and 24 are also mounted on the conductor part 2bA by soldering or the like. The holding brackets 25 are fixed to the fixing parts 2cA of the circuit board 2A by soldering or the like, in a state where the holding brackets 25 are held by the receptacle housing 20, to fix the receptacle housing 20 to the circuit board 2A.

Note that the circuit board 2A includes a board main body 2aA that has an approximately rectangular plate shape and is formed of a rigid and insulating resin material or the like (see FIGS. 23 to 26). The conductor part 2bA and the fixing parts 2cA are formed so as to be exposed to the surface 21aA of the board main body 2aA. Thus, in this embodiment, the surface 21aA of the board main body 2aA serves as a mounting surface.

The receptacle housing 20 includes a rigid housing main body 21, and can be formed, for example, using an insulating resin material.

The housing main body 21 also has a lock insertion part 22 formed on its upper side. The lock part 12 configured to hold the plug housing 10 and the receptacle housing 20 in their fitted state or to release the fitted state is inserted into this lock insertion part 22.

Thus, in this embodiment, the receptacle housing 20 includes the housing main body 21 and the lock insertion part 22 formed in the housing main body 21.

The housing main body 21 includes a top wall 211, a bottom wall 212, a pair of side walls 213 connecting both ends, in the width axis (Y axis), of the top wall 211 and the bottom wall 212, and a rear wall 214 provided continuously from rear ends of the top wall 211, the bottom wall 212, and the side walls 213, 213.

The lock insertion part 22 is formed in the middle, in the width axis, of the top wall 211. To be more specific, the lock insertion part 22 includes a housing part 221 that is formed inside an upward protruding region of the top wall 211, formed stepwise, and houses the lever part 121. In the middle, in the front-rear axis, of this housing part 221, an engagement recess part 221a is formed, which serves as an engaging part to engage with the engagement protrusion 121b of the lock part 12. In addition, on either side, in the width axis, of the housing part 221, guide protrusions 211d are formed, which are housed in the guide recess parts 11b.

In addition, on either side, in the width axis, of the housing part 221, insertion spaces S8 into which the upper arm parts 33 of the slide member 3 are inserted are formed. On the top wall 211, protrusions (locked part) 211c protruding downward are formed such that the protrusions (locked part) 211c are located in the insertion spaces S8 as viewed in an insertion direction (front-rear axis; X axis). These protrusions 211c are configured to deflect the upper arm parts 33 downward and to lock engagement protrusions 32b formed on the tip of the upper arm parts 33.

In addition, on the middle, in the width axis, of the bottom wall 212, a positioning protrusion 212b protruding upward is formed. The shape of this positioning protrusion 212b corresponds to the shape of the cut-in portion 11aA and the cut-in portion 14aA. When the plug housing 10 is fitted into the receptacle housing 20, the positioning protrusion 212b is inserted into the cut-in portion 11aA and the cut-in portion 14aA, so that the positioning protrusion 212b positions the cable 1A in the width axis.

Moreover, the rear wall 214 has a plurality of spaces formed therein, which penetrate in the front-rear axis. In this embodiment, a plurality of spaces arranged in the width axis (Y axis) are formed in two stages in the top-bottom axis (Z axis). These spaces are formed in a staggered pattern when viewed from the rear side in the front-rear axis of the housing main body 21. Accordingly, the receptacle connector 2 is reduced in size in the width axis.

Then, the lower receptacle terminals 23 and the upper receptacle terminals 24 are press-fitted (inserted) into the spaces penetrating in the front-rear axis, respectively.

To be more specific, the spaces formed on the lower side (mounting surface 21aA side) of the housing main body 21 serve as lower spaces S3 into which lower receptacle terminals 23 are press-fitted (inserted).

On the other hand, the spaces formed on the upper side (position further away from the mounting surface 21aA than the lower spaces S3) of the housing main body 21 serve as upper spaces S4 into which upper receptacle terminals 24 are press-fitted (inserted).

The lower receptacle terminals 23 are each configured to be press-fitted (inserted) forward from an opening at the rear end side of the lower space S3. This opening at the rear end side of the lower space S3 serves as an insertion opening S3a. Likewise, the upper receptacle terminals 24 are each configured to be press-fitted (inserted) forward from an opening at the rear end side of the upper space S4. This opening at the rear end side of the upper space S4 serves as an insertion opening S4a.

Moreover, the housing main body 21 has a fitting space S5 formed therein, which is opened forward (toward the plug connector 1 side). This fitting space S5 is a space into which the housing main body 11 of the plug housing 10 is inserted and fitted, and which is defined by the top wall 211, the bottom wall 212, the pair of side walls 213, 213, and the rear wall 214. Therefore, the lower space S3 and the upper space S4 are formed to communicate with the fitting space S5, respectively.

Furthermore, in this embodiment, a plurality of projections 214a extending in the top-bottom axis and protruding rearward are arranged in the width axis at the rear end of the rear wall 214. To be more specific, the projections 214a are formed between the lower and upper spaces S3 and S4 adjacent to each other in the width axis.

Moreover, a recess part 212a that is opened downward and rearward and extends in the front-rear axis is formed at the rear end of the bottom wall 212. This recess part 212a houses a mounting piece (opponent mounting part) 242 of the upper receptacle terminal 24 in the press-fitted (inserted) state.

Moreover, the pair of side walls 213, 213 have holding bracket attachments 213a, 213a formed thereon, respectively, to hold the holding brackets 25.

In this embodiment, the holding bracket attachment 213*a* includes: a recess part 213*b* opened outward in the top-bottom axis and in the width axis; and slits 213*c*, 213*c* provided continuously inward, in the width axis, of the recess part 213*b*, into which both ends, in the front-rear axis, of a main body part 251 of the holding bracket 25 is inserted. In a state where the holding brackets 25 are held by the receptacle housing 20, fixing pieces 252 provided continuously from lower ends of the main body parts 251 are fixed to the fixing parts 2*c*A of the circuit board 2A, thereby fixing the receptacle housing 20 to the circuit board 2A.

Moreover, in this embodiment, the receptacle terminals each include: a main body part to be inserted into a space formed in the receptacle housing 20; a leg part extending from the main body part toward the mounting surface 21*a*A of the circuit board 2A in a state where the receptacle terminals are mounted on the circuit board 2A; and a mounting part provided continuously from the leg part and to be mounted on the circuit board 2A.

To be more specific, the receptacle terminals include the lower receptacle terminal 23 to be press-fitted (inserted) into the lower space S3 formed on the lower side (mounting surface 21*a*A side) of the housing main body 21. The receptacle terminals further include the upper receptacle terminal 24 to be press-fitted (inserted) into the upper space S4 formed on the upper side (position further away from the mounting surface 21*a*A than the lower space S3) of the housing main body 21.

In this embodiment, the lower receptacle terminal 23 is conductive, and a plurality of the lower receptacle terminals 23 are arranged in the width axis (Y axis) of the receptacle housing 20. As shown in FIG. 19, the lower receptacle terminal 23 is formed into a thin plate shape, and is press-fitted (inserted) from the rear side into the lower space S3 formed in the housing main body 21 in a state where the plate thickness axis is approximately aligned with the width axis (Y axis). Such a lower receptacle terminal 23 can be formed, for example, by punching thin sheet metal.

The lower receptacle terminal 23 also includes a main body part (opponent main body part) 230 to be press-fitted (inserted) into the lower space S3. The lower receptacle terminal 23 further includes: a leg part (opponent leg part) 231 extending from the main body part 230 toward the mounting surface 21*a*A in a state where the lower receptacle terminal 23 is mounted on the circuit board (the mounting member) 2A; and a mounting piece (opponent mounting part) 232 provided continuously from the leg part 231 and to be mounted on the circuit board 2A.

At the front end of the main body part 230, an approximately rod-shaped contact part (opponent contact part) 230*a* is formed so as to protrude forward. Also, press-fit protrusions 230*b* are formed at the upper and lower ends of the main body part 230. The main body part 230 is press-fitted into the lower space S3 by sticking the press-fit protrusions 230*b* into the housing main body 21. In the state where the main body part 230 is press-fitted (inserted) into the lower space S3, the contact part 230*a* is disposed in the fitting space S5.

Moreover, in this embodiment, the leg part 231 is provided extending downward (toward the circuit board 2A: mounting member) from the rear end of the main body part 230. To be more specific, the leg part 231 is bent into a crank shape and has its lower end located behind the main body part 230. Thus, in this embodiment, the leg part 231 is provided extending in the housing thickness axis (top-bottom axis) from the main body part 230 press-fitted (inserted) into the lower space S3. The mounting piece 232 is provided continuously from the lower end of this leg part 231 so as to protrude rearward.

Meanwhile, the upper receptacle terminal 24 is also conductive, and a plurality of the upper receptacle terminals 24 are arranged in the width axis (Y axis) of the receptacle housing 20. As shown in FIG. 20, the upper receptacle terminal 24 is formed into a thin plate shape, and is press-fitted (inserted) from the rear side into the upper space S4 formed in the housing main body 21 in a state where the plate thickness axis is approximately aligned with the width axis (Y axis). Such an upper receptacle terminal 24 can also be formed, for example, by punching thin sheet metal.

The upper receptacle terminal 24 also includes a main body part (opponent main body part) 240 to be press-fitted (inserted) into the upper space S4. The upper receptacle terminal 24 further includes: a leg part (opponent leg part) 241 extending from the main body part 240 toward the mounting surface 21*a*A in a state where the upper receptacle terminal 24 is mounted on the circuit board 2A; and a mounting piece (opponent mounting part) 242 provided continuously from the leg part 241 and to be mounted on the circuit board 2A.

At the front end of the main body part 240, an approximately rod-shaped contact part (opponent contact part) 240*a* is formed so as to protrude forward. Also, press-fit protrusions 240*b* are formed at the upper and lower ends of the main body part 240. The main body part 240 is press-fitted into the upper space S4 by sticking the press-fit protrusions 240*b* into the housing main body 21. In the state where the main body part 240 is press-fitted (inserted) into the upper space S4, the contact part 240*a* is disposed in the fitting space S5.

Moreover, in this embodiment, the leg part 241 is provided approximately linearly extending downward (toward the circuit board 2A: mounting member) from the rear end of the main body part 240. Thus, in this embodiment, the leg part 241 is provided extending in the housing thickness axis (top-bottom axis) from the main body part 240 press-fitted (inserted) into the upper space S4. The leg part 241 has its length, in the top-bottom axis, longer than the leg part 231. The mounting piece 232 is provided continuously from the lower end of this leg part 241 so as to protrude forward.

Thus, in this embodiment, the mounting piece (mounting part) 242 is provided continuously from the leg part 241 so as to protrude forward (toward one side) in the front-rear axis (X axis: insertion direction into the space of the main body part). Also, the mounting piece 232 is provided continuously from the leg part 231 so as to protrude rearward (toward the other side) in the front-rear axis (X axis: insertion direction into the space of the main body part).

More specifically, the mounting parts (mounting pieces 232 and mounting pieces 242) are arranged in a staggered pattern in a state where the plurality of receptacle terminals are held by the receptacle housing 20.

Furthermore, the mounting piece 242 is housed in the recess part 212*a* formed at the rear end of the bottom wall 212 in the state where the main body part 240 is inserted into the upper space S4. Meanwhile, the mounting piece 232 is positioned behind the insertion opening S3*a* of the lower space S3 in the state where the main body part 230 is inserted into the lower space S3.

Therefore, the mounting piece 242 overlaps with the receptacle housing 20 in the plan view in a state where the plurality of receptacle terminals 23 and 24 are held by the receptacle housing 20 and also mounted on the circuit board 2A. At the same time, the mounting pieces 232 are exposed from the receptacle housing 20 in the plan view in a state where the plurality of receptacle terminals 23 and 24 are held by the receptacle housing 20 and also mounted on the circuit board 2A.

More specifically, either one of the mounting pieces (mounting parts) 232 and the mounting pieces (mounting parts) 242 overlaps with the receptacle housing 20 when the receptacle housing 20 is viewed along the axis normal to the mounting surface 21aA in a state where the receptacle connector 2 is mounted on the circuit board 2A.

Thus, in this embodiment, the mounting parts (mounting pieces 232 and 242) are arranged in a staggered pattern on either side of the insertion opening (rear end) of the space in the state where the plurality of receptacle terminals 23 and 24 are held by the receptacle housing 20.

Furthermore, in this embodiment, at the position where the press-fitting (insertion) of the main body part 230 into the lower space S3 is completed, the leg part 231 is held between the projections 214a in a state of having its movement restricted in the width axis (Y axis; thickness axis). More specifically, the projections 214a formed on the rear wall 214 of the housing main body 21 function as leg part holders to hold the leg part 231. Thus, the receptacle connector 2 includes the leg part holders connected to the receptacle housing 20 to hold the leg part 231. In this embodiment, the leg part holders are formed integrally with the receptacle housing 20. Note that the leg part holders may be formed by connecting separate members from the receptacle housing 20 to the receptacle housing 20.

Moreover, at the position where the press-fitting (insertion) of the main body part 240 into the upper space S4 is completed, the leg part 241 is held between the projections 214a in a state of having its movement restricted in the width axis (Y axis; thickness axis). More specifically, the projections 214a formed on the rear wall 214 of the housing main body 21 function as leg part holders to hold the leg part 241. Thus, the receptacle connector 2 includes the leg part holders connected to the receptacle housing 20 to hold the leg part 241. The leg part holders are also formed integrally with the receptacle housing 20 in this embodiment, but may be formed as separate members.

In this way, the leg parts 231 and 241 are prevented from being deformed when the receptacle terminals 23 and 24 are press-fitted (inserted) into the spaces S3 and S4 of the main body parts 230 and 240.

When the plug connector 1 described above is fitted into the receptacle connector 2 thus configured, the lock part 12 of the plug housing 10 is inserted into the lock insertion part 22 of the receptacle housing 20, and thus the housing main body 11 is inserted into the fitting space S5.

In this event, the engagement protrusion 121b of the lever part 121 is pushed downward by the top wall 211 of the receptacle housing 20. When the engagement protrusion 121b is pushed downward by the top wall 211 in this way, the rear end part (operation part 121a) of the lever part 121 is elastically deformed so as to move downward, and thus the engagement protrusion 121b can be moved into the inner side of the lock insertion part 22.

Then, when the engagement protrusion 121b is moved into the inner side of the lock insertion part 22, the downward pushing of the engagement protrusion 121b by the top wall 211 is released, and the elastic restoring force of the lever part 121 moves the engagement protrusion 121b upward. The engagement protrusion 121b is moved upward to be engaged with the engagement recess part 221a formed in the receptacle connector 2, thus allowing the plug connector 1 and the receptacle connector 2 to be locked in the fitted state.

During the course of fitting the plug connector 1 into the receptacle connector 2, the tip of the contact part 230a of the lower receptacle terminal 23 is introduced into the lower space S1 formed in the plug housing 10 from the introduction port S1b to come into contact with the contact part 130a of the first plug terminal 13. Note that, in this embodiment, the approximately rod-shaped contact part 230a is inserted between the pair of contact pieces 138, 138 and sandwiched by the pair of contact pieces 138, 138 to achieve conduction between the first plug terminal 13 and the lower receptacle terminal 23.

Likewise, the tip of the contact part 240a of the upper receptacle terminal 24 is introduced into the upper space S2 formed in the plug housing 10 from the introduction port S2b to come into contact with the contact part 140a of the upper plug terminal 14. Note that, in this embodiment, the approximately rod-shaped contact part 240a is inserted between the pair of contact pieces 148, 148 and sandwiched by the pair of contact pieces 148, 148 to achieve conduction between the upper plug terminal 14 and the upper receptacle terminal 24.

As described above, the plug connector 1 and the receptacle connector 2 are fitted together to achieve conduction between the plug terminals 13 and 14 and the receptacle terminals 23 and 24. Thus, the connector set C1 is formed to electrically connect the cable 1A to the circuit board 2A.

Meanwhile, in order to detach the plug connector 1 from the receptacle connector 2, the operation part 121a of the lever part 121 is first lowered to move the lever part 121 downward. Accordingly, the engagement protrusion 121b is also moved downward to release the engagement between the engagement protrusion 121b and the engagement recess part 221a. Then, by pulling the plug connector 1 in a removal direction from the receptacle connector 2 in the state where the engagement between the engagement protrusion 121b and the engagement recess part 221a is released, the plug connector 1 is moved in the removal direction relative to the receptacle connector 2. When the plug connector 1 is thus moved in the removal direction relative to the receptacle connector 2, the conduction between the terminals is first released, and then the fitting between the housings is released. Thus, the plug connector 1 is detached from the receptacle connector 2.

Figure 29:
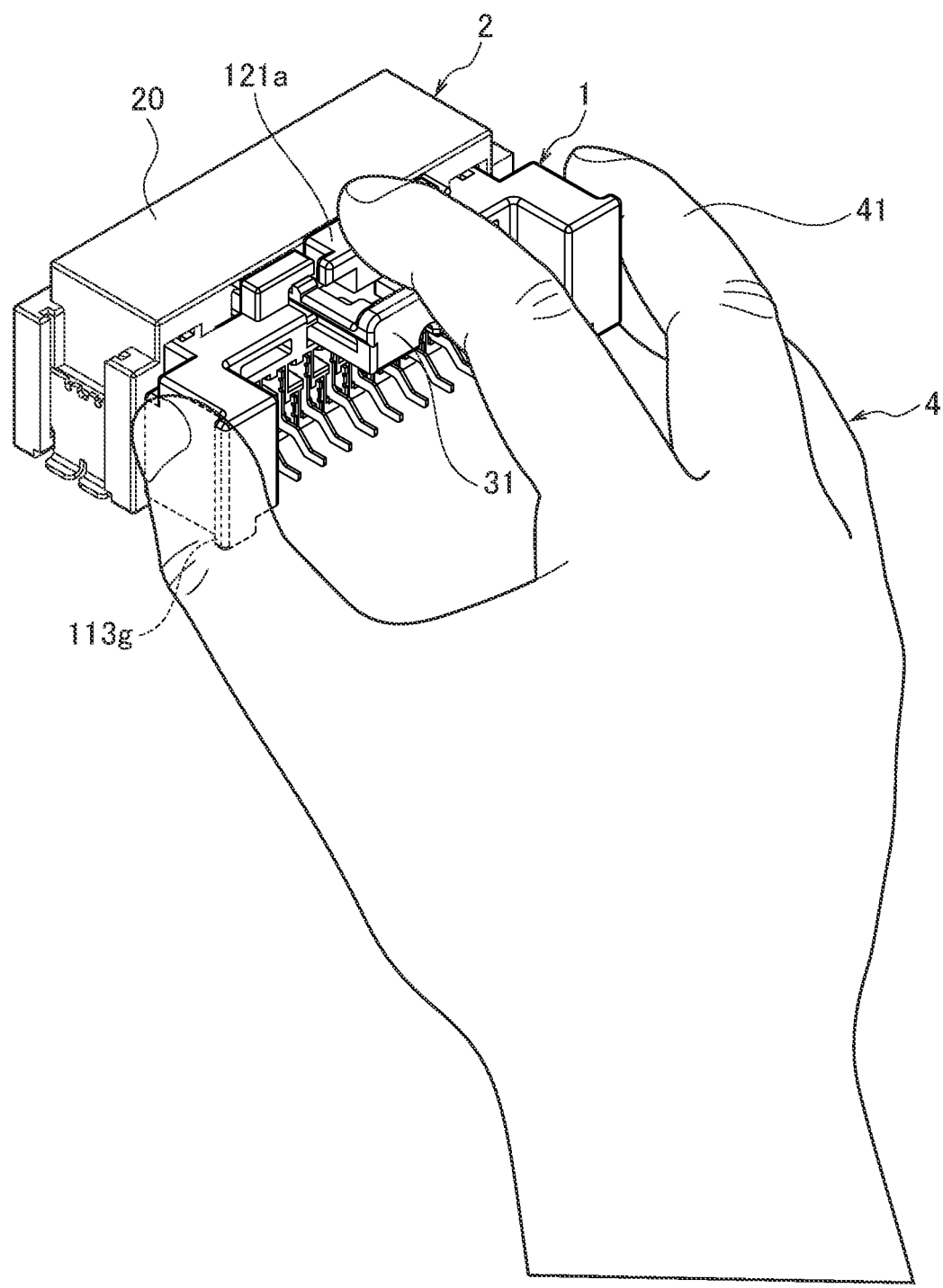
FIG. 29 is a diagram schematically showing a state where a comparative example of a plug connector is to be pulled out from a receptacle connector.
Figure 30:
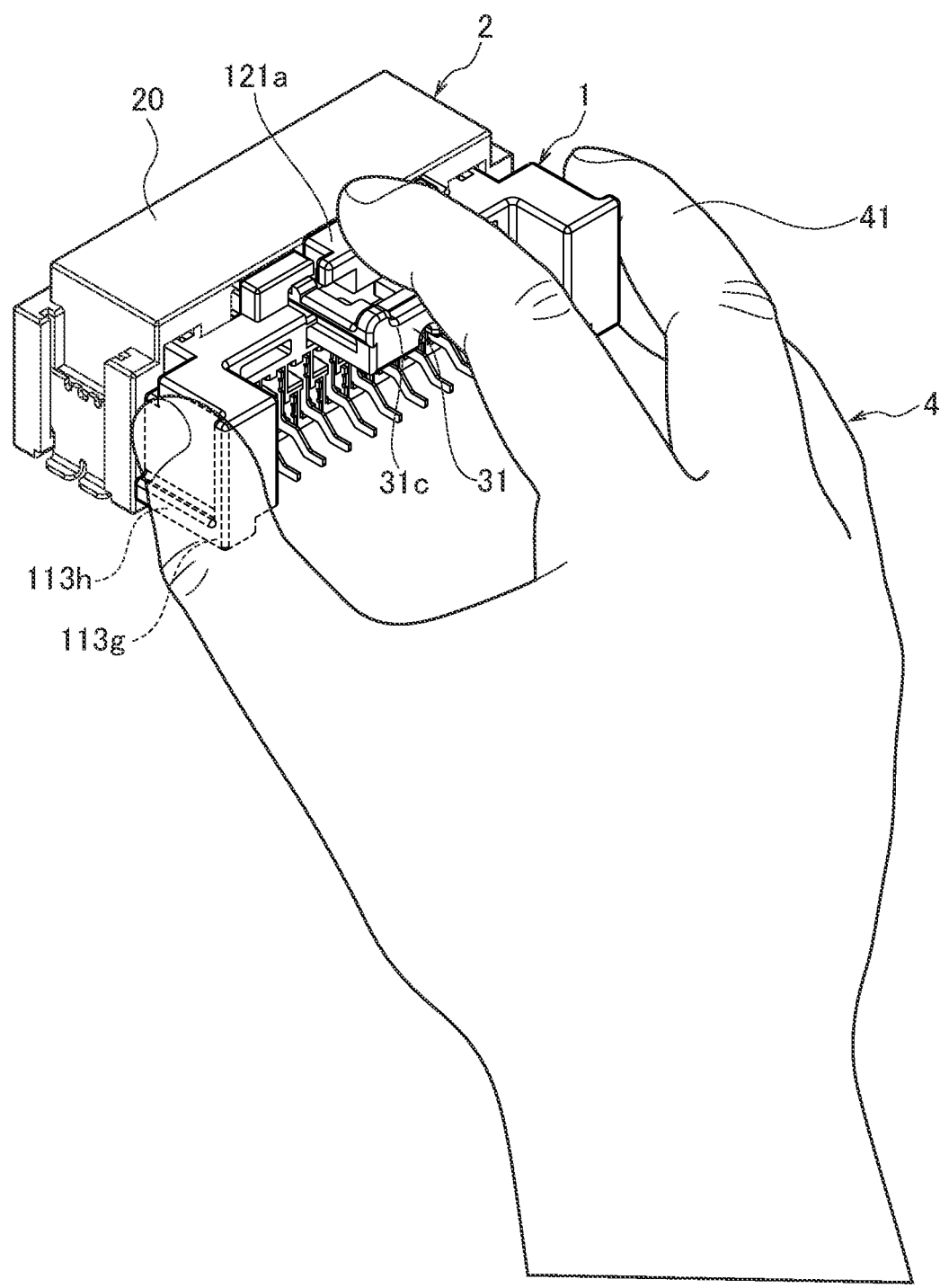
FIG. 30 is a schematically diagram showing a state where the plug connector shown as an example is to be pulled out from a receptacle connector.

When the plug connector 1 is detached from the receptacle connector 2, the plug housing 10 is pulled out from the receptacle housing 20 by a method shown in FIGS. 29 and 30, for example. That is, the plug connector 1 is detachable from the receptacle connector 2 by pulling out the plug housing 10 from the receptacle housing 20 by hooking the thumb and the middle finger to the pair of hook protrusions 113g, while operating the operation part 121a of the lever part 121 with the index finger.

[Configuration Example of Slide Member 3]

Figure 21:
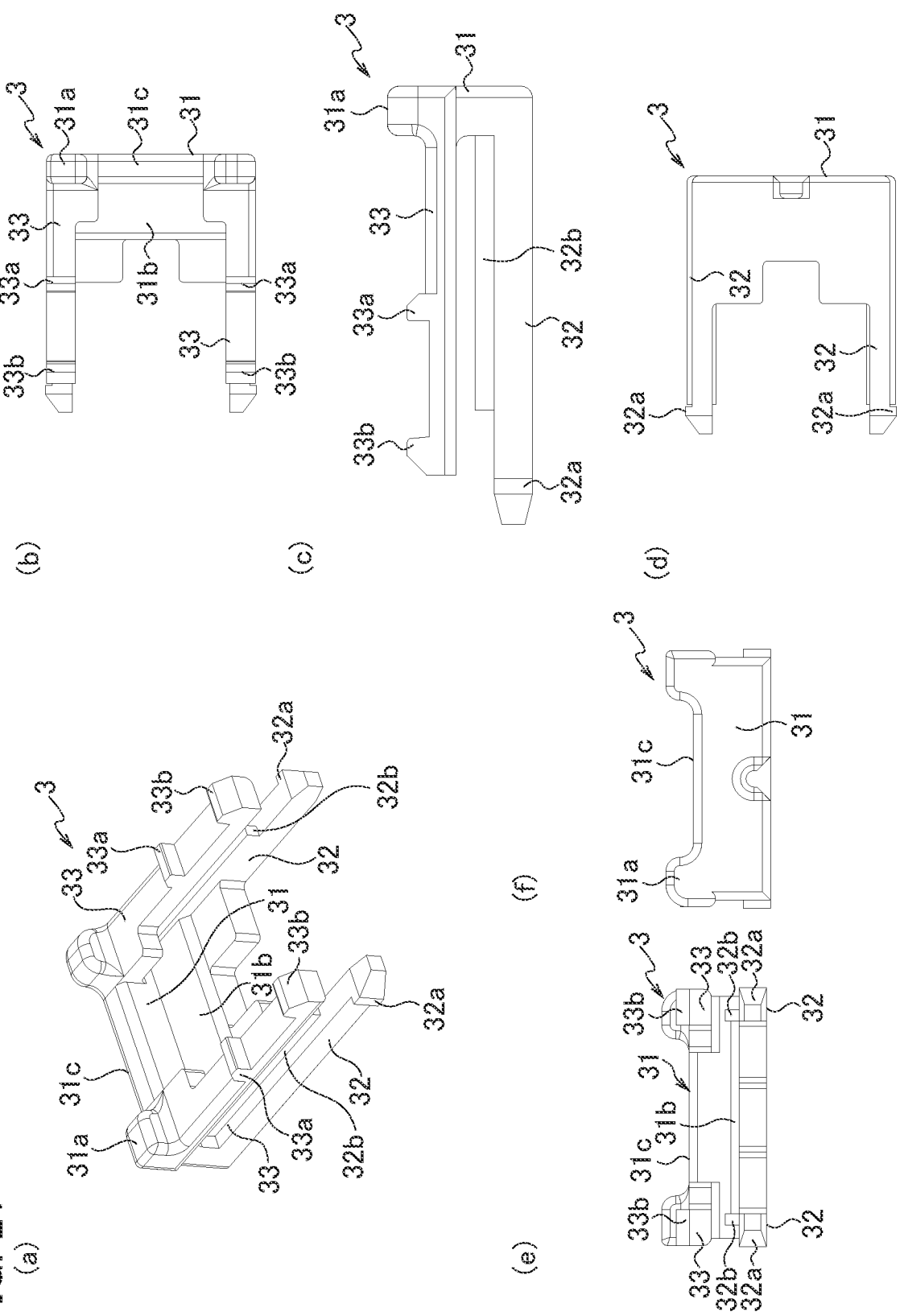
FIG. 21 is a diagram showing the slide member included in the connector set shown as an example.
Figure 22:
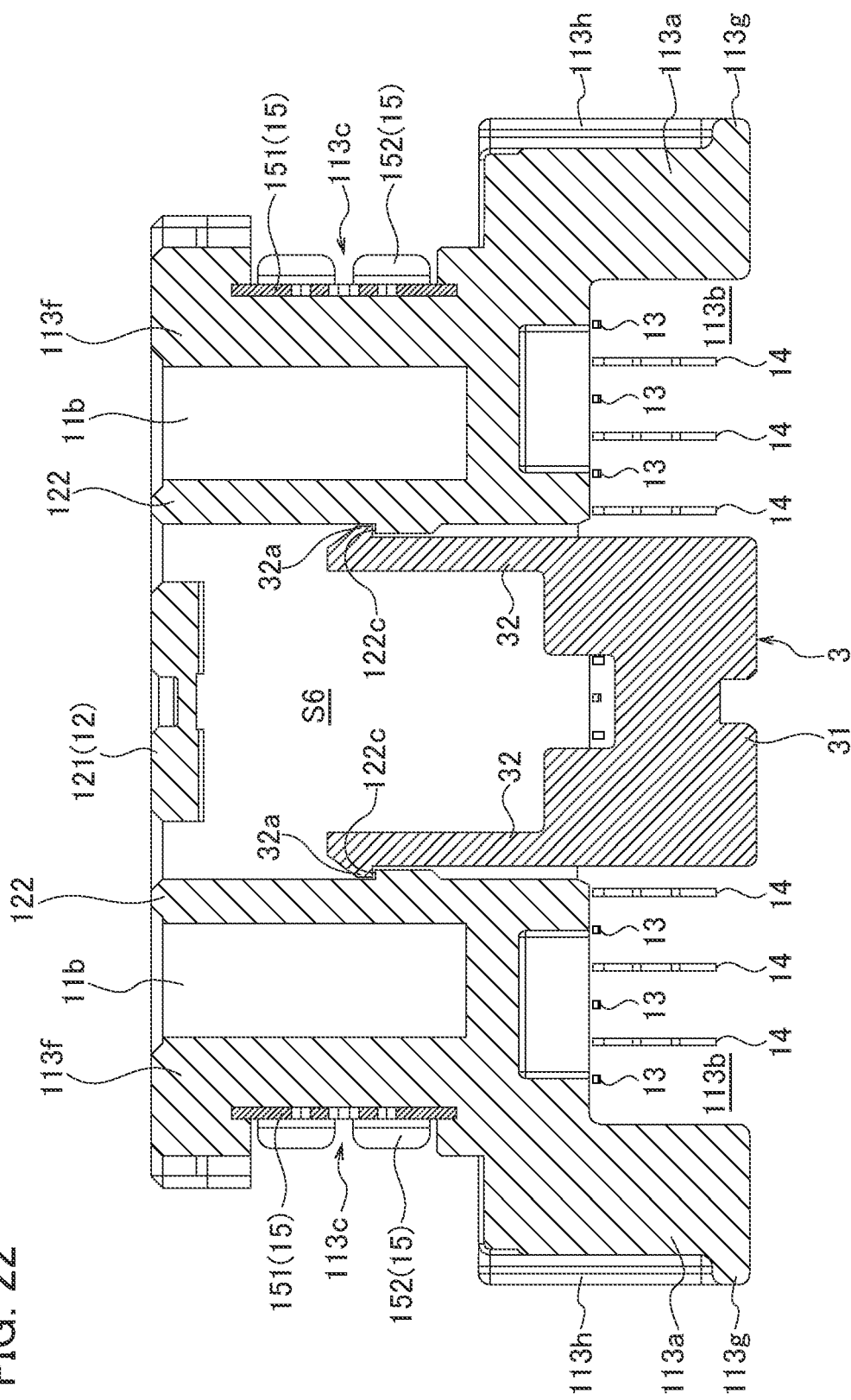
FIG. 22 is a horizontal sectional view showing a state where the slide member is temporarily held in the plug connector shown as an example.

Next, an example of the configuration of the slide member 3 slidably held in the plug connector 1 according to this embodiment is described based on FIG. 21.

In this embodiment, the slide member 3 includes a main body part 31 having a substantially rectangular plate shape. On the upper part of this main body part 31, a handle 31a is formed.

In addition, a pair of lower arm parts 32 are provided continuously on either side, in the width axis, of the lower part of the main body part 31 such that the pair of lower arm parts 32 extend forward in the front-rear axis. The pair of lower arm parts 32 are provided continuously on the main body part 31 in a cantilever fashion and are formed to be capable of elastically deforming in the width axis. On the tips (front ends) of these lower arm parts 32, locking protrusions (retaining parts) 32a are formed to protrude outward in the width axis.

On the other hand, a pair of upper arm part 33 are provided continuously on either side, in the width axis, of the upper part of the main body part 31 such that the pair of upper arm part 33 extend forward in the front-rear axis. The pair of upper arm part 33 are provided continuously on the main body part 31 in a cantilever fashion and formed to be elastically deformed in the top-bottom axis (the axis intersecting the insertion direction of the terminals). In the slide member 3 shown in this embodiment, the pair of upper arm parts 33 are formed to be wider on their base sides (the side continuous to the main body part 31). Then, on the tips (front ends) of these upper arm parts 33, engagement protrusions (engaging parts) 33b are formed to protrude upward.

In addition, protrusions 33a protruding upward are formed in a substantially middle, in the front-rear axis, of the upper arm parts 33.

Moreover, a restrictive protrusion (restrictor) 31b extending forward and upward is formed in a lower part of the main body part 31. Note that in the slide member 3 shown in this embodiment, each of the ends, in the width axis, of the restrictive protrusion (restrictor) 31b is continuous on the inner surface of the lower arm part 32.

In this embodiment, while the slide member 3 is held by the plug housing 10, the main body part 31 of the slide member 3 is disposed near the operation part 121a of the lever part 121.

Thus, when the operation part 121a is operated to elastically deform the lever part 121 downward, the finger 41 of the operator 4 may hit the main body part 31, and the locking between the lever part 121 and the engagement recess part (locked part) 221a may not be easily released. For example, as shown in FIG. 29, in the case of the main body part 31 having a substantially rectangular shape, when the operation part 121a is operated to elastically deform the lever part 121 downward, the finger 41 of the operator 4 may hit the upper end of the main body part 31.

Then, in this embodiment, the operation of the lever part 121 is prevented more reliably from being obstructed by the slide member 3.

Specifically, forming a recess part 31c recessed in the operation direction of the operation part 121a (downward in the top-bottom axis) in the main body part 31 prevents the finger 41 of the operator 4 from hitting the main body part 31.

Further, in this embodiment, when the slide member 3 is held in one housing (plug housing 10) and viewed along the front-rear axis (X-axis: sliding axis of slide member 3), a part of the main body part 31 is made to overlap with the operation part 121a of the lever part 121. That is, the slide member 3 is held by one housing (plug housing 10) such that a part of the main body part 31 overlaps the operation part 121a when viewed along the front-rear axis.

Further, in this embodiment, the main body part 31 is disposed such that the handle 31a protrudes from the operation part 121a when the slide member 3 is held by one housing (plug housing 10) and viewed along the front-rear axis (X axis: sliding axis of slide member 3).

As described above, in this embodiment, the recess part 31c is formed at the center of the upper part of the main body part 31 in the width axis. The recess part 31c is preferably formed to have such a size that the finger 41 of the operator 4 is insertable from above.

Specifically, the main body part 31 is held by the plug housing 10 in a state where both ends of the main body part 31 in the width axis protrude outward from the operation part 121a of the lever part 10. The recess part 31c is formed at the center of the upper part of the main body part 31 in the width axis, and handles 31a are formed at the upper parts of both ends of the recess part 31c in the width axis. At this time, each of the pair of handles 31a protrudes outward in the width axis more than the operation part 121a of the lever part 121. Thus, the handles 31a positioned in the vicinity of the operation part 121a are more reliably gripped by the fingers 41 or the fingers 41 can be hooked thereon.

The recess part 31c is preferably formed to have such a depth (the amount of recess in top-bottom axis) that the finger 41 of the operator 4 does not come in contact therewith while the engagement between the engagement protrusion 121b and the engagement recess part 221a is released by depressing the operation part 121a. In this way, the engagement between the engagement protrusion 121b and the engagement recess part 221a is more reliably released without being obstructed by the main body part 31 (see FIG. 30).

In addition, in the slide member 3 shown in this embodiment, protrusions 32b protruding upward are formed on the lower arm parts 32 along the direction in which the lower arm parts 32 extend. To be more specific, the protrusions 32b are formed to extend from the base side to the tip side of the lower arm parts 32 and are each formed to be elongated in the direction in which the lower arm parts 32 extend. By forming such protrusions 32b on the lower arm parts 32, the gap between the lower arm parts 32 and the upper arm parts 33 is reduced. Note that in the slide member 3 shown in this embodiment, the protrusions 32b are not formed directly below the portions where the engagement protrusions (engaging parts) 33b are formed in the upper arm parts 33. To be more specific, the protrusions 32b are formed such that their tips are located not further away (or located closer to the base) than the engagement protrusions (engaging parts) 33b of the upper arm parts 33. This prevents the elastic deformation of the upper arm parts 33 in the top-bottom axis from being hindered by the protrusion 32b.

Moreover, in the slide member 3 shown in this embodiment, the gap (the shortest distance in the top-bottom axis) between the lower arm parts 32 and the upper arm parts 33 at the locations where the protrusions 32b are formed is made smaller than the thickness of the lower arm parts 32 in the top-bottom axis and the thickness of the upper arm parts 33 in the top-bottom axis.

As described above, in the slide member 3 shown in this embodiment, the protrusion 32b, which makes smaller the gap between the lower arm part 32 and the upper arm part 33, is formed to extend from the base side to the tip side on each lower arm part 32, which is at least one arm part out of the lower arm part 32 and the upper arm part 33. Thus, the gap between the lower arm parts 32 and the upper arm parts 33 at the locations where the protrusions 33b are formed is made smaller than the thickness of the lower arm parts 32 and the thickness of the upper arm parts 33.

Furthermore, in the slide member 3 shown in this embodiment, the width on the tip sides of the lower arm parts 32 and the width on the tip sides of the upper arm parts 33 are also made larger than the gap (the shortest distance in the top-bottom axis) between the lower arm parts 32 and the upper arm parts 33 at the locations where the protrusions 32b are formed.

This makes it possible to prevent the lower arm parts 32 or the upper arm parts 33 of another slide member 3 from being inserted into the gap between the lower arm parts 32 and the upper arm parts 33 of the slide member 3, so that these arm parts are not entangled with each other. In this way, the slide member 3 shown in this embodiment is configured such that the arm parts are prevented from being entangled with each other without hindering the elastic deformation of the upper arm parts 33 in the top-bottom axis.

Next, an example of the operations of the slide member 3 is described based on FIGS. 22 to 26.

As described above, in this embodiment, this slide member 3 functions as the CPA member. Specifically, the slide member 3 is slidably attached to the plug housing 10 such that the slide movement of the slide member 3 from the initial position (first position) to the slide completion position (second position) is restricted in a state where the plug housing 10 has not been completely fitted into the receptacle housing 20 yet. Then, the slide member 3 is configured such that once the plug housing 10 is completely fitted into the receptacle housing 20, the slide movement of the slide member 3 from the initial position to the slide completion position is allowed.

To be more specific, the slide member 3 is configured such that the tips of the lower arm parts 32 are inserted into the insertion space S6 while being deflected inward in the width axis. At this time, the tips of the upper arm parts 33 are also inserted into the insertion space S6.

In a state where the tips of the lower arm parts 32 and the upper arm part 33 are inserted into the insertion space S6, when the slide member 3 is moved forward (inserted) by a predetermined distance, the tips of the lower arm parts 32 move forward beyond the step parts 122c formed on the upper partition walls 122, which define the recess part 11b. Once the tips of the lower arm parts 32 move forward beyond the step parts 122c, the lower arm parts 32 are moved by elastic restoring force in directions to separate from each other (outward in the width axis), so that the locking protrusions 32a of the lower arm parts 32 are locked to the step parts 122c. As a result, the slide member 3 is slidably held (temporarily held) in the plug housing 10 while being prevented from falling off the housing main body 11 (see FIG. 22).

Figure 23:
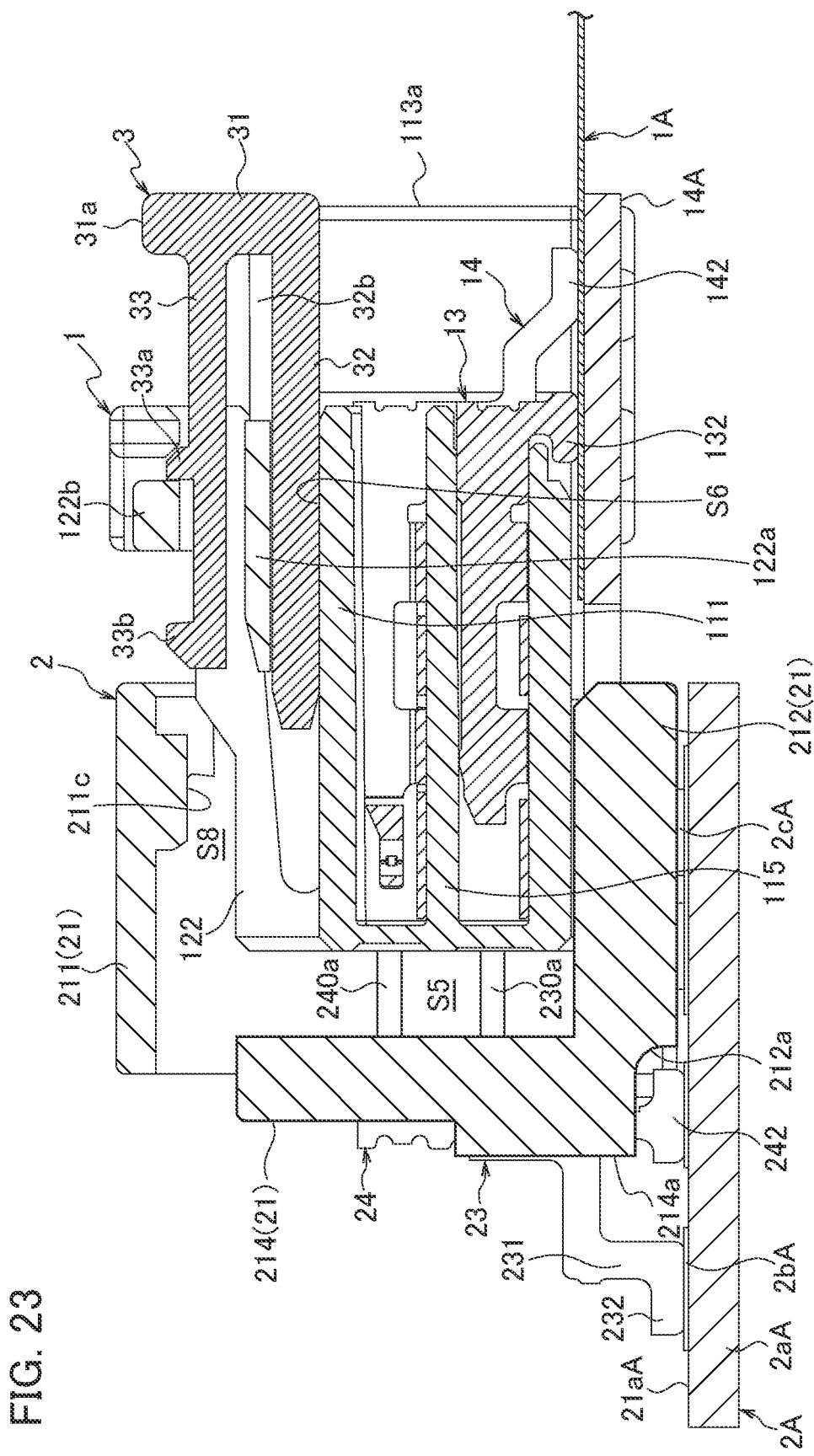
FIG. 23 is a diagram explaining how the plug connector and the receptacle connector shown as an example are locked with the slide member, and a sectional side view showing a state before the plug connector in which the slide member has been temporarily held is fitted to the receptacle connector.
Figure 24:
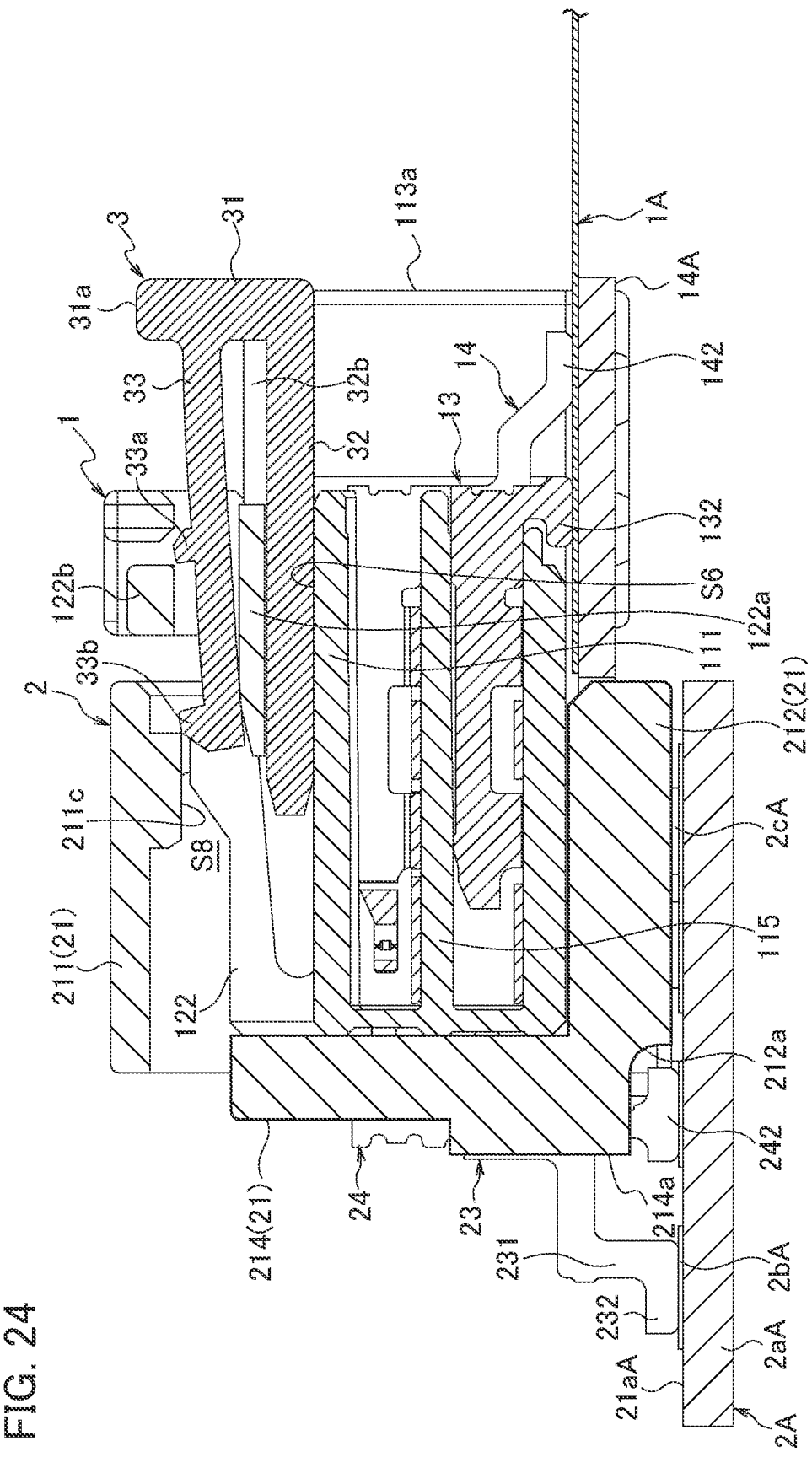
FIG. 24 is a diagram explaining how the plug connector and the receptacle connector shown as an example are locked with the slide member, and a sectional side view showing a state where the plug connector in which the slide member has been temporarily held has been fitted to the receptacle connector.

Note that in a state where the locking protrusions 32a of the lower arm parts 32 are locked to the step parts 122c, the protrusions 33a of the upper arm parts 33 are located to face the restrictive protrusions (slide restrictor) 122b behind the restrictive protrusions (slide restrictors) 122b (see FIG. 23).

For this reason, in a state where the slide member 3 is temporarily held in the plug housing 10 not fitted into the receptacle housing 20, if the slide member 3 is attempted to be slid forward, the protrusions 33a of the upper arm parts 33 come into contact with the restrictive protrusions 122b, thus preventing the slide member 3 from moving forward further.

In this embodiment, this configuration makes it unable for the slide member 3 to slide from the initial position to the slide completion position when the plug housing 10 has not been completely fitted into the receptacle housing 20 yet. Note that in this embodiment, the slide member 3 is regarded as being at the initial position when the locking protrusion 32a of the lower arm part 32 is locked to the step part 122c.

When the plug housing 10 which has temporarily held the slide member 3 is fitted into the receptacle housing 20, the engagement protrusions 33b of the upper arm parts 33 come into contact with the protrusions 211c of the top wall 211 and are pressed downward from the initiation to the completion of the fitting. Then, once the plug housing 10 is completely fitted into the receptacle housing 20, the tips of the engagement protrusions 33b abut against the lower surfaces of the protrusions 211c, so that the upper arm parts 33 are deflected downward. At this time, the protrusions 33a of the upper arm parts 33 also move downward to be located at a level lower than the restrictive protrusions (slide restrictors) 122b (see FIG. 24).

Thus, once the plug housing 10 is fitted into the receptacle housing 20, the restriction on the forward movement of the protrusions 33a, which is effected by the restrictive protrusions 122b, is released. This allows the slide member 3 to be slid forward. As described above, in this embodiment, the upper arm parts 33, which are elastically deformable up and down, and the protrusions 33a, which are formed on the upper arm parts 33 to be capable of coming into contact with the restrictive protrusions 122b, function as the slide lock mechanism.

Figure 25:
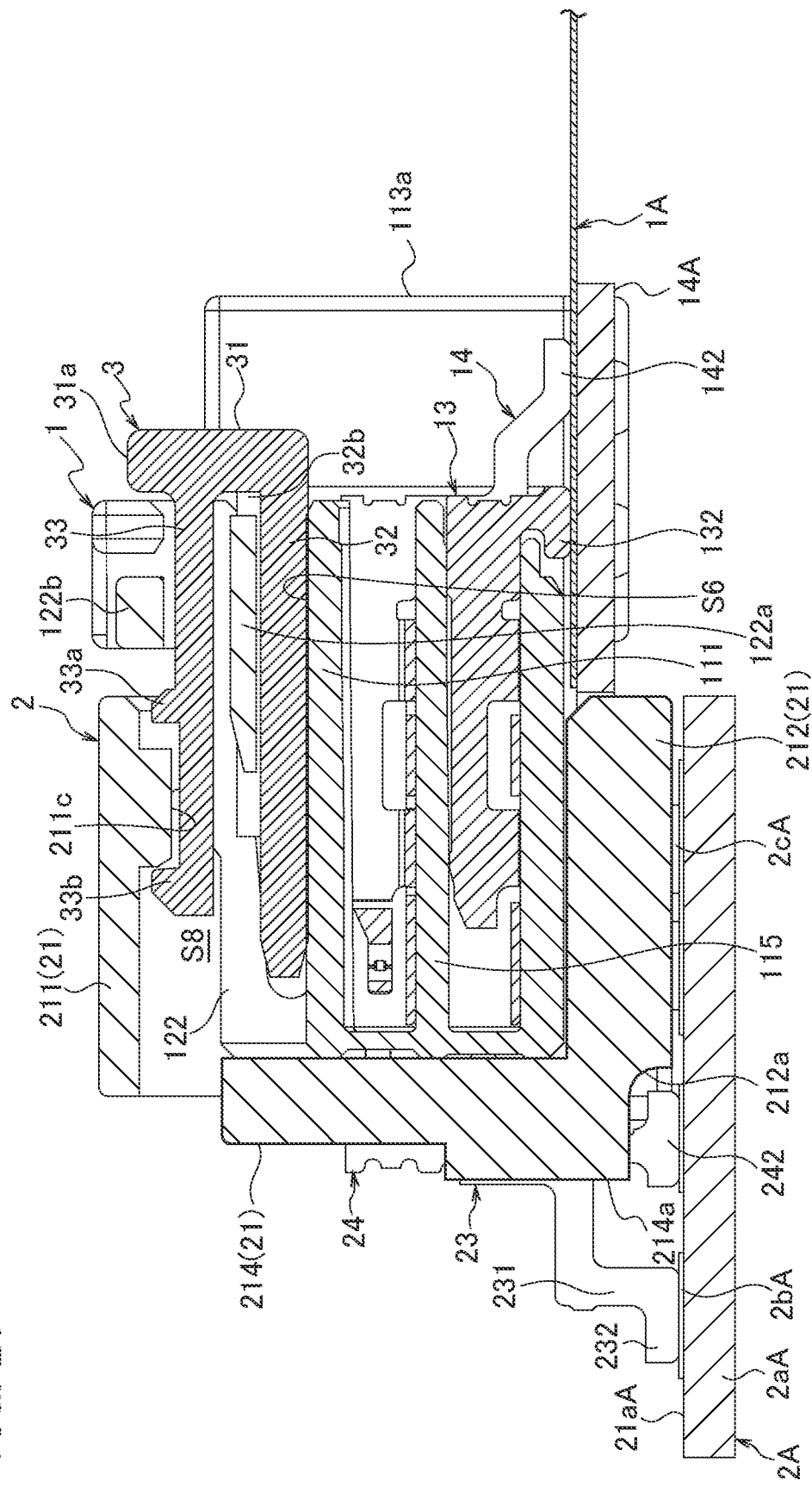
FIG. 25 is a diagram explaining how the plug connector and the receptacle connector shown as an example are locked with the slide member, and a sectional side view showing a state where the plug connector has been fitted to the receptacle connector and locked with the slide member.

Then, by sliding the slide member 3 forward and locking the engagement protrusions 33b of the upper arm parts 33 to the rear ends (end parts of inner side) of the protrusions 211c of the top wall 211, the plug housing 10 and the receptacle housing 20 are locked in a fitted state with this slide member 3 as well (see FIG. 25). Note that in this embodiment, the slide member 3 is regarded as being at the slide completion position (completion position: second position) when the engagement protrusions 33b of the upper arm parts 33 are locked to the front ends of the protrusions 211c of the top wall 211.

In this way, the connector set C1 is locked doubly by the lever part 121 and the slide member 3.

Figure 26:
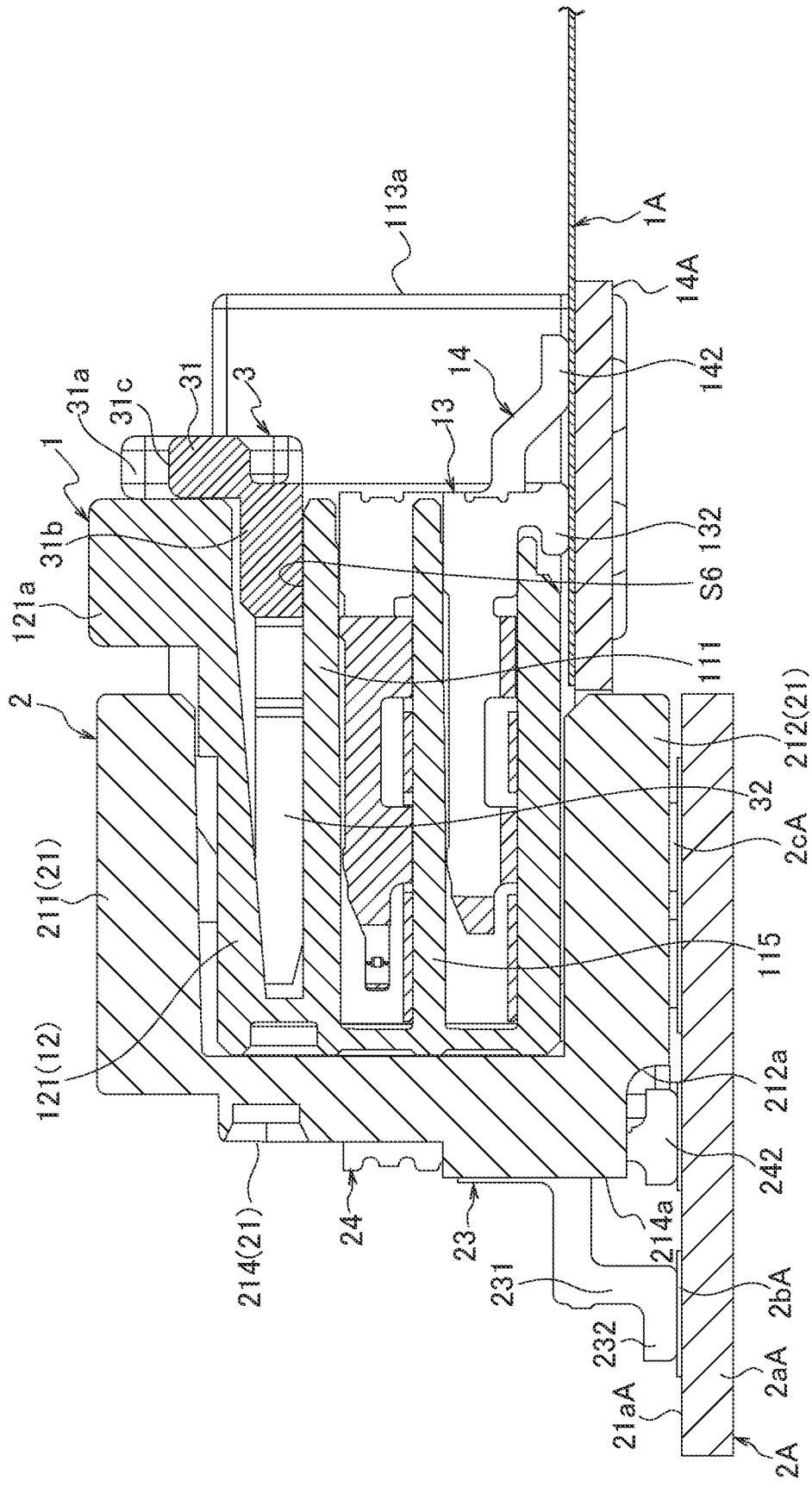
FIG. 26 is a sectional side view explaining how deflection of the lever part is restricted in the state where the plug connector shown as an example has been fitted to the receptacle connector and locked with the slide member.

Moreover, in this embodiment, when the slide member 3 is slid to the slide completion position (completion position), the restrictive protrusion (restrictor) 31b is inserted into the deflection allowance space S7 (see FIG. 26). Then, the restrictive protrusion 31b inserted into the deflection allowance space S7 restricts the downward movement of the lever part 121.

Here, it is preferable that the amount of upward protrusion of the restrictive protrusion 31b be set such that the engagement protrusion 121b and the engagement recess part 221a remain engaged with each other even when the lever part 121 is in contact with the restrictive protrusion 31b. This makes it possible to prevent the locking with the lever part 121 from being released unless the locking with the slide member 3 is released, and to thus maintain the lock state more securely.

Note that to release the fitting of the connector set C1 doubly locked with the lever part 121 and the slide member 3, the slide member 3 in the slide completion position is first slid to the initial position. In this embodiment, strongly pulling the slide member 3 rearward (toward the initial position) releases the locking between the engagement protrusions 33b and the protrusions 211c. Accordingly, for example, if an operator 4 or the like grips the handle 31a and strongly pulls the slide member 3 rearward, the slide member 3 is slid to the initial position.

In this way, sliding the slide member 3 to the initial position releases the restriction on the downward movement of the lever part 121, making it possible to release the lock with the lever part 121.

At this time, in this embodiment, the recess part 31c is formed at the upper end of the main body part 31 of the slide member 3. Thus, when the lever part 121 moves downward, the finger 41 of the operator 4 is prevented from hitting the main body part 31 (slide member 3), and the lock by the lever part 121 is released more reliably.

Then, performing the above-described operation of removing the plug connector 1 from the receptacle connector 2 removes the plug connector 1 from the receptacle connector 2.

[Operations and Effects]

A description will be given below of the characteristic features of the plug housing and the plug connector described in the above embodiment, and advantageous effects achieved by these.

The plug housing 10 shown in the above embodiment is a housing fittable to the receptacle housing 20 and includes the housing main body 11.

The housing main body 11 includes the inserted parts 118 inserted in the receptacle housing 20 and the exposed parts 119 exposed outside of the receptacle housing 20, with the plug housing 10 fitted to the receptacle housing 20.

The exposed parts 119 are provided with the hook protrusions (hook parts) 113g for hooking the fingers 41 thereon that are formed at the ends in the intersecting axis intersecting with the insertion direction (X axis) of inserting the inserted parts 118 in the receptacle housing 20. Further, each of the exposed parts 119 is provided with the contact protrusion (contact part) 113h that comes in contact with another plug housing 10 between the inserted part 118 and the hook protrusion 113g when the other plug housing 10 is disposed adjacent to each other in the intersecting axis.

The plug connector 1 according to the above embodiment includes the above-described plug housing 10 and the plug terminals 13 and 14 held by the plug housing 10.

In this way, when the operator 4 grips the plug connector 1 by hand, the fingers 41 are hooked on the hook protrusions 113g and the plug connector 1 fitted to the receptacle connector 2 is more easily pulled out.

The plug housings 10 adjacent to each other are brought in contact with each other by the contact protrusions 113h that are located at a portion between the center of gravity of the plug housings 10 and the hook protrusions 113g. This enables the plug housings 10 adjacent to each other to be brought in contact with each other in a relatively stable state and thus prevents the plug housings 10 from tilting from the certain posture.

As described above, according to the present disclosure, it is possible to obtain the plug housing 10 and the plug connector 1 capable of preventing the change in posture during conveyance by the parts feeder 5 while improving the performance of pulling-out from the receptacle connector 2.

The hook part 113g may be formed at the end of the exposed part 119 on this side in the insertion direction X.

In this way, with the plug housing 10 fitted to the receptacle housing 20, the hook protrusions 113g face the front end of the receptacle connector 2 with a gap therebetween in the front-rear axis. As a result, the fingers 41 are hooked on the hook protrusions 113g without being obstructed by the receptacle connector 2 even when the plug connector 1 miniaturized is used.

The intersecting axis Y may be the width axis Y of the housing main body 11.

In this way, the hook protrusions 113g are formed in the width axis of the plug housing 10 that is formed relatively large, and thus it is easier to grip the plug housing 10 by the fingers 41 than when the hook protrusions 113g are formed in the thickness axis of the plug housing 10. As a result, the plug connector 1 fitted to the receptacle connector 2 is pulled out more easily. Further, when the hook protrusions 113g are formed in the width axis, which is the axis intersecting with the insertion direction (front-rear axis) and with a mounting direction (top-bottom axis) mounting on the mounting member, the fingers 41 can be hooked on the hook protrusions 113g without being obstructed by the mounting member even with the plug housing 10 mounted on the mounting member. This enables the plug housing 10 mounted on the mounting member to be easily pulled out from the receptacle housing 20.

The exposed parts 119 may include the exposed surfaces 119a exposed in the intersecting axis with the plug housing 10 fitted to the receptacle housing 20.

The hook parts 113g may be protrusions protruding outward from the exposed surfaces 119a in the intersecting axis Y.

In this way, even when the plug connector 1 miniaturized is used, the fingers 41 can be more reliably hooked on the hook protrusions 113g.

The contact parts may be protrusions (contact protrusions 113h) protruding outward from the exposed surfaces 119a in the intersecting axis Y.

In this way, the contact protrusions 113h are formed more easily. Further, when the contact parts are the protrusions, the plug housings 10 adjacent to each other can be more reliably brought in contact with each other at the contact parts.

The amount of protrusion of the hook part 113g from the exposed surface 119a and the amount of protrusion of the contact part 113h from the exposed surface 119a may be substantially the same.

This enables the hook protrusions 113g and the contact protrusions 113h to be formed more easily. This also enables the plug housings 10 adjacent to each other to be brought in contact with each other by the hook protrusions 113g and the contact protrusions 113h. That is, the plug housings 10 adjacent to each other are brought in contact with each other not in a single straight line but in a plane shape (two straight lines intersecting each other). As a result, the plug housings 10 adjacent to each other are brought in contact with each other in a relatively stable state and prevented from tilting from a certain posture more surely.

The hook protrusion 113g and the contact protrusion 113h may extend along the peripheral edge of the exposed surface 119a.

In this way, when the operator 4 grips the plug connector 1 by hand, it is possible to more reliably prevent the plug connector 1 from hitting the contact protrusions 113h.

The exposed surface 119a may have a substantially rectangular shape when viewed along the intersecting axis Y.

Further, the hook protrusion 113g may be formed along the side part 119b of the exposed surface 119a on this side in the insertion direction.

The contact protrusion 113h may be formed along the side part 119c of the exposed surface 119a on one side (lower side) in the axis Z intersecting with the insertion direction X and with the intersecting axis Y.

In this way, when the operator 4 grips the plug connector 1 by hand, the fingers 41 are more surely hooked on the hook protrusions 113g without being obstructed by the contact protrusions 113h.

Although the preferred embodiment of the present disclosure has been described above, the present disclosure is not limited to the above embodiment, but various changes can be made thereto.

For example, although the above-described embodiment illustrate a connector in which a plurality of terminals are disposed in the upper and lower two stages, it is also possible to make a connector in which a plurality of terminals are disposed in three stages or more and a connector in which a plurality of terminals are disposed only in one stage.

In addition, although in the above embodiment, a connector having a connector position assurance (CPA) function illustrated as an example, it is possible to use a connector not having a connector position assurance (CPA) function.

In addition, although the connector in which the terminals disposed in the same stage have the same shape is illustrated, it is also possible to make a connector in which a plurality of types of terminals are disposed in the same stage.

In addition, the present disclosure may be applied to connectors (plug connectors and receptacle connectors) that electrically connect boards or cables with each other. Moreover, the present disclosure may be applied to connectors (plug connectors and receptacle connectors) that electrically connect an electric wire with a board.

In addition, specifications (shapes, sizes, layouts, and the like) of the plug housing, the plug terminals, and the other details may also be changed as needed.

The present application is based on and claims the benefit of priority from Japanese Patent Application No. 2019-101374, filed on May 30, 2019, the entire contents of which are incorporated herein by reference.

INDUSTRIAL APPLICABILITY

According to the present disclosure, it is possible to obtain a plug housing and a plug connector capable of preventing a change in posture during conveyance by a parts feeder while improving performance of pulling-out from the receptacle connector.

The invention claimed is:

1. A plug housing fittable to a receptacle housing, the plug housing comprising:
a housing main body including:
an inserted part; and
an exposed part, wherein:
the inserted part is inserted in the receptacle housing and the exposed part is exposed outside the receptacle housing, in a state where the plug housing is fitted to the receptacle housing,
the exposed part includes an exposed surface to be exposed in an intersecting axis intersecting with an insertion direction of inserting the inserted part in the receptacle housing in the state where the plug housing is fitted to the receptacle housing,
the housing main body is capable of holding plug terminals to be arranged in the intersecting axis,
the exposed part includes:
a hook part formed at an end of the exposed part in the intersecting axis, the hook part being configured to hook a finger thereon; and
a contact part contactable with another plug housing between the hook part and the inserted part when the another plug housing is disposed adjacent to the plug housing in the intersecting axis,
the hook part is a protrusion that protrudes from the exposed surface outward in the intersecting axis,
the contact part is a protrusion that protrudes from the exposed surface outward in the intersecting axis,
the hook part is configured such that the protrusion does not overlap with the receptacle housing when viewed from the intersecting axis in the state where the plug housing is fitted to the receptacle housing,
the exposed surface has a substantially rectangular shape in a state viewed along the intersecting axis,
the hook part and the contact part are formed to extend along a peripheral edge of the exposed surface,
the hook part is formed on a side part of the exposed surface on this side in the insertion direction such that the hook part extends in a third axis intersecting with the insertion direction and with the intersecting axis, and
the contact part is provided continuously from an end, in the third axis, of the hook part and is formed along a side part of the exposed surface such that the contact part extends in the insertion direction, the side part being one side in the third axis.

2. The plug housing according to claim 1, wherein the hook part is formed on an end of the exposed part on this side in the insertion direction.

3. The plug housing according to claim 1, wherein the intersecting axis is a width axis of the housing main body.

4. The plug housing according to claim 1, wherein the hook part has an amount of protrusion from the exposed surface substantially the same as an amount of protrusion of the contact part from the exposed surface.

5. A plug connector, comprising:
the plug housing according to claim 1; and
a plug terminal held by the plug housing.

6. The plug housing according to claim 1, wherein:
a recess part which houses a mounting member is formed on a wall arranged one side in the third axis of the housing main body, and
the contact part is formed such that one side surface, in the third axis, of the contact part is provided continuously from one side surface, in the third axis, of a portion of the wall which defines the intersecting axis of the recess part.

7. A connector set, comprising a plug housing and a receptacle housing to which the plug is fittable, wherein:
the plug housing comprises a housing main body including:
an inserted part; and
an exposed part,
the inserted part is inserted in the receptacle housing and the exposed part is exposed outside the receptacle housing, in a state where the plug housing is fitted to the receptacle housing,
the exposed part includes an exposed surface to be exposed in an intersecting axis intersecting with an insertion direction of inserting the inserted part in the receptacle housing in the state where the plug housing is fitted to the receptacle housing,
the housing main body is capable of holding plug terminals to be arranged in the intersecting axis,
the exposed part includes:
a hook part formed at an end of the exposed part in the intersecting axis, the hook part being configured to hook a finger thereon; and
a contact part contactable with another plug housing between the hook part and the inserted part when the another plug housing is disposed adjacent to the plug housing in the intersecting axis,
the hook part is a protrusion that protrudes from the exposed surface outward in the intersecting direction axis,
the contact part is a protrusion that protrudes from the exposed surface outward in the intersecting axis,
the receptacle housing is configured so as not to overlap with the protrusion when viewed from the intersecting axis in the state where the plug housing is fitted to the receptacle housing,
the exposed surface has a substantially rectangular shape in a state viewed along the intersecting axis, the hook part and the contact part are formed to extend along a peripheral edge of the exposed surface, the hook part is formed on a side part of the exposed surface on this side in the insertion direction such that the hook part extends in a third axis intersecting with the insertion direction and with the intersecting axis, and the contact part is provided continuously from an end, in the third axis, of the hook part and is formed along a side part of the exposed surface such that the contact part extends in the insertion direction the side part being one side in the third axis.

* * * * *